United States Patent
Kimura et al.

(10) Patent No.: US 10,134,912 B2
(45) Date of Patent: Nov. 20, 2018

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventors: Hajime Kimura, Kanagawa (JP); Kengo Akimoto, Kanagawa (JP); Masashi Tsubuku, Kanagawa (JP); Toshinari Sasaki, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/017,704

(22) Filed: Feb. 8, 2016

(65) Prior Publication Data

US 2016/0155859 A1    Jun. 2, 2016

Related U.S. Application Data

(63) Continuation of application No. 12/872,861, filed on Aug. 31, 2010, now Pat. No. 9,257,082.

(30) Foreign Application Priority Data

Sep. 4, 2009    (JP) ................. 2009-205136

(51) Int. Cl.
H01L 29/786    (2006.01)
G09G 3/36      (2006.01)
H01L 27/12     (2006.01)

(52) U.S. Cl.
CPC ..... *H01L 29/78693* (2013.01); *G09G 3/3648* (2013.01); *H01L 27/1225* (2013.01);
(Continued)

(58) Field of Classification Search
None
See application file for complete search history.

(56) References Cited

U.S. PATENT DOCUMENTS 5,162,901 A    11/1992 Shimada et al.
5,712,652 A    1/1998  Sato et al.
(Continued)

FOREIGN PATENT DOCUMENTS

CN    001892766 A    1/2007
EP      0399846 A    11/1990
(Continued)

OTHER PUBLICATIONS

Taiwanese Office Action (Application No. 105112626) dated Dec. 12, 2016.
(Continued)

*Primary Examiner* — Christopher Kohlman
(74) *Attorney, Agent, or Firm* — Fish & Richardson P.C.

(57) ABSTRACT

A display device including a pixel having a memory. The pixel includes at least a display element, a capacitor, an inverter, and a switch. The switch is controlled with a signal held in the capacitor and a signal output from the inverter so that voltage is supplied to the display element. The inverter and the switch can be constituted by transistors with the same polarity. A semiconductor layer included in the pixel may be formed using a light-transmitting material. Moreover, a gate electrode, a drain electrode, and a capacitor electrode may be formed using a light-transmitting conductive layer. The pixel is formed using a light-transmitting material in such a manner, whereby the display device can be a transmissive display device while including a pixel having a memory.

13 Claims, 43 Drawing Sheets

(52) U.S. Cl.
CPC .......... *H01L 29/78618* (2013.01); *G09G 2300/0842* (2013.01)

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,945,972 A | 8/1999 | Okumura et al. | |
| 6,252,247 B1 | 6/2001 | Sakata et al. | |
| 6,294,274 B1 | 9/2001 | Kawazoe et al. | |
| 6,562,669 B2 | 5/2003 | Suzawa et al. | |
| 6,563,174 B2 | 5/2003 | Kawasaki et al. | |
| 6,563,480 B1 | 5/2003 | Nakamura | |
| 6,674,136 B1 | 1/2004 | Ohtani | |
| 6,727,522 B1 | 4/2004 | Kawasaki et al. | |
| 6,738,281 B2 | 5/2004 | Yokozeki | |
| 6,771,247 B2 | 8/2004 | Sato et al. | |
| 6,803,896 B2 | 10/2004 | Senda et al. | |
| 6,825,071 B2 | 11/2004 | Suzawa et al. | |
| 6,850,216 B2 | 2/2005 | Akimoto et al. | |
| 6,850,219 B2 | 2/2005 | Aoyama et al. | |
| 6,950,080 B2 | 9/2005 | Senda et al. | |
| 6,958,744 B2 | 10/2005 | Nakamura | |
| 7,009,590 B2 | 3/2006 | Numao | |
| 7,049,190 B2 | 5/2006 | Takeda et al. | |
| 7,054,041 B2 | 5/2006 | Stevenson et al. | |
| 7,061,014 B2 | 6/2006 | Hosono et al. | |
| 7,064,346 B2 | 6/2006 | Kawasaki et al. | |
| 7,084,849 B2 | 8/2006 | Noguchi et al. | |
| 7,095,389 B2 | 8/2006 | Uehara et al. | |
| 7,105,868 B2 | 9/2006 | Nause et al. | |
| 7,136,057 B2 | 11/2006 | Senda et al. | |
| 7,173,589 B2 | 2/2007 | Senda et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,323,356 B2 | 1/2008 | Hosono et al. | |
| 7,361,934 B2 | 4/2008 | Ishii | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,531,394 B2 | 5/2009 | Long et al. | |
| 7,554,618 B2 | 6/2009 | Ishii et al. | |
| 7,583,259 B2 | 9/2009 | Yokoyama | |
| 7,674,650 B2 | 3/2010 | Akimoto et al. | |
| 7,679,585 B2 | 3/2010 | Kimura | |
| 7,732,819 B2 | 6/2010 | Akimoto et al. | |
| 7,746,308 B2 | 6/2010 | Toyozawa et al. | |
| 7,821,613 B2 | 10/2010 | Kimura | |
| 7,843,533 B2 | 11/2010 | Noguchi et al. | |
| 7,851,806 B2 | 12/2010 | Long et al. | |
| 7,863,611 B2 | 1/2011 | Abe et al. | |
| 7,897,442 B2 | 3/2011 | Liao et al. | |
| 7,907,224 B2 | 3/2011 | Ito et al. | |
| 7,910,490 B2 | 3/2011 | Akimoto et al. | |
| 7,932,521 B2 | 4/2011 | Akimoto et al. | |
| 7,952,653 B2 | 5/2011 | Tanaka | |
| 7,978,277 B2 | 7/2011 | Kimura | |
| 7,982,250 B2 | 7/2011 | Yamazaki et al. | |
| 8,013,338 B2 | 9/2011 | Kobayashi et al. | |
| 8,120,721 B2 | 2/2012 | Kimura | |
| 8,143,115 B2 | 3/2012 | Omura et al. | |
| 8,148,721 B2 | 4/2012 | Hayashi et al. | |
| 8,203,146 B2 | 6/2012 | Abe et al. | |
| 8,222,640 B2 | 7/2012 | Kobayashi et al. | |
| 8,242,505 B2 | 8/2012 | Kawamura et al. | |
| 8,274,077 B2 | 9/2012 | Akimoto et al. | |
| 8,354,674 B2 | 1/2013 | Kimura | |
| 8,395,718 B2 | 3/2013 | Kimura | |
| 8,466,463 B2 | 6/2013 | Akimoto et al. | |
| 8,629,451 B2 | 1/2014 | Kawamura et al. | |
| 8,802,511 B2 | 8/2014 | Kawamura et al. | |
| 2001/0046027 A1 | 11/2001 | Tai et al. | |
| 2002/0056838 A1 | 5/2002 | Ogawa | |
| 2002/0093290 A1 | 7/2002 | Yamazaki | |
| 2002/0132454 A1 | 9/2002 | Ohtsu et al. | |
| 2003/0098828 A1 | 5/2003 | Hunter et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1* | 8/2006 | Isa | H01L 51/0022 257/40 |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0221004 A1 | 10/2006 | You et al. | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0001205 A1* | 1/2007 | Kimura | G09G 3/3241 257/296 |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057261 A1 | 3/2007 | Jeong et al. | |
| 2007/0090365 A1 | 4/2007 | Hayashi et al. | |
| 2007/0108446 A1 | 5/2007 | Akimoto | |
| 2007/0109247 A1 | 5/2007 | Koyama et al. | |
| 2007/0138941 A1 | 6/2007 | Jin et al. | |
| 2007/0152217 A1 | 7/2007 | Lai et al. | |
| 2007/0172591 A1 | 7/2007 | Seo et al. | |
| 2007/0177092 A1 | 8/2007 | Hosoya | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0158138 A1 | 7/2008 | Yamazaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1* | 10/2008 | Park | H01L 29/7869 257/43 |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |

(56) References Cited

U.S. PATENT DOCUMENTS

| | | |
|---|---|---|
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0079725 A1 | 3/2009 | Saito et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0155940 A1* | 6/2009 | Lee .................. H01L 29/7869 438/29 |
| 2009/0189155 A1 | 7/2009 | Akimoto |
| 2009/0189156 A1 | 7/2009 | Akimoto |
| 2009/0201455 A1 | 8/2009 | Murai |
| 2009/0267916 A1* | 10/2009 | Hotelling .............. G06F 3/044 345/174 |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0305461 A1 | 12/2009 | Akimoto et al. |
| 2010/0025691 A1* | 2/2010 | Matsukizono .... H01L 29/78675 257/72 |
| 2010/0060839 A1* | 3/2010 | Suzuki ................ H01L 27/124 349/147 |
| 2010/0065844 A1 | 3/2010 | Tokunaga |
| 2010/0079428 A1 | 4/2010 | Kajino |
| 2010/0092800 A1 | 4/2010 | Itagaki et al. |
| 2010/0109002 A1 | 5/2010 | Itagaki et al. |
| 2010/0127279 A1 | 5/2010 | Takahashi |
| 2010/0136743 A1 | 6/2010 | Akimoto et al. |
| 2010/0140613 A1 | 6/2010 | Kimura |
| 2010/0155717 A1 | 6/2010 | Yano et al. |
| 2010/0156877 A1 | 6/2010 | Kimura |
| 2010/0176381 A1* | 7/2010 | Yagi .................... G02F 1/1368 257/40 |
| 2010/0177269 A1 | 7/2010 | Kimura |
| 2010/0193785 A1 | 8/2010 | Kimura |
| 2011/0017995 A1 | 1/2011 | Yamazaki et al. |
| 2011/0037914 A1 | 2/2011 | Noguchi et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2012/0168750 A1 | 7/2012 | Hayashi et al. |
| 2013/0256672 A1 | 10/2013 | Kimura |
| 2014/0248748 A1 | 9/2014 | Kawamura et al. |
| 2015/0084048 A1 | 3/2015 | Hayashi et al. |

FOREIGN PATENT DOCUMENTS

| | | |
|---|---|---|
| EP | 1033755 A | 9/2000 |
| EP | 1136978 A | 9/2001 |
| EP | 1737044 A | 12/2006 |
| EP | 1764839 A | 3/2007 |
| EP | 1770788 A | 4/2007 |
| EP | 1947695 A | 7/2008 |
| EP | 1995787 A | 11/2008 |
| EP | 1998373 A | 12/2008 |
| EP | 1998374 A | 12/2008 |
| EP | 1998375 A | 12/2008 |
| EP | 2071394 A | 6/2009 |
| EP | 2226847 A | 9/2010 |
| JP | 58-198084 A | 11/1983 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-082221 A | 3/1990 |
| JP | 02-310536 A | 12/1990 |
| JP | 05-251705 A | 9/1993 |
| JP | 07-253764 A | 10/1995 |
| JP | 08-264794 A | 10/1996 |
| JP | 11-505377 | 5/1999 |
| JP | 11-284195 A | 10/1999 |
| JP | 2000-044236 A | 2/2000 |
| JP | 2000-150900 A | 5/2000 |
| JP | 2000-315798 A | 11/2000 |
| JP | 2001-264814 A | 9/2001 |
| JP | 2001-281684 A | 10/2001 |
| JP | 2002-072228 A | 3/2002 |
| JP | 2002-076356 A | 3/2002 |
| JP | 2002-141513 A | 5/2002 |
| JP | 2002-289859 A | 10/2002 |
| JP | 2003-043510 A | 2/2003 |
| JP | 2003-076343 A | 3/2003 |
| JP | 2003-086000 A | 3/2003 |
| JP | 2003-086808 A | 3/2003 |
| JP | 2004-020687 A | 1/2004 |
| JP | 2004-103957 A | 4/2004 |
| JP | 2004-273614 A | 9/2004 |
| JP | 2004-273732 A | 9/2004 |
| JP | 2004-341186 A | 12/2004 |
| JP | 2006-165532 A | 6/2006 |
| JP | 2006-343612 A | 12/2006 |
| JP | 2007-081362 A | 3/2007 |
| JP | 2007-109918 A | 4/2007 |
| JP | 2007-115807 A | 5/2007 |
| JP | 2007-123861 A | 5/2007 |
| JP | 2007-155962 A | 6/2007 |
| JP | 2007-518119 | 7/2007 |
| JP | 2007-199708 A | 8/2007 |
| JP | 2007-298602 A | 11/2007 |
| JP | 2008-003610 A | 1/2008 |
| JP | 2008-090312 A | 4/2008 |
| JP | 2008-175842 A | 7/2008 |
| JP | 2008-243928 A | 10/2008 |
| JP | 2008-286911 A | 11/2008 |
| JP | 2008-287032 A | 11/2008 |
| JP | 2009-013855 A | 1/2009 |
| JP | 2009-047967 A | 3/2009 |
| JP | 2009-135380 A | 6/2009 |
| JP | 2010-085817 A | 4/2010 |
| TW | 565929 | 12/2003 |
| TW | 200832696 | 8/2008 |
| TW | 200843117 | 11/2008 |
| TW | 200917419 | 4/2009 |
| TW | 200917491 | 4/2009 |
| TW | 200926414 | 6/2009 |
| TW | 200928534 | 7/2009 |
| TW | 200937613 | 9/2009 |
| WO | WO-2004/114391 | 12/2004 |
| WO | WO-2005/073792 | 8/2005 |
| WO | WO-2006/132392 | 12/2006 |
| WO | WO-2008/038432 | 4/2008 |
| WO | WO-2008/069056 | 6/2008 |
| WO | WO-2008/069255 | 6/2008 |
| WO | WO-2008/084697 | 7/2008 |
| WO | WO-2009/020168 | 2/2009 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

(56) References Cited

OTHER PUBLICATIONS

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW'02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 13, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 33, pp. 1330-1833.

Hirao.T et al., "Novel Top-Gate Zinc Oxide Thin-Film Transistors (ZNO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch MGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In-Ga-Zn-Oxide TFTs", IDW '09: Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 399-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

(56) References Cited

OTHER PUBLICATIONS

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies In ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZNO Thin-Film Transistors with Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Chinese Office Action (Application No. 201010273917.0) dated Mar. 31, 2014.

Taiwanese Office Action (Application No. 099129686) dated Mar. 18, 2015.

Taiwanese Office Action (Application No. 105112626) dated Apr. 12, 2017.

Chinese Office Action (Application No. 201610156289.5) dated Jul. 31, 2017.

* cited by examiner

FIG. 37A1
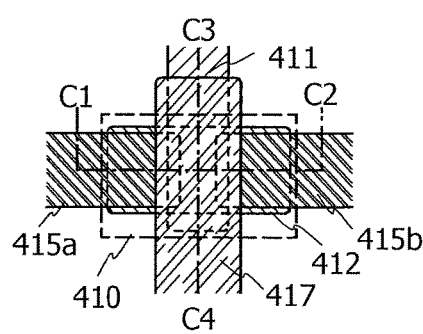
FIG. 37A2
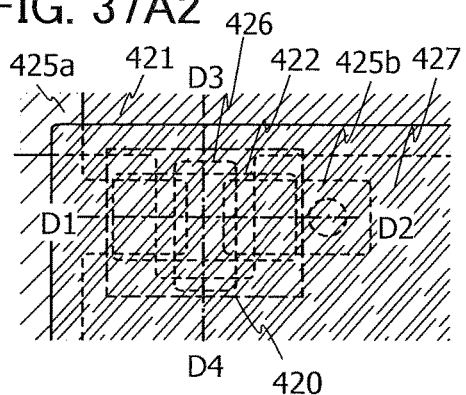
FIG. 37B
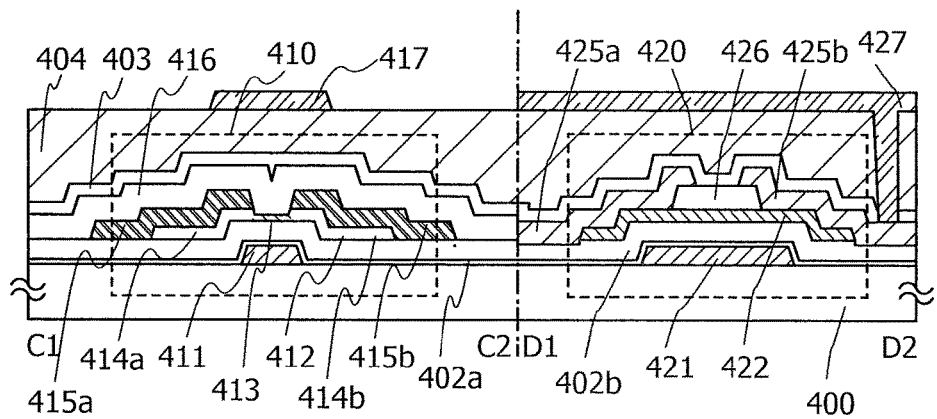
FIG. 37C
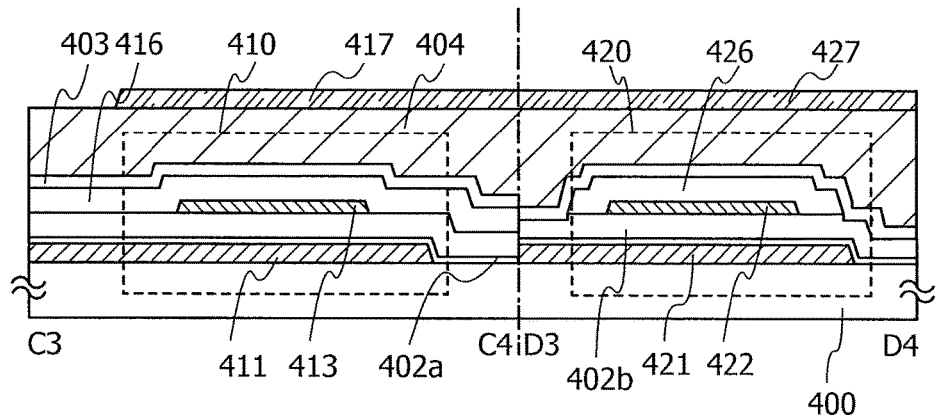

DISPLAY DEVICE AND ELECTRONIC DEVICE

CROSS-REFERENCE TO RELATED APPLICATIONS

This application is a continuation of U.S. application Ser. No. 12/872,861, filed Aug. 31, 2010, now allowed, which claims the benefit of a foreign priority application filed in Japan as Serial No. 2009-205136 on Sep. 4, 2009, both of which are incorporated by reference.

BACKGROUND OF THE INVENTION

1. Field of the Invention

The present invention relates to a semiconductor device, a display device, and a light-emitting device, or a method for manufacturing these devices. In particular, the present invention relates to a semiconductor device, a display device, and a light-emitting device each of which includes a circuit having a thin film transistor in which a light-transmitting semiconductor film is used for a channel formation region, or a method for manufacturing these devices. In particular, the present invention relates to a semiconductor device, a display device, and a light-emitting device each of which includes a circuit having a thin film transistor in which an oxide semiconductor film is used for a channel formation region, or a method for manufacturing these devices.

2. Description of the Related Art

Thin film transistors (TFTs) in which a silicon layer of amorphous silicon or the like is used as a channel layer have been widely used as switching elements in display devices typified by liquid crystal display devices. Although thin film transistors using amorphous silicon have low field-effect mobility, they have an advantage that larger glass substrates can be used.

Moreover, attention has been recently drawn to a technique by which a thin film transistor is manufactured using a metal oxide with semiconductor properties and such a transistor is applied to an electronic device or an optical device. For example, it is known that some metal oxides such as tungsten oxide, tin oxide, indium oxide, and zinc oxide have semiconductor properties. A thin film transistor in which a transparent semiconductor layer formed using such a metal oxide is used as a channel formation region is disclosed (e.g., see Reference 1).

Furthermore, a technique has been considered to increase the aperture ratio in such a manner that a channel layer of a transistor is formed using a light-transmitting oxide semiconductor layer and a gate electrode, a source electrode, and a drain electrode are formed using a transparent conductive film with light-transmitting properties (e.g., see Reference 2).

The increase in aperture ratio increases the light use efficiency, the reduction in power and size of display devices can be achieved. On the other hand, in terms of the increase in size of display devices and application of display devices to portable devices, a further reduction in power consumption as well as the increase in aperture ratio is required.

As a metal auxiliary wiring for a transparent electrode of an electro-optic element, there is known a wiring including a metal auxiliary wiring and a transparent electrode that overlap with each other to be brought into conduction on the upper side or the lower side of the transparent electrode (e.g., see Reference 3).

A structure is known in which an additional capacitor electrode provided on an active matrix substrate is formed using a transparent conductive film of ITO, $SnO_2$, or the like and an auxiliary wiring formed using a metal film is provided in contact with the additional capacitor electrode in order to reduce the electrical resistance of the additional capacitor electrode (e.g., see Reference 4).

In an electric-field transistor including an amorphous oxide semiconductor film, a transparent electrode formed from indium tin oxide (ITO), indium zinc oxide, ZnO, $SnO_2$, or the like; a metal electrode formed from Al, Ag, Cr, Ni, Mo, Au, Ti, Ta, or the like; a metal electrode formed from an alloy containing any of the above elements; or the like can be used for a gate electrode, a source electrode, and a drain electrode. It is known that a stack of two or more layers of such materials can reduce the contact resistance and increase the interface intensity (e.g., see Reference 5).

It is known that a metal such as indium (In), aluminum (Al), gold (Au), or silver (Ag); or an oxide material such as indium oxide ($In_2O_3$), tin oxide ($SnO_2$), zinc oxide (ZnO), cadmium oxide (CdO), indium cadmium oxide ($CdIn_2O_4$), cadmium tin oxide ($Cd_2SnO_4$), or zinc tin oxide ($Zn_2SnO_4$) can be used for a source electrode, a drain electrode, and a gate electrode of a transistor including an amorphous oxide semiconductor and an auxiliary capacitor electrode. The materials for the gate electrode, the source electrode, and the drain electrode may be the same or different from each other (e.g., see References 6 and 7).

A display device in which a memory is placed in a pixel is considered in order to reduce power consumption (e.g., see References 8 and 9). Moreover, in the display devices in References 8 and 9, pixel electrodes that reflect light are used.

REFERENCE

Reference 1: Japanese Published Patent Application No. 2004-103957

Reference 2: Japanese Published Patent Application No. 2007-081362

Reference 3: Japanese Published Patent Application No. H2-082221

Reference 4: Japanese Published Patent Application No. H2-310536

Reference 5: Japanese Published Patent Application No. 2008-243928

Reference 6: Japanese Published Patent Application No. 2007-109918

Reference 7: Japanese Published Patent Application No. 2007-115807

Reference 8: Japanese Published Patent Application No. 2001-264814

Reference 9: Japanese Published Patent Application No. 2003-076343

SUMMARY OF THE INVENTION

An object of one embodiment of the present invention is to provide a technique related to a pixel including a memory. Another object of one embodiment of the present invention is to increase the aperture ratio of a pixel.

Note that the description of a plurality of objects does not preclude the existence of another object. Moreover, one embodiment of the present invention is not necessary to achieve all the objects listed above.

For example, one embodiment of the present invention is a display device that includes a display element having a pixel electrode, a first circuit having a function of controlling input of an image signal, a second circuit having a function of holding the image signal, and a third circuit having a function of controlling the polarity of a voltage supplied to the display element. A pixel including a memory can be provided according to this embodiment. In this embodiment, the first to third circuits may be formed using a light-transmitting material, and the pixel electrode may be provided above the first to third circuits.

One embodiment of the present invention is a display device that includes a first circuit including a first switch; a second circuit including a first capacitor and a second capacitor to which a signal is input through the first switch, and an inverter having an input terminal electrically connected to the first capacitor and an output terminal electrically connected to the second capacitor; a third circuit including a second switch having a control terminal electrically connected to the first capacitor, and a third switch having a control terminal electrically connected to the second capacitor; and a display element having a pixel electrode electrically connected to the second switch and the third switch. A pixel including a memory can be provided according to this embodiment.

In the above embodiment, the display device may include first to third wirings. In this structure example, the first wiring is electrically connected to the first capacitor through the first switch; the input terminal of the inverter is electrically connected to the first capacitor; the output terminal of the inverter is electrically connected to the second capacitor; the first capacitor is electrically connected to the control terminal of the second switch; the second capacitor is electrically connected to the control terminal of the third switch; and the second wiring is connected to the third wiring through the second switch and the third switch.

In the above embodiment, the first to third switches, the first and second capacitors, and the inverter can be formed using a light-transmitting material. Moreover, the pixel electrode can be provided above the first to third switches, the first and second capacitors, and the inverter.

In each of the above-described embodiments of the present invention, a variety of switches can be used as a switch. For example, an electrical switch, a mechanical switch, or the like can be used as a switch. That is, there is no particular limitation on the kind of switch as long as the switch can control the flow of current. Examples of switches are a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit combining such elements. An example of a mechanical switch is a switch formed using a MEMS (micro electro mechanical system) technology, such as a digital micromirror device (DMD). Such a switch includes an electrode that can be moved mechanically, and operates to control electrical connection or non-electrical-connection with the movement of the electrode.

When a transistor is used as a switch in the each of above-described embodiments, the polarity (conductivity type) of the transistor is not particularly limited to a certain type because the transistor operates just as a switch. Note that a transistor of polarity with smaller off-state current is preferably used when the off-state current should be small. Examples of a transistor with smaller off-state current are a transistor provided with a high-resistance region and a transistor with a multi-gate structure.

In each of the above-described embodiments of the present invention, an n-channel transistor is preferably used as a switch when a potential of a source of the transistor used as the switch is close to a potential of a low potential side power supply (e.g., Vss, GND, or 0 V). On the other hand, a p-channel transistor is preferably used as the switch when the potential of the source of the transistor is close to a potential of a high potential side power supply (e.g., Vdd). This is because the absolute value of gate-source voltage can be increased when the potential of the source of the n-channel transistor is close to a potential of a low potential side power supply and when the potential of the source of the p-channel transistor is close to a potential of a high potential side power supply; thus, the transistor can more accurately operate as a switch. Alternatively, this is because decrease in output voltage does not often occur since the transistor does not often perform source follower operation.

In each of the above-described embodiments of the present invention, a CMOS switch may be employed as a switch by using both n-channel and p-channel transistors. By using a CMOS switch, the switch can more accurately operate as a switch because current can flow when either the p-channel transistor or the n-channel transistor is turned on. Thus, appropriate voltage can be output regardless of whether voltage of an input signal to the switch is high or low. Alternatively, the voltage amplitude value of a signal for turning on or off the switch can be made small, so that power consumption can be reduced.

Note that when a transistor is used as a switch, the switch includes an input terminal (one of a source and a drain), an output terminal (the other of the source and the drain), and a terminal for controlling conduction (a gate) in some cases. On the other hand, when a diode is used as a switch, the switch does not have a terminal for controlling electrical conduction in some cases. Therefore, when a diode is used as a switch, the number of wirings for controlling terminals can be reduced as compared to the case of using a transistor.

In the invention disclosed in this specification, transistors with a variety of structures can be used. That is, there is no limitation on the structure of transistors to be used.

In this specification, a semiconductor device corresponds to a device having a circuit including a semiconductor element (e.g., a transistor, a diode, or a thyristor). Note that a semiconductor device may correspond to all devices that can function by utilizing semiconductor properties or a device including a semiconductor material. In this specification, a display device corresponds to a device including a display element.

In this specification, a driving device corresponds to a device including a semiconductor element, an electric circuit, or an electronic circuit. Examples of the driving device are a transistor that controls input of a signal from a source signal line to a pixel (also referred to as a selection transistor, a switching transistor, or the like), a transistor that supplies voltage or current to a pixel electrode, and a transistor that supplies voltage or current to a light-emitting element. Moreover, examples of the driving device are a circuit that supplies a signal to a gate signal line (also referred to as a gate driver, a gate line driver circuit, or the like) and a circuit that supplies a signal to a source signal line (also referred to as a source driver, a source line driver circuit, or the like).

It is possible to combine any of a display device, a semiconductor device, a lighting device, a cooling device, a light-emitting device, a reflecting device, a driving device, and the like. Such a device is also included in an embodiment of the present invention. For example, a display device sometimes includes a semiconductor device and a light-emitting device. In some cases, a semiconductor device includes a display device and a driving device.

In each of the above-described embodiments of the present invention, all the circuits that are necessary to realize a predetermined function can be formed using one substrate (e.g., a glass substrate, a plastic substrate, a single crystal substrate, or an SOI substrate). In this manner, costs can be reduced by reduction in the number of components or the reliability can be improved by reduction in the number of connections to circuit components.

Furthermore, it is possible not to form all the circuits that are necessary to realize the predetermined function over one substrate. That is, part of the circuits which are necessary to realize the predetermined function may be formed using one substrate and another part of the circuits which are necessary to realize the predetermined function may be formed using another substrate. For example, some of the circuits which are necessary to realize the predetermined function can be formed over a glass substrate and some of the circuits which are necessary to realize the predetermined function can be formed using a single crystal substrate (or an SOI substrate). Then, the single crystal substrate where some of the circuits which are necessary to realize the predetermined function (such a substrate is also referred to as an IC chip) can be connected to the glass substrate by COG (chip on glass), and the IC chip can be provided over the glass substrate. Alternatively, the IC chip can be connected to the glass substrate with TAB (tape automated bonding), COF (chip on film), SMT (surface mount technology), a printed circuit board, or the like.

In this specification, when it is explicitly described that X and Y are connected, the case where X and Y are electrically connected, the case where X and Y are functionally connected, and the case where X and Y are directly connected are included therein. Here, each of X and Y is an object (e.g., a device, an element, a circuit, a wiring, an electrode, a terminal, a conductive film, or a layer). Accordingly, another connection relation shown in drawings and texts is included without being limited to a predetermined connection relation, for example, the connection relation shown in the drawings and the texts.

For example, in the case where X and Y are electrically connected, one or more elements that enable electrical connection between X and Y (e.g., a switch, a transistor, a capacitor, an inductor, a resistor, and/or a diode) can be connected between X and Y.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing a potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, when a signal output from X is transmitted to Y, it can be said that X and Y are functionally connected even if another circuit is provided between X and Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

In this specification, explicit singular forms preferably mean singular forms. Note that in that case, the singular form can also include the plural. Similarly, explicit plural forms preferably mean plural forms. However, also in that case, the plural form can include the singular.

Note that the size, the thickness of layers, or regions in the drawings of this application are exaggerated for simplicity in some cases. Therefore, embodiments of the present invention are not limited to such scales. Note that a drawing schematically illustrates an ideal example, and embodiments of the present invention are not limited to the shape, value, or the like illustrated in the drawing. For example, it is possible to include variations in shape due to a manufacturing technique or an error, variations in signal, voltage, or current due to noise or difference in timing.

Note that technical terms are used in order to describe a specific embodiment or the like in many cases. Note that one embodiment of the present invention is not construed as being limited by the technical terms.

Note that terms that are not defined (including terms used for science and technology such as technical term or academic parlance) can be used as the terms having meaning equal to general meaning that an ordinary person skilled in the art understands. It is preferable that terms defined by dictionaries or the like be construed as consistent meaning with the background of related art.

The terms such as "first", "second", and "third" are used for distinguishing a variety of elements, members, regions, layers, areas, and the like from each other. Therefore, the terms such as "first", "second", and "third" do not limit the order and number of the elements, members, regions, layers, areas, and the like. Further, the term "first" can be replaced with the term "second", "third", or the like, for example.

Note that terms for describing spatial arrangement, such as "over", "above", "under", "below", "laterally", "right", "left", "obliquely", "behind", "front", "inside", "outside", and "in", are often used for briefly showing a relation between an element and another element or between a feature and another feature with reference to a diagram. Note that embodiments of the present invention are not limited to this use of terms, and such terms for describing spatial arrangement can indicate not only the direction illustrated in a diagram but also another direction in some cases. For example, when it is explicitly described that "Y is over X", it does not necessarily mean that Y is placed over X. Since a structure in a diagram can be inverted or rotated by 180°, the case where Y is placed under X can be included. Thus, "over" can refer to the direction described by "under" in addition to the direction described by "over". Note that the embodiments of the present invention are not limited to this, and "over" can refer to any of the other directions described by "laterally", "right", "left", "obliquely", "behind", "front", "inside", "outside", "in", and the like in addition to the directions described by "over" and "under" because a device in a diagram can be rotated in a variety of directions. That is, the terms for describing spatial arrangement can be construed adequately depending on the situation.

When it is explicitly described that Y is formed on or over X, it does not necessarily mean that Y is formed on and in direct contact with X. The description includes the case where X and Y are not in direct contact with each other, that is, the case where another object is placed between X and Y. Here, each of X and Y corresponds to an object (e.g., a device, an element, a circuit, a wiring, an electrode, a terminal, a conductive film, or a layer).

Accordingly, for example, when it is explicitly described that "a layer Y is formed on (or over) a layer X", it includes both the case where the layer Y is formed on and in direct contact with the layer X, and the case where another layer (e.g., a layer Z) is formed on and in direct contact with the layer X and the layer Y is formed on and in direct contact with the layer Z. Note that another layer (e.g., the layer Z) may be a single layer or a plurality of layers.

Similarly, when it is explicitly described that Y is formed above X, it does not necessarily mean that Y is formed on and in direct contact with X, and another object may be placed between X and Y. Therefore, for example, when it is described that "a layer Y is formed above a layer X", it includes both the case where the layer Y is formed on and in direct contact with the layer X, and the case where another layer (e.g., a layer Z) is formed on and in direct contact with the layer X and the layer Y is formed on and in direct contact with the layer Z. Note that another layer (e.g., the layer Z) may be a single layer or a plurality of layers.

Note that when it is explicitly described that Y is formed over, on, or above X it includes the case where Y is formed obliquely over/above X.

Note that the same can be said when it is explicitly described that Y is formed below or under X.

By forming a light-transmitting transistor or a light-transmitting capacitor, light can be transmitted also in a portion where the transistor or the capacitor is formed even when the transistor or the capacitor is provided in a pixel. Thus, the aperture ratio of the pixel can be increased. In addition, a memory is provided in a pixel by using such a transistor and a light-transmitting wiring, whereby it is possible to provide a transmissive display including a pixel having a memory.

Further, when a wiring for connecting a transistor and an element (e.g., another transistor) or a wiring for connecting a capacitor and an element (e.g., another capacitor) can be formed using a material with low resistivity and high conductivity, the distortion of the waveform of a signal and a voltage drop due to wiring resistance can be reduced.

BRIEF DESCRIPTION OF THE DRAWINGS

In the accompanying drawings:

FIGS. 37A1 and 37A2 are plan views and FIGS. 37B and 37C are cross-sectional views illustrating an example of a structure of a display device;

DETAILED DESCRIPTION OF THE INVENTION

Figure 1:
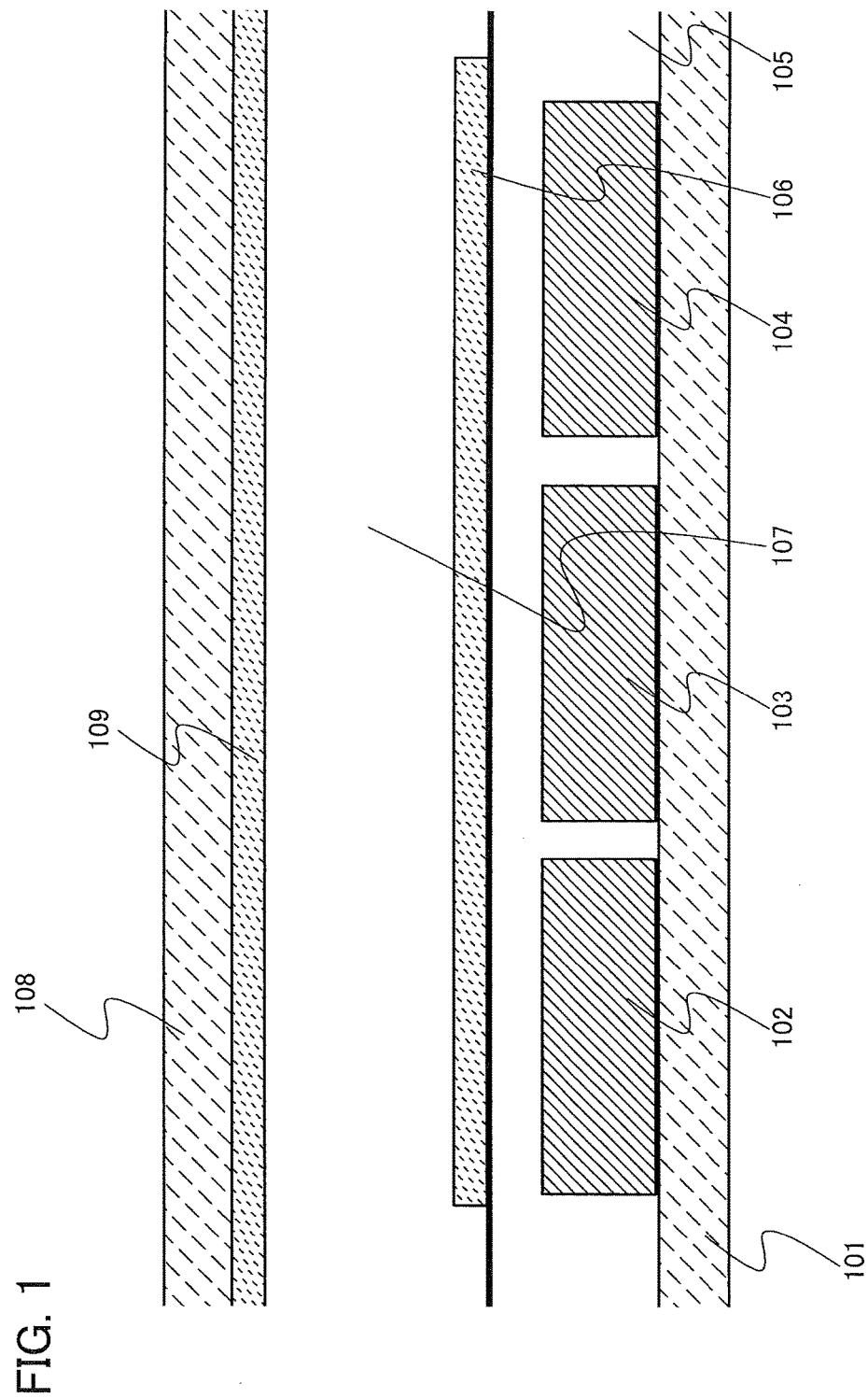
FIG. 1 is a cross-sectional view illustrating an example of a structure of a display device.

Embodiments of the present invention will be described below. An embodiment of the invention disclosed in this specification can achieve any of the following objects, for example. Note that the description of a plurality of objects does not preclude the existence of another object. In addition, each embodiment of the present invention is not necessary to achieve all the following objects.

Objects are, for example, to provide a technique related to a pixel including a memory, to increase the aperture ratio of a pixel, to lower wiring resistance, to reduce contact resistance, to reduce a voltage drop, to reduce power consumption, to improve display quality, and to reduce the off-state current of a transistor.

The embodiments of the present invention can be carried out in many different modes, and it is easily understood by those skilled in the art that modes and details can be modified in various ways without departing from the spirit and scope of the present invention. Therefore, the present invention is not interpreted as being limited to the description of the embodiments below. Note that in structures described below, the same portions or portions having similar functions are denoted by the same reference numerals, and description thereof is not repeated.

What is described in one embodiment (or part of the content) can be combined or replaced with another content in the same embodiment and/or what is described (or part thereof) in another embodiment or other embodiments. Note that in each embodiment, what is described in the embodiment is the content described with reference to one or a plurality of diagrams and the content described in text form.

A combination of a diagram (or part of the diagram) used in one embodiment with another part of the diagram, a different diagram (or part thereof) used in the same embodiment, and/or a diagram (or part thereof) used in one or a plurality of different embodiments can form a diagram in which another structure example is illustrated. On the basis of part of a diagram or a text used in one embodiment, another embodiment can be constituted. Therefore, in the case where a diagram or a text related to some portion is described, the present invention also discloses another embodiment represented by the diagram or the text for that portion.

Therefore, for example, it is possible to constitute one embodiment of the invention by taking out part of a diagram (e.g., a cross-sectional view, a plan view, a circuit diagram, a block diagram, a flow chart, a process diagram, a perspective view, a cubic diagram, a layout diagram, a timing chart, a structure diagram, a schematic view, a graph, a list, a ray diagram, a vector diagram, a phase diagram, a waveform chart, a photograph, or a chemical formula) or a text in which one or more of an active element (e.g., a transistor and a diode), a wiring, a passive element (e.g., a capacitor and a resistor), a conductive layer, an insulating layer, a semiconductor layer, an organic material, an inorganic material, a component, a substrate, a module, a device, a solid, a liquid, a gas, an operating method, a manufacturing method, and the like are described.

For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided.

Further, in the case where at least one specific example is described in a diagram or a text described in one embodiment, it is readily appreciated by those skilled in the art that a broader concept of the specific example can be derived. Therefore, in the case where at least one specific example is described in the diagram or the text described in one embodiment, a broader concept of the specific example can constitute one embodiment of the invention disclosed in this specification.

The content described in at least a diagram (or part of the diagram) is disclosed as one embodiment of the invention, and can constitute one embodiment of the invention. Therefore, when certain content is described in a diagram, one embodiment of the invention disclosed in this specification can be constituted by the content even when the content is not described with a text. Similarly, one embodiment of the invention disclosed in this specification can be constituted by a diagram obtained by taking out part of a diagram.

It might be possible for those skilled in the art to constitute one embodiment of the invention even when portions to which all terminals of an active element (e.g., a transistor or a diode), a passive element (e.g., a capacitor or a resistor), or the like are connected are not specified. In particular, in the case where the number of portions to which the terminal is connected is plural, it is not necessary to specify the portions to which the terminal is connected. Therefore, in some cases, it is possible to constitute an embodiment of the invention by only specifying portions to which only some of terminals of an active element (e.g., a transistor or a diode), a passive element (e.g., a capacitor or a resistor), or the like are connected.

It is sometimes possible for those skilled in the art to specify an embodiment of the invention when at least a connection portion of a circuit is specified, and such a case is included in the embodiment of the invention disclosed in this specification. Moreover, it is sometimes possible for those skilled in the art to specify an embodiment of the invention disclosed in this specification when at least a function of a circuit is specified. Such a case is included in the embodiment of the invention disclosed in this specification.

Embodiment 1

In this embodiment, a display device will be described.

An example of a structure of a display device (also referred to as a semiconductor device) in this embodiment is described with reference to FIG. 1. The display device includes a plurality of pixels. FIG. 1 illustrates a cross-sectional structure of one pixel.

A circuit 102, a circuit 103, and a circuit 104 are provided above a substrate 101. An insulating layer 105 is provided above the circuits 102 to 104. A conductive layer 106 is provided above the insulating layer 105. A conductive layer 109 is provided above a substrate 108 (provided below the substrate 108 in FIG. 1). A medium 107 is provided between the conductive layer 106 and the conductive layer 109. A display element can be formed using the medium 107, the conductive layer 106, and the conductive layer 109. The conductive layer 106 can be connected to the circuit 102, the circuit 103, and/or the circuit 104. The conductive layer 106 can be placed so as to cover all or most parts of the circuit 102, the circuit 103, and/or the circuit 104. However, this embodiment is not limited to such a structure.

In the example of the structure in FIG. 1, it is possible not to provide the substrate 108 or the conductive layer 109, and it is possible not to provide the circuit 102, the circuit 103, or the circuit 104.

Here, for example, the circuit 102 has a function of controlling whether a signal (e.g., an image signal) is input to a pixel or not. Thus, the circuit 102 can include a selection transistor or a switching transistor.

For example, the circuit 103 has a function of holding a signal. That is, the circuit 103 has a memory function. The circuit 103 includes a DRAM, an SRAM, a nonvolatile memory, or the like as a memory, for example. Moreover, the circuit 103 can include a refresh circuit. Data in a DRAM can be refreshed by the refresh circuit. For that reason, the circuit 103 can include an inverter, a clocked inverter, a capacitor, an analog switch, or the like.

For example, the circuit 104 has a function of controlling the polarity of voltage supplied to the medium 107. Consequently, the circuit 104 is not provided in some cases depending on the kind of the medium 107. For that reason, the circuit 104 can include an inverter, a source follower, an analog switch, or the like. When a memory is placed in a pixel in such a manner, the frequency of signal writing can be lowered, so that power consumption can be reduced. However, this embodiment is not limited to such circuits.

When the circuits 102 to 104 have the above-described functions, a transistor or a wiring included in the circuit 102, the circuit 103, and/or the circuit 104 can be formed using a light-transmitting material. For example, it is possible to use a light-transmitting material for part or all of the following: a gate electrode, a semiconductor layer, a source electrode, and a drain electrode of a transistor. Thus, light can pass through a portion where the transistor or the wiring is provided. Similarly, wirings such as a source signal line, a gate signal line, a capacitor wiring, and a power supply line can be formed using a light-transmitting material. Thus, light can pass through most of a pixel region in which a plurality of pixels are arranged.

Note that although part or all of the wirings such as a source signal line, a gate signal line, a capacitor wiring, and a power supply line can be formed using a light-transmitting material, this embodiment is not limited to this structure and the wiring can be formed using a material with high conductivity. That is, the wiring can be formed using a material without light-transmitting properties. For example, the wiring can be a stack of a layer with light-transmitting properties and a layer without light-transmitting properties. In such cases, the aperture ratio is decreased since a region through which light passes is narrowed, whereas distortion of signals and a voltage drop can be reduced because of high conductivity.

In particular, in a circuit for driving a pixel, for example, a gate driver, a source driver, or a circuit for driving a common electrode (a counter electrode), a wiring and/or a transistor can be formed using a layer without light-transmitting properties. Light does not need to pass through a gate driver, a source driver, a circuit for driving a common electrode (a counter electrode), or the like. For that reason, a wiring and a transistor are formed using a wiring and an electrode that have high conductivity, whereby distortion of signals and a voltage drop can be reduced.

Note that the conductive layer 106 or the conductive layer 109 can be formed using a light-transmitting material. As illustrated in FIG. 1, the circuit 102, the circuit 103, or the circuit 104 can be placed under the conductive layer 106. In this case, the circuit 102, the circuit 103, or the circuit 104 can be formed using a light-transmitting material, so that the aperture ratio can be increased, or a transmissive display device can be provided. In other words, it is possible to obtain a transmissive display device in which a memory is provided in a pixel.

Note that part of the conductive layer 106 and/or part of the conductive layer 109 can be formed using a material without light-transmitting properties, that is, a material with high conductivity. When part of the conductive layer 106 is formed using a material with high conductivity, the part can reflect light. Thus, a transflective display device can be provided.

Note that at least one of the circuit 102, the circuit 103, and the circuit 104 may be placed under the conductive layer 106. Alternatively, part of the circuit 102, the circuit 103, and the circuit 104 may be placed under the conductive layer 106.

The conductive layer 106 can have a function of a pixel electrode. The conductive layer 109 can have a function of a common electrode.

Note that the conductive layer 109 is not limited to being formed on the substrate 108 and can be formed over the substrate 101.

The medium 107 includes a liquid crystal, an organic EL material, an inorganic EL material, an electrophoretic material, an electro liquid powder, or a toner, for example. Optical properties of the medium 107 are controlled with voltage or current that is supplied from the conductive layer 106 and the conductive layer 109.

FIG. 1 illustrates the example where the circuits 102, 103, and 104 are provided in one pixel; however, this embodiment is not limited to this structure. It is possible to provide a larger number of circuits or a smaller number of circuits.

Note that the substrate 101 or the substrate 108 is preferably an insulating substrate. Examples of the insulating substrate are a glass substrate, a plastic substrate, a flexible substrate, a polyethylene terephthalate (PET) substrate, a stainless steel foil substrate, an SOI substrate, a silicon substrate, a ceramic substrate, a quartz substrate, and a sapphire substrate. A conductive substrate that is formed of a conductor such as metal or stainless steel and has a surface covered with an insulating material can also be used. When glass or plastics are used for the substrate, light can pass through the substrate. When a plastic substrate or a flexible substrate is used as the substrate 101 or the substrate 108, the substrate can be bent and is not easily broken.

Note that one or a plurality of insulating layers may be formed on a surface of the substrate 101 or the substrate 108, in which case diffusion of impurities included in the substrate can be suppressed.

Embodiment 2

In this embodiment, a display device will be described.

Examples of structures of a display device (also referred to as a semiconductor device) shown in this embodiment will be described with reference to FIGS. 2 to 14. The display device includes a plurality of pixels. FIGS. 2 to 14 each illustrate a cross-sectional structure of one pixel.

Figure 2:
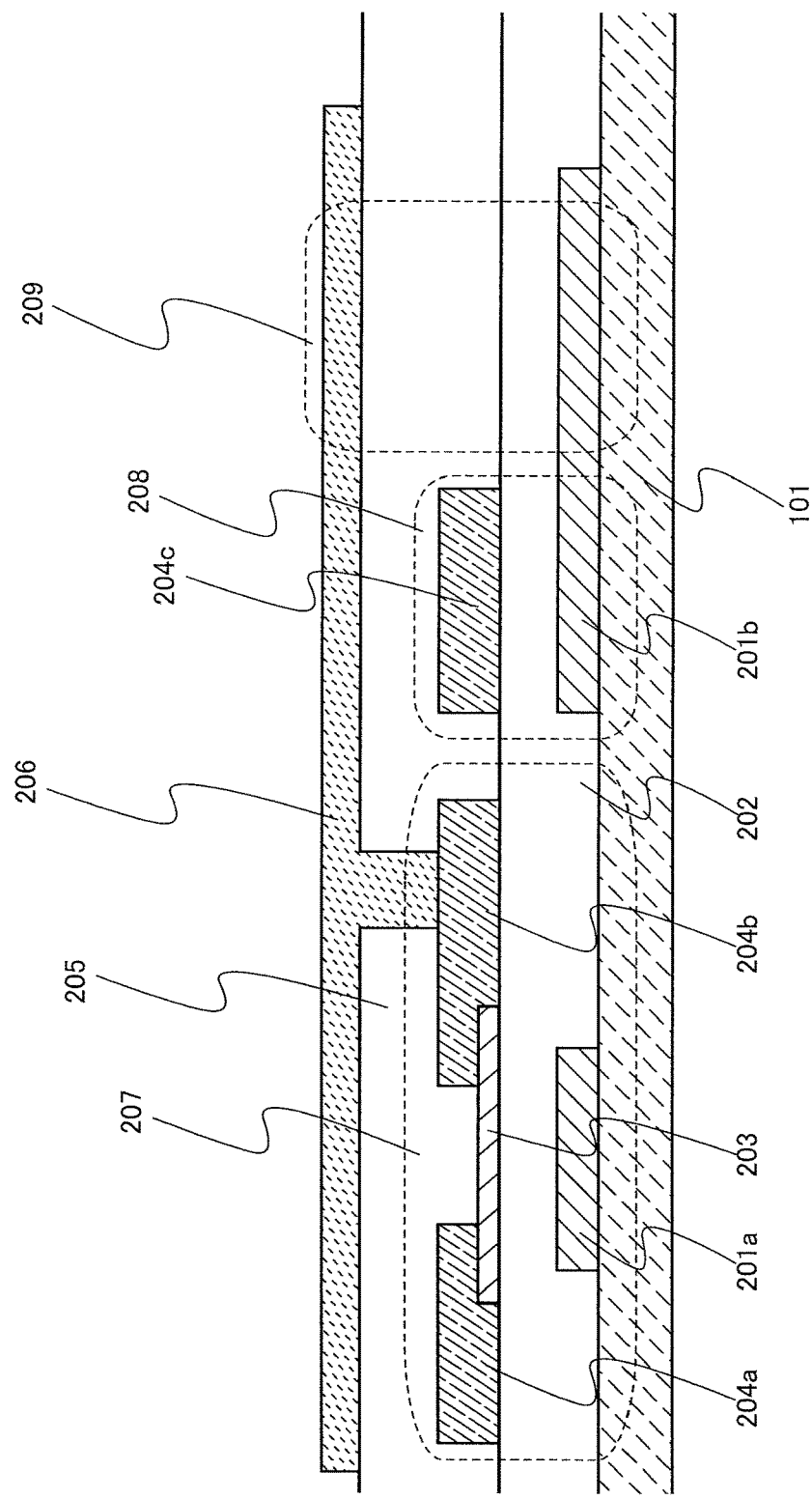
FIG. 2 is a cross-sectional view illustrating an example of a structure of a display device.

As illustrated in FIG. 2, conductive layers 201a and 201b are placed above the substrate 101. An insulating layer 202 is placed above the conductive layers 201a and 201b. A semiconductor layer 203 is placed above the insulating layer 202. Conductive layers 204a, 204b, and 204c are placed above the semiconductor layer 203 or the insulating layer 202. An insulating layer 205 is placed above the conductive layers 204a, 204b, and 204c or the semiconductor layer 203. A conductive layer 206 is placed above the insulating layer 205. The conductive layer 204b is connected to the conductive layer 206 through a contact hole formed in the insulating layer 205. An upper portion of the semiconductor layer 203 and lower portions of the conductive layers 204a and 204b are in contact with each other so that the semiconductor layer 203 and the conductive layers 204a and 204b are connected to each other.

Note that the conductive layers 201a and 201b can be formed with an etching treatment for films (with a single-layer structure or a layered structure) formed through the same deposition step. In this case, the conductive layers 201a and 201b contain approximately the same material. Similarly, the conductive layers 204a, 204b, and 204c can be formed with an etching treatment for films (with a single-layer structure or a layered structure) formed through the same deposition step. In this case, the conductive layers 204a to 204c contain approximately the same material.

The conductive layer 201a can have a function of a gate electrode of a transistor 207 or a function of a gate signal line. The conductive layer 201b can have a function of capacitor electrodes of capacitors 208 and 209 or a function of a storage capacitor line.

The insulating layer 202 can have a function of a gate insulating layer of the transistor 207 or a function of insulating layers of the capacitors 208 and 209.

The conductive layers 204a and 204b can have a function of a source electrode and a drain electrode of the transistor 207 or a function of a source signal line or a video signal line.

The conductive layer 204c can have a function of a capacitor electrode of the capacitor 208 or a function of a storage capacitor line.

The semiconductor layer 203 can have a function of an active layer of the transistor 207, a function of a channel layer of the transistor 207, a function of a high-resistance region of the transistor 207, or a function of an impurity region of the transistor 207.

The conductive layer 206 can have a function of a pixel electrode or a function of a capacitor electrode of the capacitor 209.

The conductive layer 206 can correspond to the conductive layer 106 in FIG. 1. The insulating layer 205 can correspond to the insulating layer 105 in FIG. 1.

The transistor 207, the capacitor 208, and the like can be placed below the conductive layer 206 as described above. Since the transistor 207, the capacitor 208, and the like have light-transmitting properties, the aperture ratio can be increased. Alternatively, a transmissive display device can be obtained. Moreover, a selection transistor, a memory (e.g., a DRAM or an SRAM), an analog switch, an inverter, a clocked inverter, or the like can be formed using the transistor 207 and the capacitors 208 and 209.

Since the conductive layer 201a is placed below the semiconductor layer 203, the transistor 207 can be referred to as a bottom-gate transistor or an inverted staggered transistor. Since a channel protective film is not provided over the semiconductor layer 203 in the transistor 207, the transistor 207 can be referred to as a channel-etched transistor. Moreover, the transistor 207 can also be called a thin film transistor.

Note that the structures of the transistor and the capacitor are not limited to those in FIG. 2. A variety of other structures can be employed.

Figure 3:
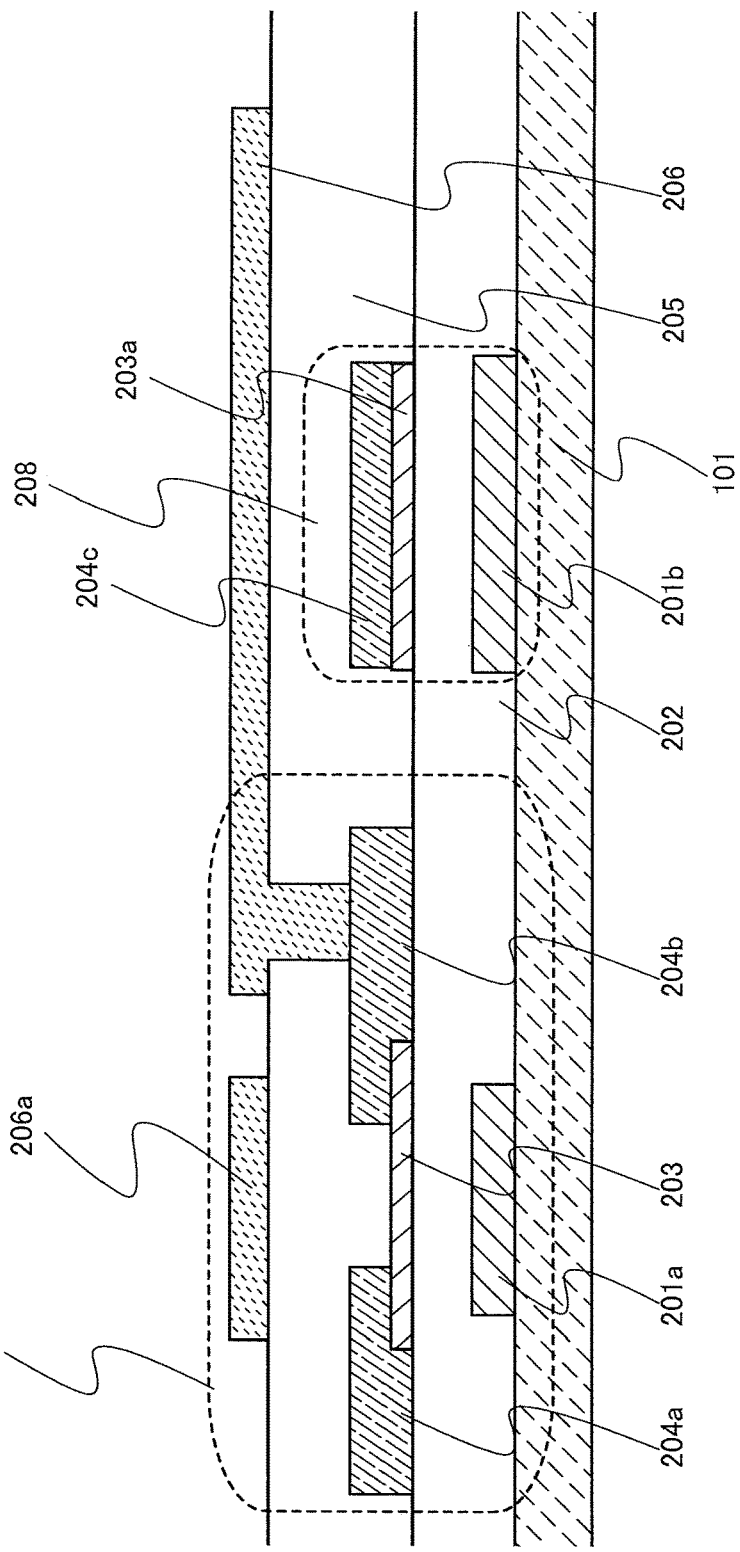
FIG. 3 is a cross-sectional view illustrating an example of a structure of a display device.

For example, it is possible to form a transistor in which an electrode is provided on the opposite side to a gate electrode, with respect to a channel portion. FIG. 3 illustrates an example of a structure of a pixel in the case where a conductive layer 206a is provided above the semiconductor layer 203 and the insulating layer 205. The conductive layer 206a can function as a back gate of the transistor 207. A potential different from that for the conductive layer 201a is supplied to the conductive layer 206a, whereby stable operation of the transistor 207 can be achieved. Alternatively, the same potential as that for the conductive layer 201a is supplied to the conductive layer 206a, whereby the channel of the transistor 207 substantially doubles; thus, the mobility can be substantially increased.

Note that the conductive layers 206a and 206 can be formed with an etching treatment for films (with a single-layer structure or a layered structure) formed through the same deposition step. In this case, the conductive layers 206a and 206 contain approximately the same material.

In the capacitor 208, a semiconductor layer 203a can be provided between the conductive layer 204c and a conductive layer 201c as illustrated in FIG. 3. Here, the semiconductor layer 203 and 203a can be formed with an etching treatment for films (with a single-layer structure or a layered structure) formed through the same deposition step. In this case, the semiconductor layer 203 and 203a contain approximately the same material.

Note that a transistor in a peripheral circuit portion (e.g., a circuit portion for driving a pixel) and a transistor in a pixel portion can have different structures. For example, it is possible to employ a structure in which the transistor 207 in a pixel portion is not provided with the conductive layer 206a as illustrated in FIG. 2, whereas the transistor 207 in a circuit for driving a pixel portion includes the conductive layer 206a as illustrated in FIG. 3. In the circuit for driving a pixel portion, it is extremely important to control the threshold voltage of the transistor 207. In the pixel portion, however, the transistor 207 can be operated in some cases even if the transistor 207 is in a normally-on state. Moreover, in the pixel portion, reduction in aperture ratio can be prevented by the absence of the conductive layer 206a. Thus, when the transistor 207 in the pixel portion is not provided with the conductive layer 206a and the transistor 207 in the circuit for driving a pixel portion includes the conductive layer 206a, a display device can be operated in an appropriate manner and the aperture ratio can be increased.

Figure 4:
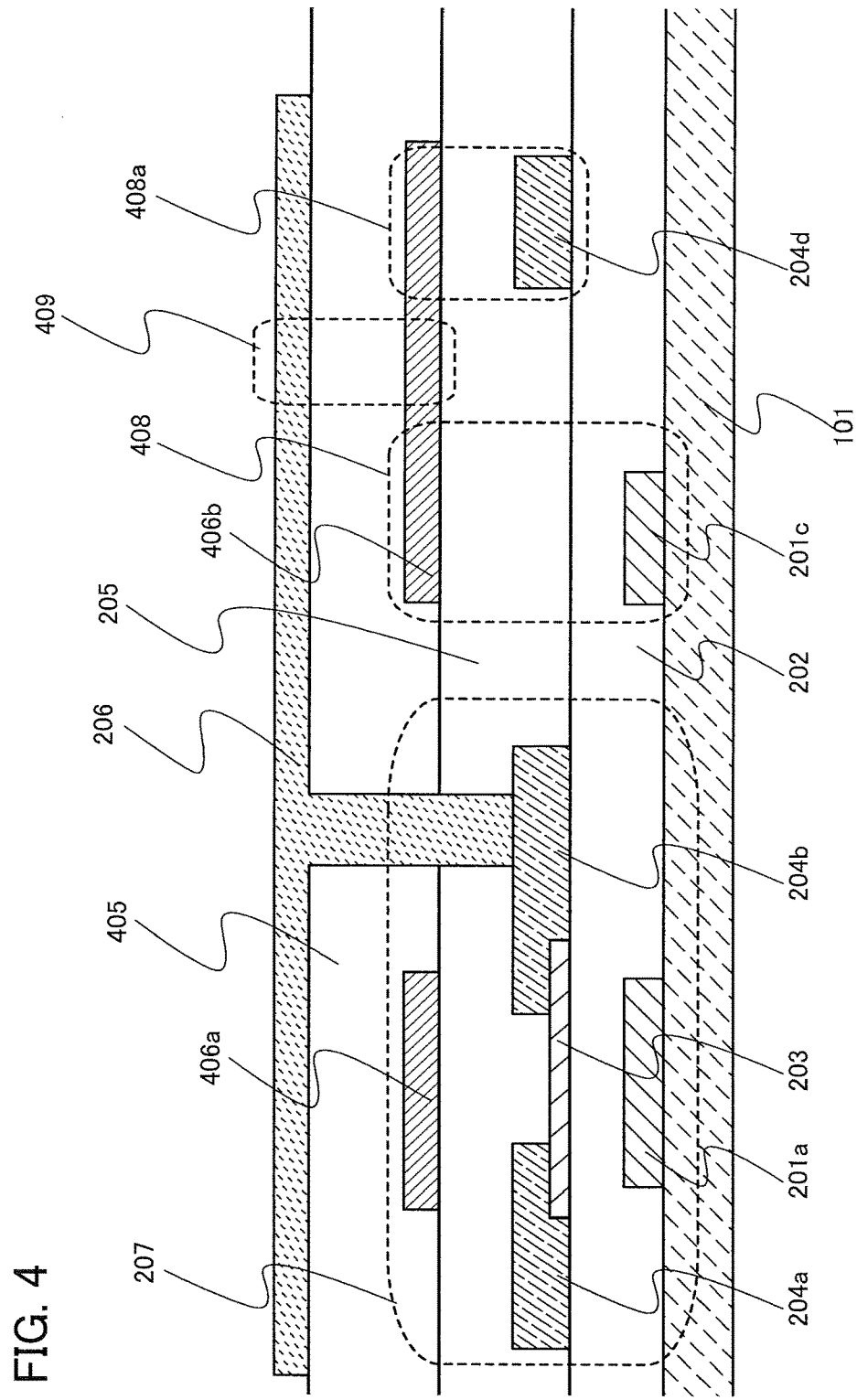
FIG. 4 is a cross-sectional view illustrating an example of a structure of a display device.

However, this embodiment is not limited to the structure in FIG. 3. A pixel can be formed using a layer that is different from the conductive layer 206a. FIG. 4 illustrates one example.

A conductive layer 406a and an insulating layer 405 are provided between the insulating layer 205 and the conductive layer 206. The conductive layer 406a can function as the back gate of the transistor 207. With the use of the layer which is different from the conductive layer 206 in such a manner, the transistor 207 and the conductive layer 406a can be placed under the conductive layer 206. Thus, when the transistor 207 with this structure is used in a pixel, the aperture ratio can be increased.

Note that a capacitor 408 can be formed using a conductive film that is in the same layer as the conductive layer 406a. The capacitor 408 can be formed using a conductive layer 406b and the conductive layer 201c. A capacitor 409 can be formed using the conductive layer 406b and the conductive layer 206. A capacitor 408a can be formed using the conductive layer 406b and the conductive layer 204d.

Note that the conductive layers 201a and 201c can be formed with an etching treatment for films (with a single-layer structure or a layered structure) formed through the same deposition step. In this case, the conductive layers 201a and 201c contain approximately the same material. In addition, the conductive layers 204a, 204b, and 204d can be formed with an etching treatment for films (with a single-layer structure or a layered structure) formed through the same deposition step. In this case, the conductive layers 204a, 204b, and 204d contain approximately the same material. The conductive layers 406a and 406b can be formed with an etching treatment for films (with a single-layer structure or a layered structure) formed through the same deposition step. In that case, the conductive layers 406a and 406b contain approximately the same material.

Figure 5:
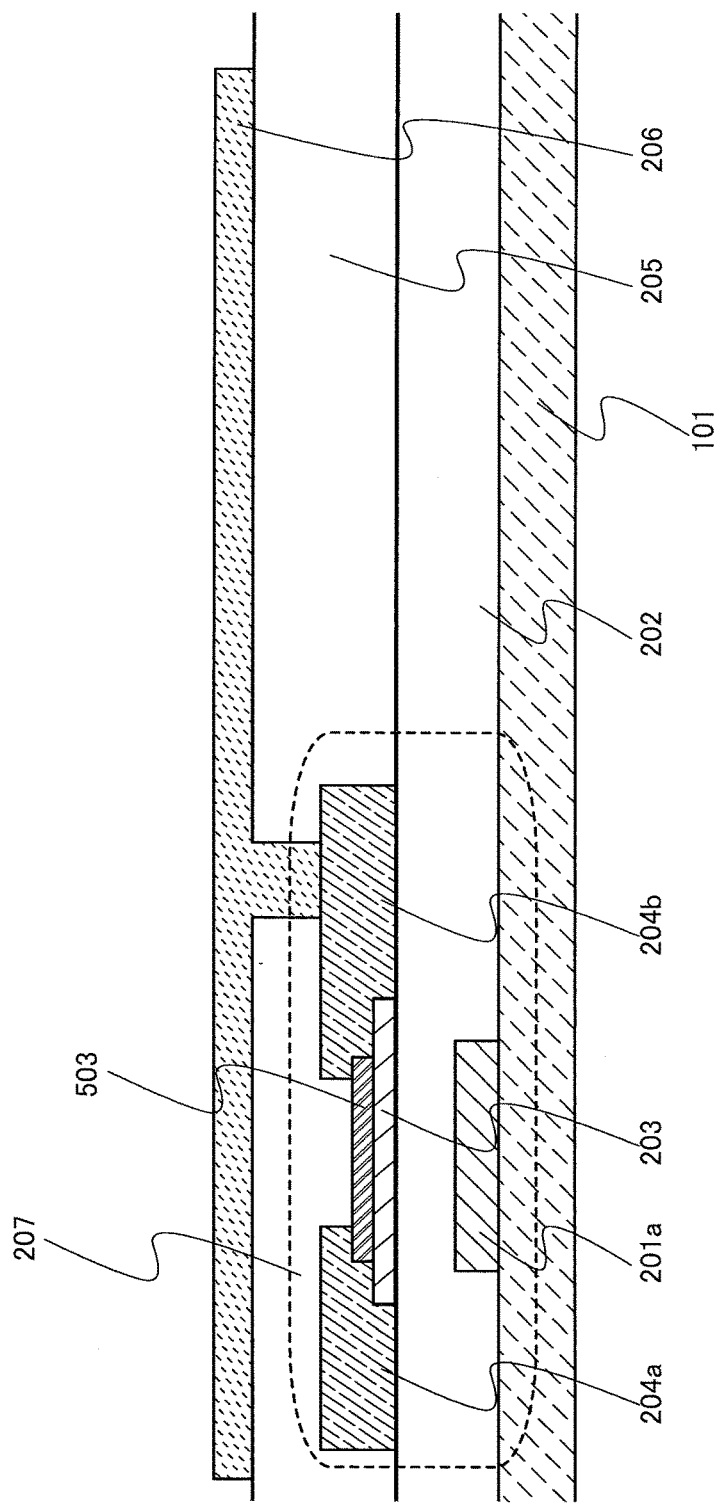
FIG. 5 is a cross-sectional view illustrating an example of a structure of a display device.

Note that FIGS. 2 to 4 each illustrate the example of the transistor 207 in which a channel protective film is not provided over the semiconductor layer 203. However, this embodiment is not limited to these examples. It is possible to provide a channel protective film. As an example, FIG. 5 illustrates the case where a channel protective film 503 is provided for the transistor 207 in FIG. 2. Similarly, the transistor in each of FIGS. 3 and 4 can include a channel protective film. In the transistor 207 in FIG. 5, the thickness of the semiconductor layer 203 can be reduced by the placement of the channel protective film 503. Thus, the off-state current can be reduced or the subthreshold swing value (S value) can be reduced. Further, because it is not necessary to consider the etching selectivity of the semiconductor layer 203 to the conductive layers 204a and 204b, materials can be freely selected.

Figure 6:
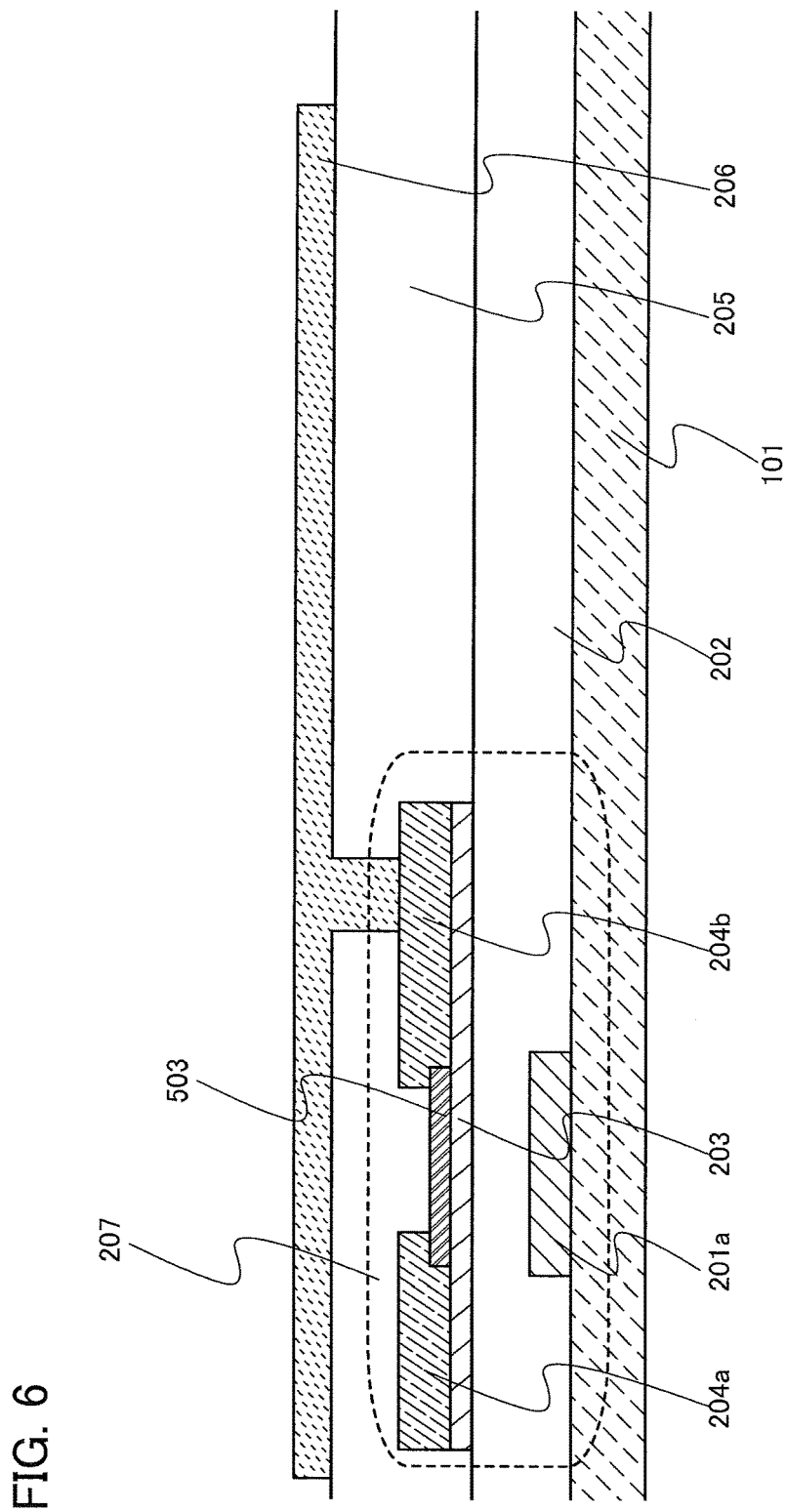
FIG. 6 is a cross-sectional view illustrating an example of a structure of a display device.

In the examples of the structures in FIGS. 2 to 5, a region where the semiconductor layer 203 is not provided is placed under the conductive layers 204a and 204b. This embodiment is not limited to these structures, and the semiconductor layer 203 may be provided under the whole area of the conductive layers 204a and 204b as illustrated in FIG. 6. In this case, it is possible not to provide the channel protective film 503. When the channel protective film 503 is not provided, the number of masks (reticles) can be reduced by using a multi-tone mask (also referred to as a half-tone mask or a gray-tone mask). The following steps may be performed, for example. Films to be the semiconductor layer 203 and the conductive layers 204a and 204b are successively formed. A resist mask is formed, and these films are etched at the same time. The resist mask is subjected to ashing or the like so that a mask for only etching the conductive layers 204a and 204b is formed. With one light exposure mask, a channel portion in the semiconductor layer 203 and a resist mask for etching the conductive layers 204a and 204b can be formed.

As an example of the pixel structure, FIGS. 2 to 6 each illustrate the example of the structure in which an upper portion of the semiconductor layer 203 and lower portions of the conductive layers 204a and 204b are in contact with each other so that the semiconductor layer 203 and the conductive layers 204a and 204b are electrically connected to each other. Needless to say, this embodiment is not limited to these examples. It is possible to provide a conductive layer that is in contact with a lower portion of the semiconductor layer 203 and is electrically connected to the semiconductor layer 203. Such structure examples will be described below with reference to FIGS. 7 to 10.

Figure 7:
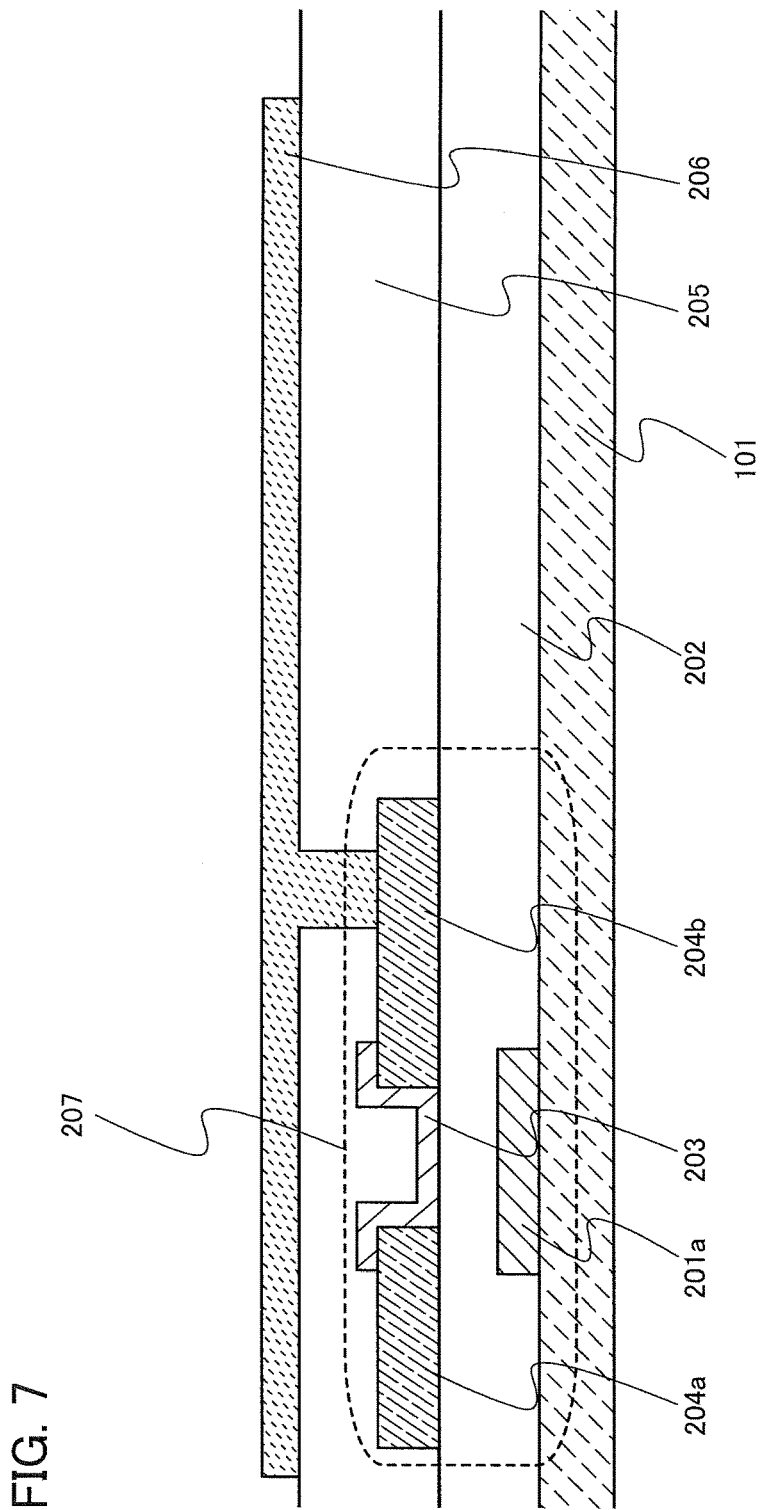
FIG. 7 is a cross-sectional view illustrating an example of a structure of a display device.
Figure 8:
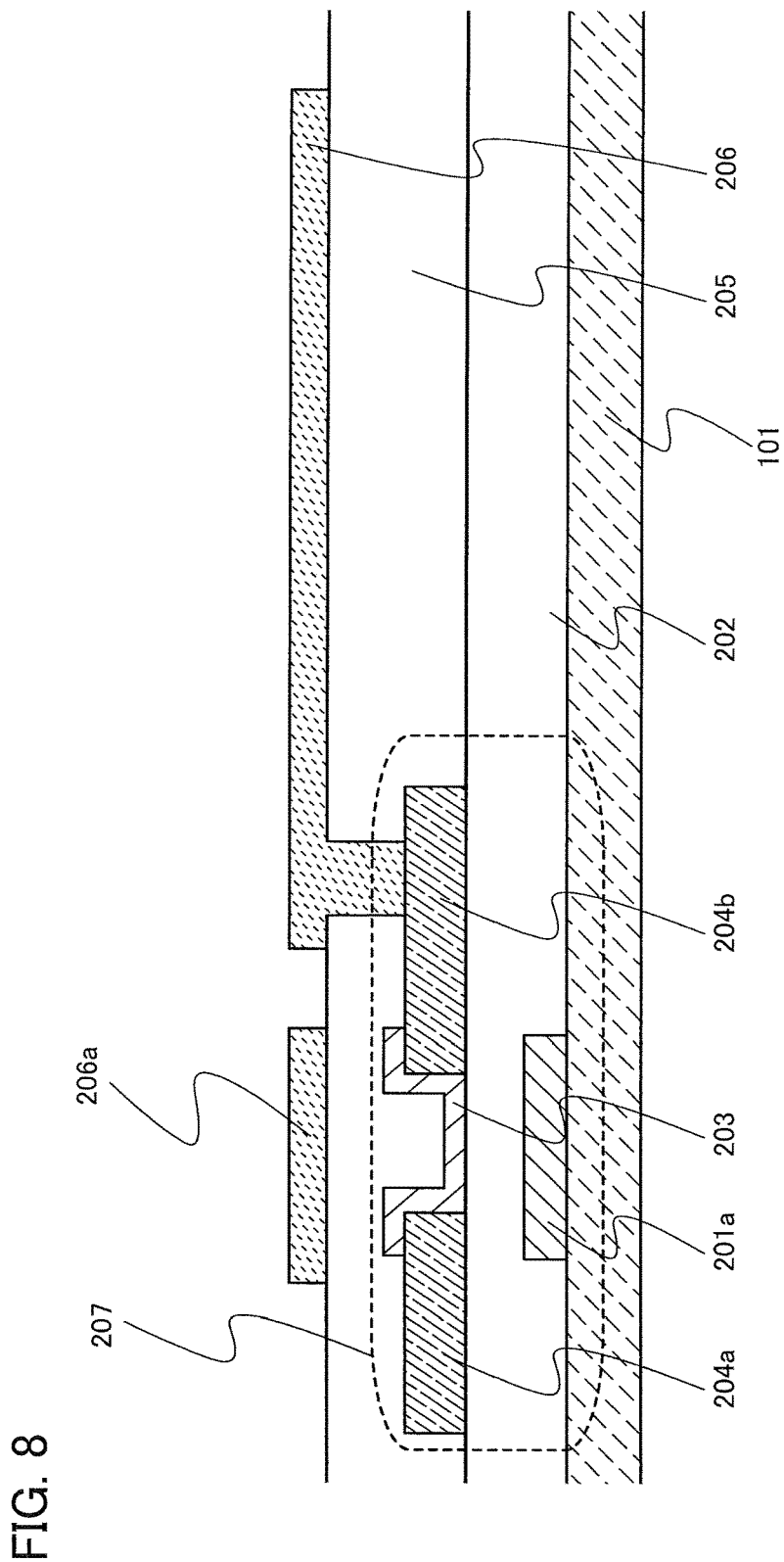
FIG. 8 is a cross-sectional view illustrating an example of a structure of a display device.
Figure 9:
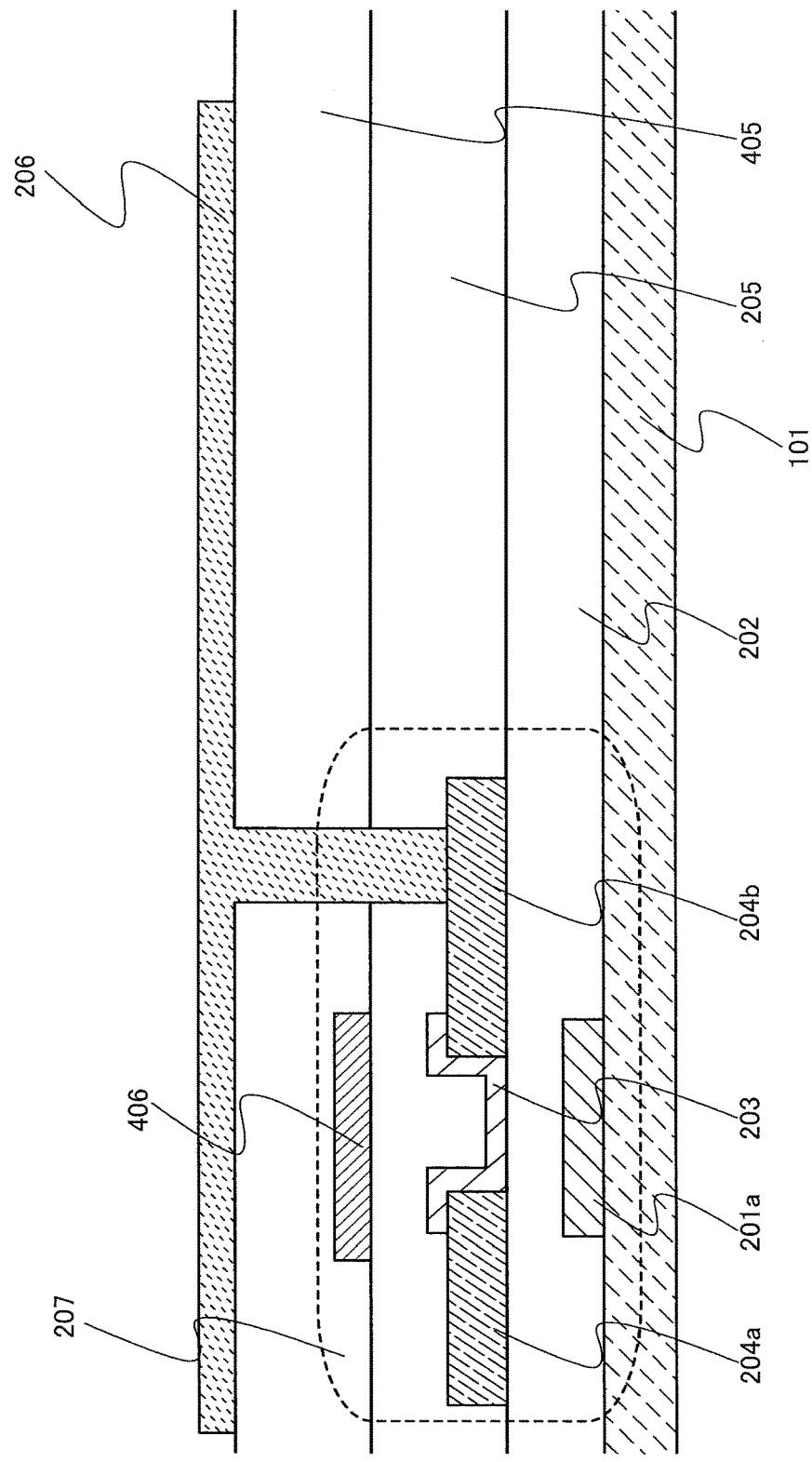
FIG. 9 is a cross-sectional view illustrating an example of a structure of a display device.
Figure 10:
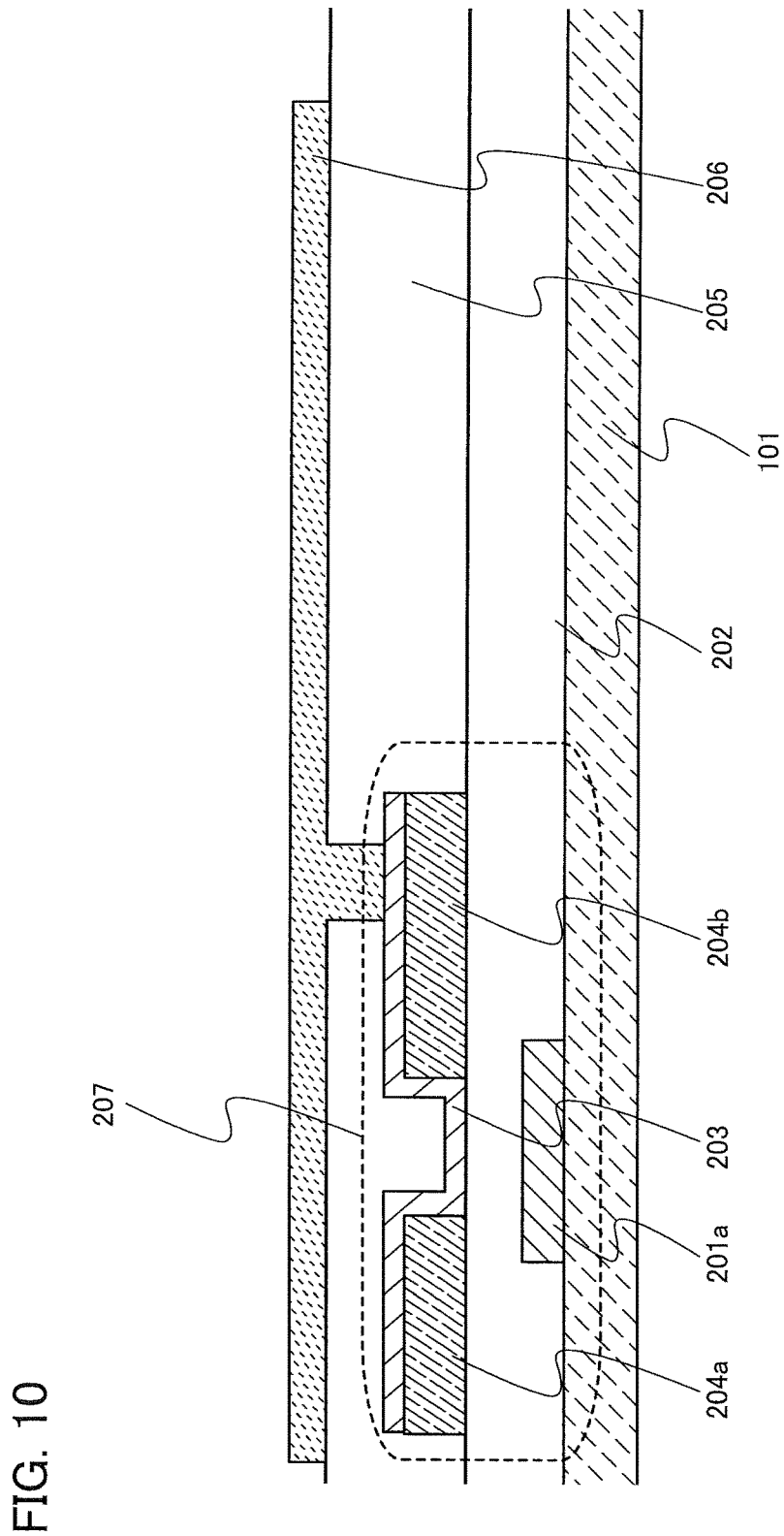
FIG. 10 is a cross-sectional view illustrating an example of a structure of a display device.

FIG. 7 is a cross-sectional view of the transistor 207 in the case where an upper portion of the semiconductor layer 203 and lower portions of the conductive layers 204a and 204b are in contact with each other in the structure in FIG. 2. Similarly, FIG. 8 is a cross-sectional view of the transistor 207 in the case where an upper portion of the semiconductor layer 203 and lower portions of the conductive layers 204a and 204b are in contact with each other in the structure in FIG. 3. Similarly, FIG. 9 is a cross-sectional view of the transistor 207 in the case where an upper portion of the semiconductor layer 203 and lower portions of the conductive layers 204a and 204b are in contact with each other in the structure in FIG. 4. Similarly, FIG. 10 is a cross-sectional view of the transistor 207 in the case where the channel protective film 503 is not provided and an upper portion of the semiconductor layer 203 and lower portions of the conductive layers 204a and 204b are in contact with each other in the structure in FIG. 6. Note that in FIG. 10, it is preferable that a portion of the semiconductor layer 203 which is in contact with the conductive layer 206 become a portion which has a sufficient characteristic of an n-type or a p-type. In other words, the portion where the conductive layer 206 is in contact with the semiconductor layer 203 is preferably ohmic contact.

Figure 11:
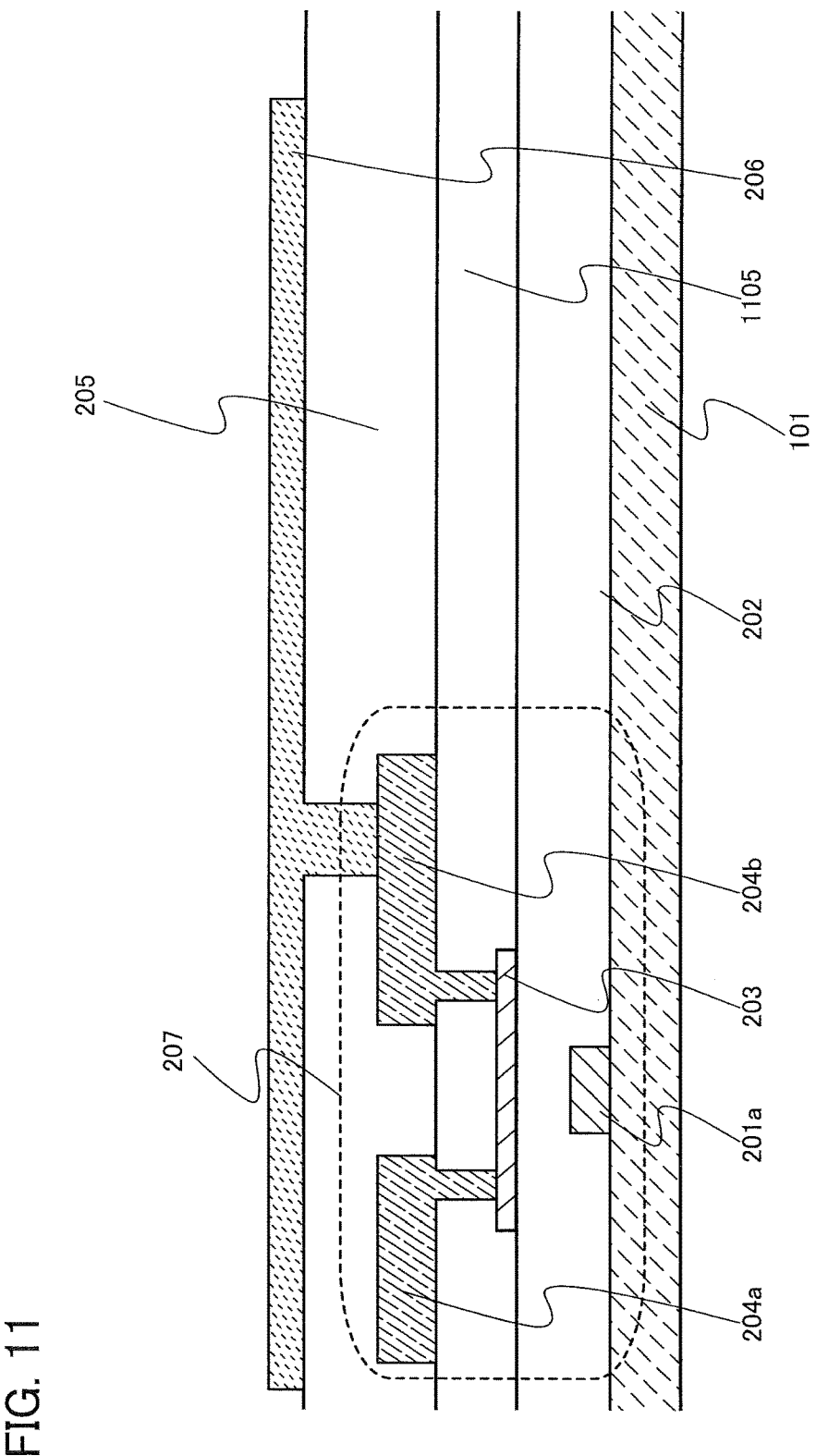
FIG. 11 is a cross-sectional view illustrating an example of a structure of a display device.

Note that FIGS. 2 to 10 each illustrate the example of the structure in which an insulating layer is not provided between the conductive layers 204a and 204b and the semiconductor layer 203. Needless to say, this embodiment is not limited to these examples. An insulating layer can be provided between the conductive layers 204a and 204b and the semiconductor layer 203. As an example, FIG. 11 illustrates the case where an insulating layer 1105 is provided in the structure in FIG. 2. The conductive layers 204a and 204b are connected to the semiconductor layer 203 through a contact hole provided in the insulating layer 1105.

Figure 12:
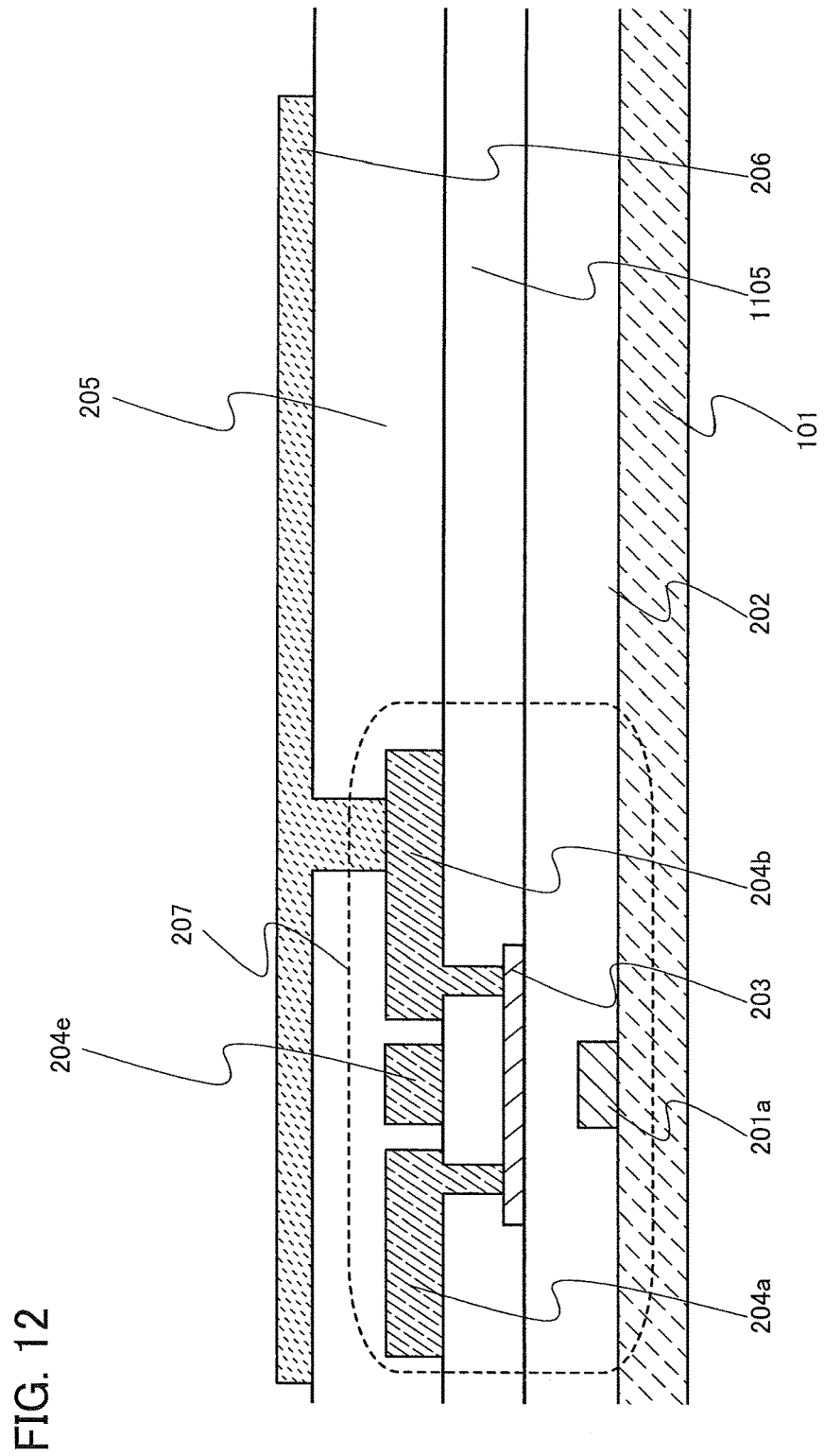
FIG. 12 is a cross-sectional view illustrating an example of a structure of a display device.

In this case, an electrode can be provided on the opposite side to a gate electrode, with respect to a channel portion, by using a conductive layer that is in the same layer as the conductive layers 204a and 204b. FIG. 12 illustrates an example of this case. A conductive layer 204e is provided on the opposite side to a gate electrode, with respect to a channel portion. Since the conductive layer 204e is provided in the same layer as the conductive layer 204a in such a manner, reduction in aperture ratio can be prevented even when a transistor in a pixel portion has such a structure.

Note that the conductive layers 204a, 204b, and 204e can be formed with an etching treatment for films (with a single-layer structure or a layered structure) formed through the same deposition step. In this case, the conductive layers 204a, 204b, and 204e contain approximately the same material.

Note that the transistor 207 as in FIG. 11 or FIG. 12 can be applied to the pixel in FIGS. 3 to 10.

Figure 13:
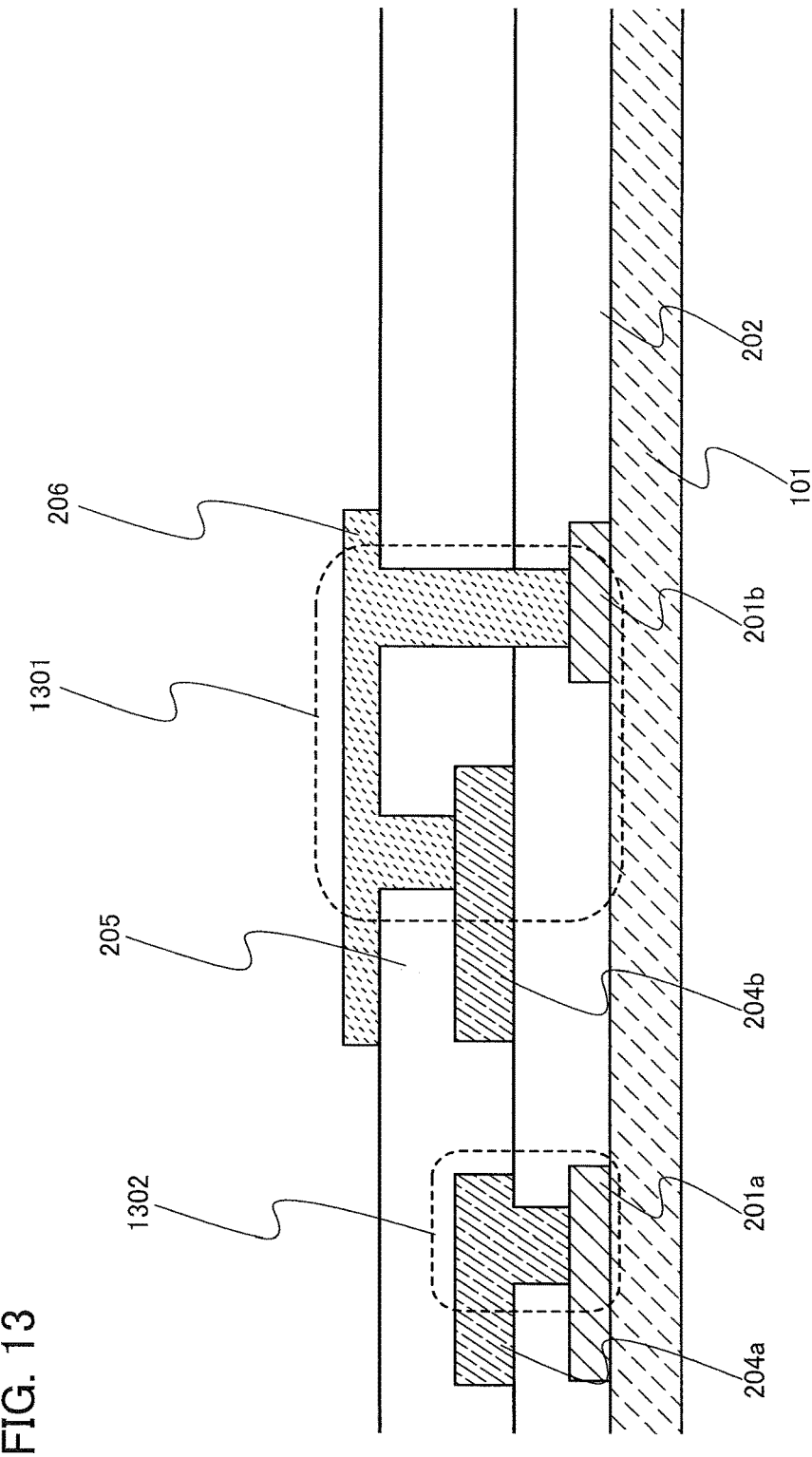
FIG. 13 is a cross-sectional view illustrating an example of a structure of a display device.

In order to connect conductive layers that are placed in different layers with an insulating layer therebetween, it is necessary to form a contact hole in the insulating layer. An example of a contact structure in that case is illustrated in FIG. 13. In a contact structure 1301, contact holes are formed in the insulating layers 205 and 202 in order to electrically connect the conductive layer 201b, the conductive layer 204b, and the conductive layer 206. These contact holes are formed at the same time. In this case, the number of masks (the number of reticles) and the number of process steps can be reduced. In the case where the conductive layers 204b and 201b are to be connected to each other, they need to be connected through the conductive layer 206; thus, it is possible that the contact resistance is increased or the layout area is increased. On the other hand, as in a contact structure 1302, it is possible to form a contact hole in the insulating layer 202 so that the conductive layers 201a and 204a are directly connected to each other. In this case, it is possible to decrease the possibility that the contact resistance is increased or the layout area is increased.

Figure 14:
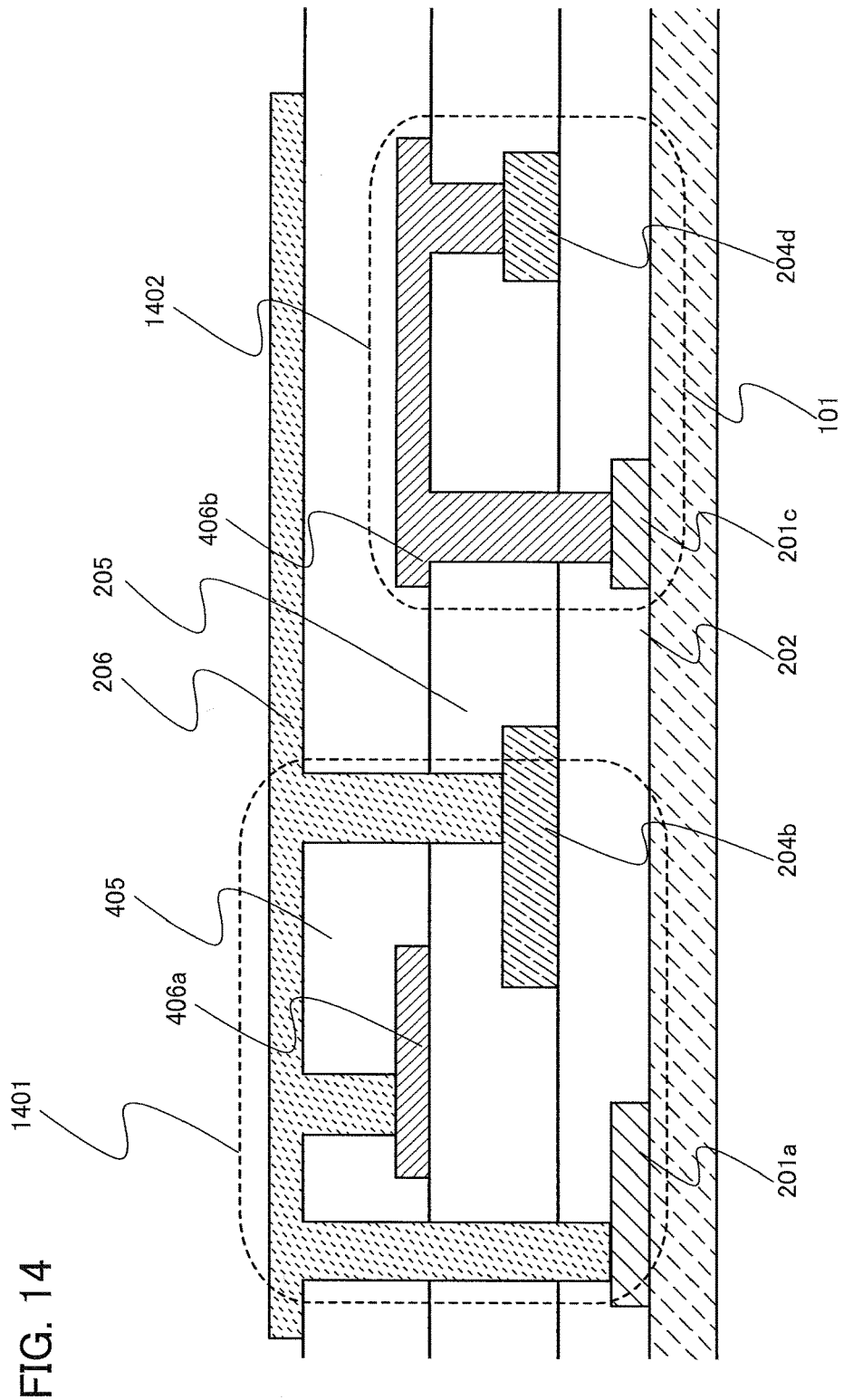
FIG. 14 is a cross-sectional view illustrating an example of a structure of a display device.

FIG. 14 illustrates an example of a contact structure in the case where the conductive layers 406a and 406b are provided. In a contact structure 1401, contact holes are formed in the insulating layers 405, 205, and 202 at the same time, and the conductive layers 201a, 204b, 406a, and 206 are connected to each other. In this case, the number of masks (the number of reticles) and the number of process steps can be reduced. In the case where the conductive layer 406a is to be connected to the conductive layers 204b and 201a, they need to be connected through the conductive layer 206; thus, it is possible that the contact resistance is increased or the layout area is increased. On the other hand, as in a contact structure 1402, it is possible to form contact holes in the insulating layers 202 and 205 so that the conductive layers 406b, 204d and 201c are directly connected to each other. In this case, it is possible to decrease the possibility that the contact resistance is increased or the layout area is increased.

Note that FIGS. 2 to 12 each illustrate the example of a bottom-gate transistor; however, this embodiment is not limited to a bottom-gate transistor. A display device can include a top-gate transistor. Similarly, without limitation to an inverted staggered transistor, a display device can include a planar transistor.

The semiconductor layer 203 illustrated in FIGS. 2 to 12 can be formed using a semiconductor film with a single-layer structure or a layered structure. The film for the semiconductor layer can be formed using a light-transmitting material such as indium tin oxide (ITO), indium tin oxide containing silicon oxide (ITSO), organoindium, organotin, or zinc oxide (ZnO). Further, the film may be formed using indium zinc oxide (IZO) containing zinc oxide, a material in which zinc oxide is doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like. The film formed using such a material can be formed by a sputtering method.

The conductive layers illustrated in FIGS. 1 to 14, for example, the conductive layers 201a, 201b, 204a to 204e, 206, 206a, 406a, and 406b can be formed using a conductive film with a single-layer structure or a layered structure. The film for forming these conductive layers can be formed using a light-transmitting material such as indium tin oxide (ITO), indium tin oxide containing silicon oxide (ITSO), organoindium, organotin, or zinc oxide (ZnO). Moreover, the film may be formed using indium zinc oxide (IZO) containing zinc oxide, a material in which zinc oxide is doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like. The film formed using such a material can be formed by a sputtering method. Note that when the conductive layer illustrated in FIGS. 1 to 14 is formed using a conductive film with a layered structure, it is preferable that the light transmittance of the layered structure be sufficiently high.

Note that part or all of the wirings such as a source signal line, a gate signal line, a capacitor wiring, and a power supply line can be formed using a material with high conductivity. That is, the wiring can be formed using a material without light-transmitting properties. For example, the wiring can be a stack of a layer with light-transmitting properties and a layer without light-transmitting properties. The wiring in such a case can be formed, for example, with a single-layer structure or a layered structure using a metal material such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), niobium (Nb), cerium, (Ce), or chromium (Cr); an alloy material containing any of the above metal materials as its main component; or nitride containing any of the above metal materials as its component.

In the case where ITO is used for one of conductive layers and aluminum is used for another conductive layer, a chemical reaction might occur when the conductive layers are connected to each other. For that reason, a high melting point material is preferably used between the conductive layers in order to prevent a chemical reaction. Examples of the high melting point material are molybdenum, titanium, tungsten, tantalum, and chromium. Moreover, the conductive layer preferably has a multi-layer structure in which a material with high conductivity is used over a film formed using the high melting point material. Examples of the material with high conductivity are aluminum, copper, and silver. For example, in the case where the conductive layer is formed with a layered structure, the conductive layer can be formed using a stack in which the first layer is molybdenum, the second layer is aluminum, and the third layer is molybdenum; or a stack in which the first layer is molybdenum, the second layer is aluminum containing a small amount of neodymium, and the third layer is molybdenum. With such a structure, the formation of hillocks can be prevented.

The insulating layers illustrated in FIGS. 1 to 14, for example, the insulating layers 105, 202, 205, 405, and 1105 can be formed with a single-layer structure or a layered structure of a silicon oxide film, a silicon oxynitride film, a silicon nitride film, a silicon nitride oxide film, an aluminum oxide film, an aluminum nitride film, an aluminum oxynitride film, an aluminum nitride oxide film, or a tantalum oxide film. Each of the insulating layers can be formed to a thickness of 50 nm to 250 nm by a sputtering method or the like. For example, as the insulating layer, a 100-nm-thick silicon oxide film can be formed by a sputtering method or a CVD method, or a 100-nm-thick aluminum oxide film can be formed by a sputtering method. Moreover, the insulating layer can be formed with a single-layer structure or a layered structure of an insulating film containing oxygen and/or nitrogen, such as silicon oxide, silicon nitride, silicon oxynitride, or silicon nitride oxide; a film containing carbon such as DLC (diamond-like carbon); and a film formed using an organic material such as epoxy, polyimide, polyamide, polyvinyl phenol, benzocyclobutene, or acrylic or a siloxane material such as a siloxane resin.

Further, each of the insulating layers illustrated in FIGS. 1 to 14 can have a function of a color filter and/or a black matrix. When a color filter is provided on the substrate 101 side, it is not necessary to provide a color filter on the counter substrate side. Therefore, a margin for adjusting the positions of two substrates is not necessary, which can facilitate manufacture of a panel.

An oxide semiconductor containing In, M, or Zn, for example, can be used for the semiconductor layer illustrated in any of FIGS. 2 to 14, for example, the semiconductor layer 203. Here, M represents one or a plurality of metal elements selected from Ga, Fe, Ni, Mn, Co, and the like. In addition, when Ga is employed as M, a semiconductor film formed using this material is referred to as an In—Ga—Zn—O-based non-single-crystal film. Further, the above oxide semiconductor may contain Fe or Ni, another transitional metal element, or an oxide of the transitional metal as an impurity element in addition to the metal element contained as M. The semiconductor layer 203 may contain an insulating impurity. As the impurity, insulating oxide typified by silicon oxide, germanium oxide, aluminum oxide, or the like; insulating nitride typified by silicon nitride, aluminum nitride, or the like; or insulating oxynitride such as silicon oxynitride or aluminum oxynitride is used. Such an insulating oxide or insulating nitride is added to the oxide semiconductor at a concentration at which electrical conductivity of the oxide semiconductor does not deteriorate. When the insulating impurity is contained in the oxide semiconductor, crystallization of the oxide semiconductor can be suppressed. By suppressing the crystallization of the oxide semiconductor, characteristics of a thin film transistor can be stabilized.

When an In—Ga—Zn—O-based oxide semiconductor is made to contain an impurity such as silicon oxide, crystallization of the oxide semiconductor or generation of microcrystal grains can be prevented even by heat treatment at 300° C. to 600° C. In a manufacturing process of a thin film transistor in which an In—Ga—Zn—O-based oxide semiconductor layer serves as a channel formation region, the S value (a subthreshold swing value) or field effect mobility can be improved by heat treatment. Even in such a case, the thin film transistor can be prevented from being normally-on. Further, even when heat stress or bias stress is added to the thin film transistor, variations in threshold voltage can be prevented.

As the oxide semiconductor applied to the channel formation region of the thin film transistor, any of the following oxide semiconductors can be used in addition to the above: an In—Sn—Zn—O-based oxide semiconductor, an In—Al—Zn—O-based oxide semiconductor, an Sn—Ga—Zn—O-based oxide semiconductor, an Al—Ga—Zn—O-based oxide semiconductor, an Sn—Al—Zn—O-based oxide semiconductor, an In—Zn—O-based oxide semiconductor, an Sn—Zn—O-based oxide semiconductor, an Al—Zn—O-based oxide semiconductor, an In—O-based oxide semiconductor, an Sn—O-based oxide semiconductor, and a Zn—O-based oxide semiconductor. In other words, by addition of an impurity that suppresses crystallization to keep an amorphous state to such an oxide semiconductor, characteristics of the thin film transistor can be stabilized. Examples of the impurity are insulating oxide such as silicon oxide, germanium oxide, or aluminum oxide; insulating nitride such as silicon nitride or aluminum nitride; and insulating oxynitride such as silicon oxynitride or aluminum oxynitride.

For example, a semiconductor film can be formed by a sputtering method using an oxide semiconductor target including In, Ga, and Zn ($In_2O_3:Ga_2O_3:ZnO=1:1:1$). The following conditions may be employed for the sputtering, for example: the distance between the substrate 101 and the target is 30 mm to 500 mm; the pressure is 0.1 Pa to 2.0 Pa; the direct current (DC) power supply output is 0.25 kW to 5.0 kW (when the target of 8 inches in diameter is used); and the atmosphere is an argon atmosphere, an oxygen atmosphere, or a mixed atmosphere of argon and oxygen. The semiconductor film may have a thickness of approximately 5 nm to 200 nm.

As the sputtering method, an RF sputtering method using a high frequency power supply as a power supply for sputtering, a DC sputtering method, a pulsed DC sputtering method in which a DC bias is applied in pulses, or the like can be employed. An RF sputtering method is mainly used for forming an insulating film, and a DC sputtering method is mainly used for forming a metal film.

A multi-target sputtering apparatus in which a plurality of targets that are formed of different materials from each other may be used. In a multi-target sputtering apparatus, a stack of different films can be formed in one chamber, or one film can be formed by sputtering using plural kinds of materials at the same time in one chamber. Moreover, a method using a magnetron sputtering apparatus in which a magnetic field generating system is provided inside the chamber (a magnetron sputtering method), an ECR sputtering method in which plasma generated using a micro wave is used, or the like may be employed. Alternatively, a reactive sputtering method in which a target substance and a sputtering gas component chemically react with each other to form a compound thereof at the time of film formation, a bias sputtering method in which voltage is applied also to the substrate at the time of film formation, or the like may be employed.

Note that a semiconductor material used for a channel layer of the transistor 207 is not limited to an oxide semiconductor. For example, a silicon layer (an amorphous silicon layer, a microcrystalline silicon layer, a polycrystalline silicon layer, or a single crystal silicon layer) may be used as the channel layer of the transistor 207. Other than the above, a light-transmitting organic semiconductor material, a carbon nanotube, or a compound semiconductor such as gallium arsenide or indium phosphide may be used for the channel layer of the transistor 207.

Note that after formation of the semiconductor layer 203, it is preferable to perform heat treatment at 100° C. to 600° C., typically 200° C. to 400° C. in a nitrogen atmosphere or an air atmosphere. For example, heat treatment can be performed at 350° C. for one hour in a nitrogen atmosphere. Through the heat treatment, rearrangement at the atomic level is performed in the island-shaped semiconductor layer 203. This heat treatment (including light annealing and the like) is important in terms of releasing distortion that interrupts carrier movement in the island-shape semiconductor layer 203. Note that there is no particular limitation on the timing of the heat treatment as long as it is performed after the semiconductor layer 203 is formed.

A semiconductor device or a display device can be manufactured using the above-described materials, for example.

Embodiment 3

In this embodiment, a display device will be described. The display device according to this embodiment includes a first circuit that has a function of controlling input of an image signal, a second circuit that has a function of holding an image signal, a third circuit that has a function of controlling the polarity of voltage supplied to a display element such as a liquid crystal element, and a display element. The display device according to this embodiment has a memory function for storing data in a pixel.

Figure 15:
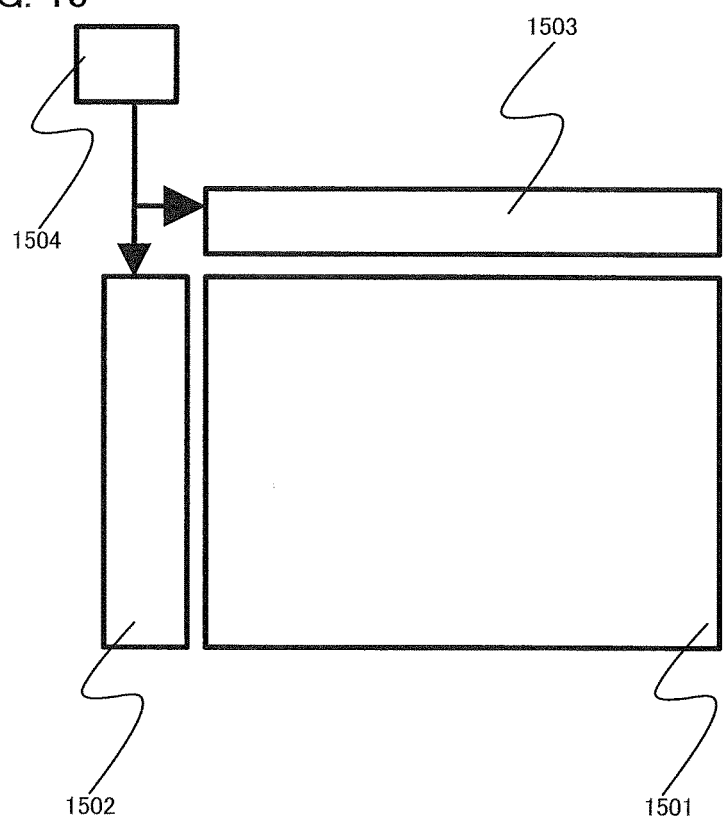
FIG. 15 is a block diagram illustrating an example of a structure of a display device.

FIG. 15 is a circuit diagram (a block diagram) of the entire display device (also referred to as semiconductor device). A plurality of pixels are arranged in a matrix in a pixel portion 1501. A circuit 1502 and a circuit 1503 that are used for driving or controlling the pixel portion 1501 are provided near the pixel portion 1501. Moreover, the display device includes a circuit 1504 that supplies signals to the circuits 1502 and 1503.

The circuit 1502 can have a function of controlling a potential of a gate of a transistor placed in the pixel portion 1501. For that reason, the circuit 1502 can have a function of a circuit called a gate line driver circuit, a gate driver, or a scan driver. The circuit 1503 can have a function of controlling a potential of a source or a drain of the transistor placed in the pixel portion 1501 or a function of supplying an image signal to the pixel portion 1501. For that reason, the circuit 1503 can have a function of a circuit called a source line driver circuit, a source driver, or a data driver. The circuit 1503 can also be formed using only analog switches. A variety of signals such as a clock signal, a start pulse signal, a latch signal, an image signal, and an inversion signal of counter voltage are input to the circuits 1502 and 1503. For that reason, the circuit 1504 can have a function of a so-called controller, pulse generator, or the like.

Figure 16:
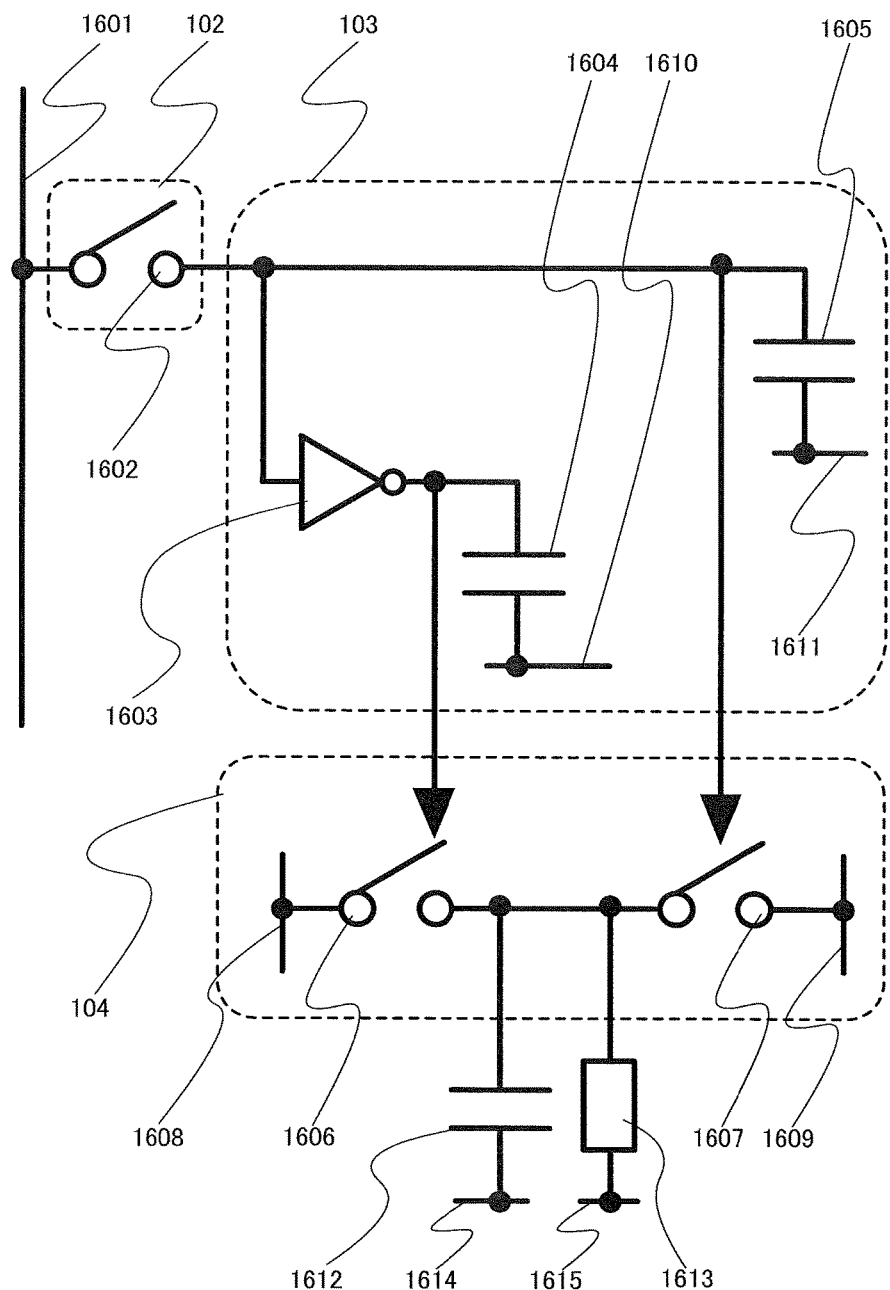
FIG. 16 is a circuit diagram illustrating an example of a structure of a display device.

Next, FIG. 16 illustrates an example of a pixel placed in the pixel portion 1501. FIG. 16 is a circuit diagram of one pixel. The pixel includes the circuit 102, the circuit 103, the circuit 104, a capacitor 1612, and a display element 1613 having a pixel electrode. Note that one example of this embodiment of the present invention is not limited to this structure.

The circuit 102 includes a switch 1602. The circuit 103 includes an inverter 1603 and capacitors 1604 and 1605. The circuit 104 includes switches 1606 and 1607. The inverter 1603 may have a function of inverting a signal or a function of setting the output in a high impedance state (a floating state).

The switch 1602 is connected to a wiring 1601. The capacitor 1605 is connected between a wiring 1611 and the switch 1602. The capacitor 1604 is connected between a wiring 1610 and an output terminal of the inverter 1603. An input terminal of the inverter 1603 is connected to the switch 1602. The output terminal of the inverter 1603 is connected to the capacitor 1604. A wiring 1608 and a wiring 1609 are connected to each other through the switches 1606 and 1607. On and off (conduction and non-conduction) of the switch 1606 are controlled with an output signal of the inverter 1603 or a signal held in the capacitor 1604. On and off (conduction and non-conduction) of the switch 1607 are controlled with an input signal of the inverter 1603 or a signal held in the capacitor 1605. The display element 1613 is connected between a wiring 1615 and a node of the switch 1606 and the switch 1607. The capacitor 1612 is connected between a wiring 1614 and the node of the switch 1607 and the switch 1606 or between the wiring 1614 and the pixel electrode of the display element 1613.

In the example of the structure in FIG. 16, the capacitor 1612 can be omitted. Alternatively, the capacitor 1604 can be omitted.

When the circuit diagram in FIG. 16 is associated with the cross-sectional view in FIG. 1, the conductive layer 109 can correspond to a counter electrode or a common electrode, for example. Moreover, the conductive layer 109 can correspond to the wiring 1615. It can be said that the display element 1613 includes the medium 107. The conductive layer 106 has a function of a pixel electrode and can correspond to the pixel electrode of the display element 1613.

Note that the wiring 1610 and the wiring 1611 can be connected to each other to be formed as one wiring. Moreover, when the wiring 1610 and/or the wiring 1611 is/are connected to the wirings 1608, 1609, and 1614, they can be formed as one wiring. When the wiring 1614 is connected to the wiring 1608, the wiring 1609, the wiring 1610, or the wiring 1611, they can be formed as one wiring.

The switch 1602 can have a function of controlling whether a signal supplied to the wiring 1601 is input to a pixel (or the capacitors 1604 and 1605 and the inverter 1603). For that reason, the switch 1602 can have a switching function or a selection function.

The wiring 1601 is electrically connected to the circuit 1503 illustrated in FIG. 15. Thus, an image signal can be supplied from the circuit 1503 to the wiring 1601. For that reason, the wiring 1601 can be referred to as a source line, a source signal line, a data line, a data signal line, or the like.

When the wiring 1601 is formed using a light-transmitting material, the aperture ratio can be increased. However, this embodiment is not limited to using a light-transmitting material. For example, when the wiring 1601 is formed using a material that does not have light-transmitting properties and has high conductivity, signal delay can be reduced. Moreover, the wiring 1601 can be formed using a stack including a layer of a material with high conductivity and a layer of a light-transmitting material.

A signal input to a pixel through the switch 1602 is held in the capacitor 1605. The capacitor 1605 has a function of holding the signal. For that reason, the capacitor 1605 can be referred to as a memory. Furthermore, it can be said that the capacitor 1605 is a DRAM because the signal held in the capacitor 1605 might attenuate over time.

The inverter 1603 has a function of inverting a signal held in the capacitor 1605 or a signal supplied from the wiring 1601 through the switch 1602 and outputting the resulting signal. Then, the signal output from the inverter 1603 is held in the capacitor 1604. It can be said that the capacitor 1604 is a DRAM because the signal held in the capacitor 1604 might attenuate over time.

Since the inverter 1603 is provided, the signal held in the capacitor 1605 and the signal held in the capacitor 1604 are usually inverse to each other. Thus, when one of the signals is an H signal (a high-level signal), the other of the signals is often an L signal (a low-level signal), except in the case where the inverter 1603 does not output a signal, for example, the case where the output of the inverter 1603 is in a high impedance state.

The switch 1606 has a function of controlling whether a potential of the wiring 1608 is supplied to the capacitor 1612 or the display element 1613. Similarly, the switch 1607 has a function of controlling whether a potential of the wiring 1609 is supplied to the capacitor 1612 or the display element 1613.

Since the signal held in the capacitor 1605 and the signal held in the capacitor 1604 are usually inverse to each other as described above, one of the switches 1606 and 1607 is on (in a conduction state) and the other is off (in a non-conduction state) in many cases. Therefore, in that case, either the potential of the wiring 1609 or the potential of the wiring 1608 is supplied to the display element 1613. At this time, when the potential of the wiring 1609 and the potential of the wiring 1608 are different from each other, potentials supplied to the display element 1613 vary; thus, the display element 1613 can be controlled to be in different states (e.g., states where the display element 1613 transmits light and does not transmits light, states where the display element 1613 emits light and does not emit light, states where the display element 1613 is dark and bright, or states where the display element 1613 scatters light and transmits light). For that reason, the display state can be changed, so that gradation can be expressed to display images.

Figure 17A:
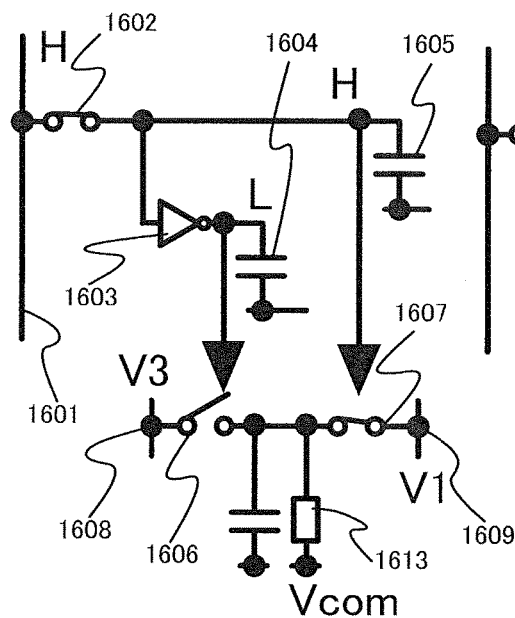
FIGS. 17A to 17C are circuit diagrams illustrating an example of operation of the display device in FIG. 16.

Next, an example of operation of the circuit illustrated in FIG. 16 will be described. First, as illustrated in FIG. 17A, an H signal is supplied from the wiring 1601. When the switch 1602 is on, an H signal is input to the capacitor 1605. An L signal is input to the capacitor 1604 through the inverter 1603.

Figure 17B:
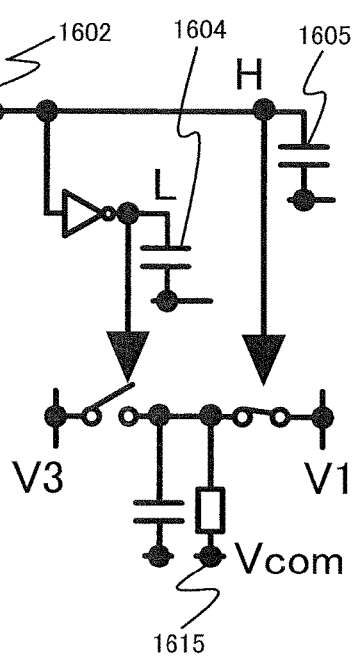

Next, as illustrated in FIG. 17B, the switch 1602 is turned off. Then, the signals stored in the capacitors 1604 and 1605 are maintained. The L signal is stored in the capacitor 1604, and the H signal is stored in the capacitor 1605. Therefore, assuming that a switch is turned on when an H signal is supplied to a control terminal of the switch and the switch is turned off when an L signal is supplied to the control terminal, the switch 1606 is turned off and the switch 1607 is turned on. Thus, a potential V1 of the wiring 1609 is supplied to the pixel electrode of the display element 1613. Assuming that a potential Vcom is applied to the wiring 1615, a voltage of the difference between V1 and Vcom is applied to the display element 1613. At this time, when the potential V1 is larger than the potential Vcom, a positive voltage is applied to the display element 1613. If the display element 1613 is normally black (i.e., if the display element 1613 is brought into a black state when voltage is not applied), the display element 1613 expresses white. In contrast, if the display element 1613 is normally white (i.e., if the display element 1613 is brought into a white state when voltage is not applied), the display element 1613 expresses black.

Figure 17C:
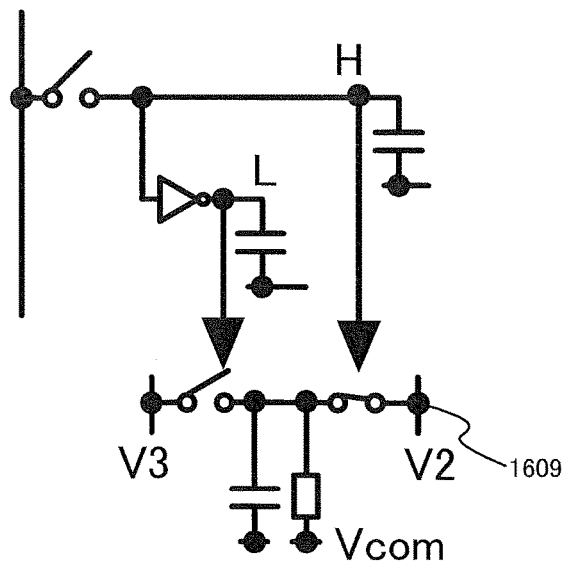

When the display element 1613 needs to be driven by alternating current, for example, when the display element 1613 is a liquid crystal element, it is necessary to apply negative voltage to the display element 1613. In that case, the potential of the wiring 1609 is changed from V1 to V2 as illustrated in FIG. 17C. At this time, the potential V2 is lower than the potential Vcom. As an example, (V1−Vcom) and (Vcom−V2) are approximately the same. Thus, negative voltage is applied to the display element 1613. After that, the state in FIG. 17B and the state in FIG. 17C are alternately repeated every predetermined cycle, whereby the display element 1613 can be driven by alternating current.

At this time, since the signals are held in the capacitors 1604 and 1605, a signal does not need to be input from the wiring 1601 again and the display element 1613 can be driven by alternating current by alternately repeating the state in FIG. 17B and the state in FIG. 17C. Thus, power consumption can be reduced. Then, when the signals in the capacitors 1604 and 1605 need to be refreshed, the operation returns to FIG. 17A and a signal is input again from the wiring 1601.

Figure 18A:
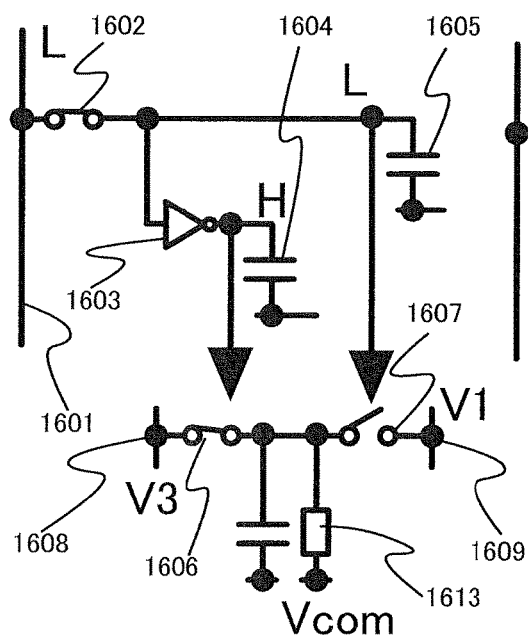
FIGS. 18A to 18C are circuit diagrams illustrating an example of operation of the display device in FIG. 16.
Figure 18B:
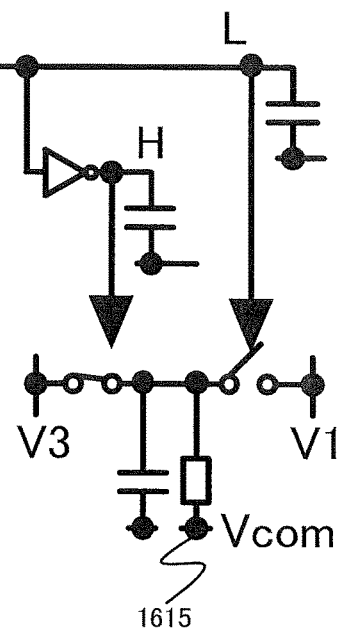
Figure 18C:
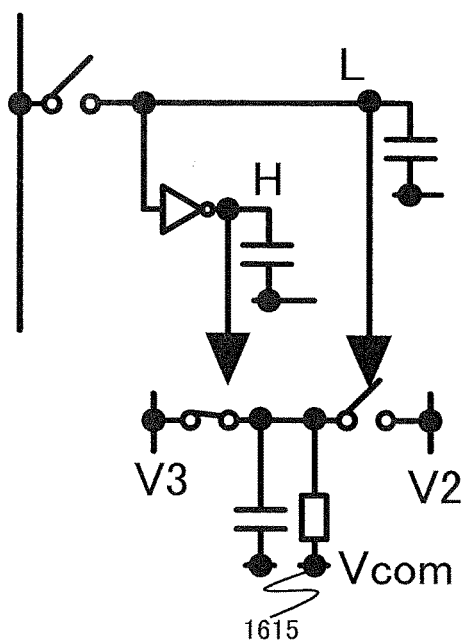

FIGS. 17A to 17C illustrate the operation in the case where an H signal is input from the wiring 1601; the circuit similarly operates in the case where an L signal is input. FIGS. 18A to 18C illustrate an example in this case.

First, as illustrated in FIG. 18A, an L signal is supplied from the wiring 1601. When the switch 1602 is on, an L signal is input to the capacitor 1605. An H signal is input to the capacitor 1604 through the inverter 1603.

Next, as illustrated in FIG. 18B, the switch 1602 is turned off. Then, the signals stored in the capacitors 1604 and 1605 are maintained. The H signal is stored in the capacitor 1604, and the L signal is stored in the capacitor 1605. Therefore, the switch 1606 is turned on and the switch 1607 is turned off. Thus, a potential V3 of the wiring 1608 is supplied to the pixel electrode of the display element 1613. Assuming that the potential Vcom is applied to the wiring 1615, a voltage of the difference between V3 and Vcom is applied to the display element 1613. At this time, when the potential V3 and the potential Vcom are approximately the same, almost no voltage is applied to the display element 1613. If the display element 1613 is normally black (i.e., if the display element 1613 is brought into a black state when voltage is not applied), the display element 1613 expresses black. In contrast, if the display element 1613 is normally white (i.e., if the display element 1613 is brought into a white state when voltage is not applied), the display element 1613 expresses white.

When the display element 1613 needs to be driven by alternating current, for example, when the display element 1613 is a liquid crystal element, the potential of the wiring 1609 is changed from V1 to V2 as illustrated in FIG. 18C. However, the potential of the wiring 1608 is not changed. Thus, even when the potential of the wiring 1609 is changed, almost no voltage is applied to the display element 1613. After that, the state in FIG. 18B and the state in FIG. 18C are alternately repeated every predetermined cycle. Then, when the signals in the capacitors 1604 and 1605 need to be refreshed, the operation returns to FIG. 18A and a signal is input again from the wiring 1601.

As described above, in both the case where an H signal is input from the wiring 1601 and the case where an L signal is input from the wiring 1601, display can be performed with alternating driving or inversion driving.

Note that in the driving methods illustrated in FIGS. 17A to 17C and FIGS. 18A to 18C, the potential of the wiring 1615 is not changed when the polarity of the display element 1613 is inverted, that is, when alternating-current driving is performed. In contrast, by changing the potential of the wiring 1615, the amplitude of the potential of the wiring 1609 (the difference between V1 and V2) can be made smaller. This means that the potential of the wiring 1615, that is, a potential of the counter electrode or the common electrode is changed, and such driving is called common inversion driving.

Then, an operation method with common inversion driving is illustrated in FIGS. 19A to 19C and FIGS. 20A to 20C.

Figure 19A:
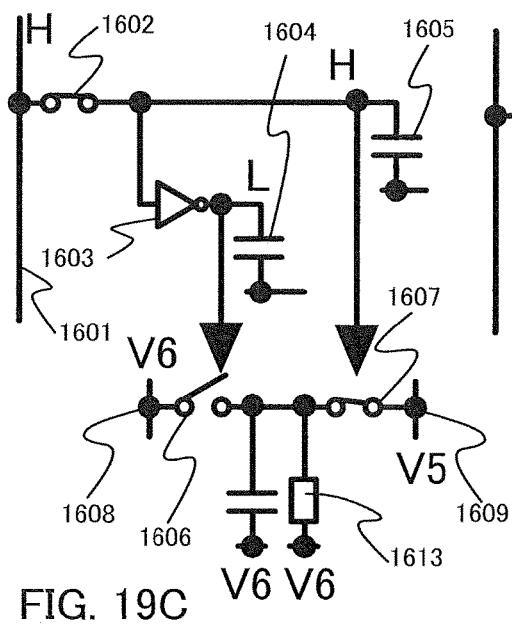
FIGS. 19A to 19C are circuit diagrams illustrating an example of operation of the display device in FIG. 16.

First, as illustrated in FIG. 19A, an H signal is supplied from the wiring 1601. When the switch 1602 is on, an H signal is input to the capacitor 1605. An L signal is input to the capacitor 1604 through the inverter 1603.

Figure 19B:
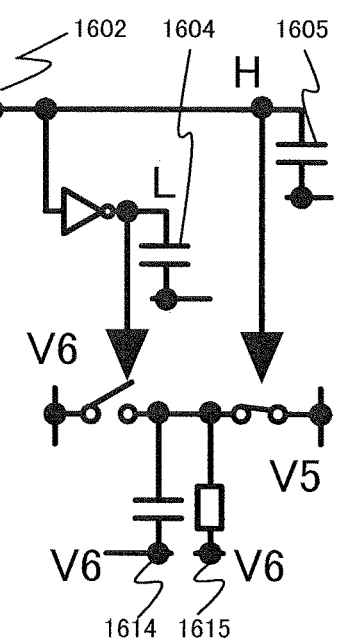

Next, as illustrated in FIG. 19B, the switch 1602 is turned off. Then, the signals stored in the capacitors 1604 and 1605 are maintained. The L signal is stored in the capacitor 1604, and the H signal is stored in the capacitor 1605. Therefore, the switch 1606 is turned off and the switch 1607 is turned on. Thus, a potential V5 of the wiring 1609 is supplied to the pixel electrode of the display element 1613. Assuming that a potential V6 is applied to the wiring 1615, a voltage of the difference between V5 and V6 is applied to the display element 1613. At this time, when the potential V5 is larger than the potential V6, a positive voltage is applied to the display element 1613. If the display element 1613 is normally black (i.e., if the display element 1613 is brought into a black state when voltage is not applied), the display element 1613 expresses white. In contrast, if the display element 1613 is normally white (i.e., if the display element 1613 is brought into a white state when voltage is not applied), the display element 1613 expresses black.

Note that at this time, a potential supplied to the wiring 1614 is not limited to a specific value. The potential of the wiring 1614 is preferably changed with the same amplitude as the potential supplied to the wiring 1615. For that reason, the potential supplied to the wiring 1614 is preferably the same as that supplied to the wiring 1615, for example. However, this embodiment is not limited thereto.

Figure 19C:
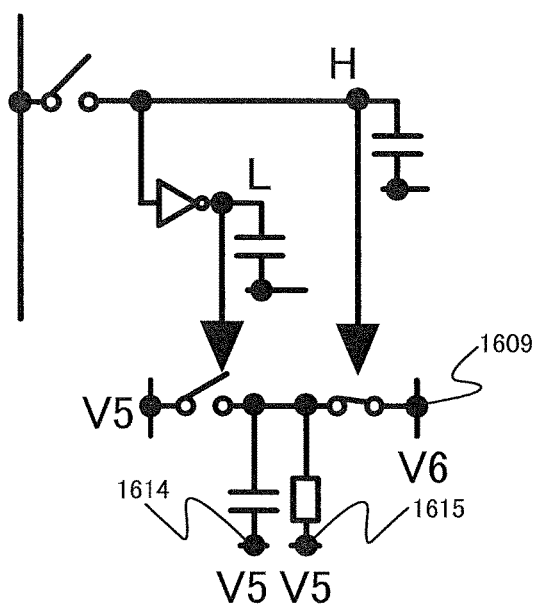

When the display element 1613 needs to be driven by alternating current, for example, when the display element 1613 is a liquid crystal element, it is necessary to apply negative voltage to the display element 1613. In that case, the potential of the wiring 1609 is changed from V5 to V6 as illustrated in FIG. 19C. Moreover, the potentials of the wirings 1608, 1614 and 1615 are changed from V6 to V5. At this time, the potential V6 is lower than the potential V5. Thus, negative voltage is applied to the display element 1613. After that, the state in FIG. 19B and the state in FIG. 19C are alternately repeated every predetermined cycle, whereby the display element 1613 can be driven by alternating current. Then, when the signals in the capacitors 1604 and 1605 need to be refreshed or the signals need to be rewritten, the operation returns to FIG. 19A and a signal is input again from the wiring 1601.

At this time, the potential of the wiring 1615 is also changed, so that the amount of change (amplitude) of the potential of the wiring 1609 can be reduced. Thus, power consumption can be reduced.

Figure 20A:
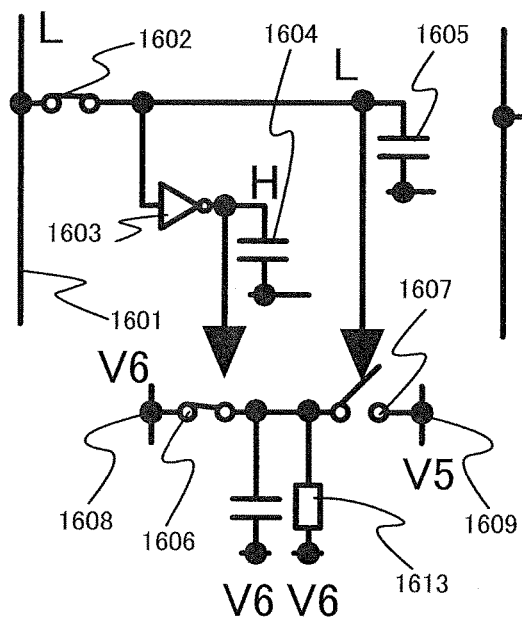
FIGS. 20A to 20C are circuit diagrams illustrating an example of operation of the display device in FIG. 16.
Figure 20B:
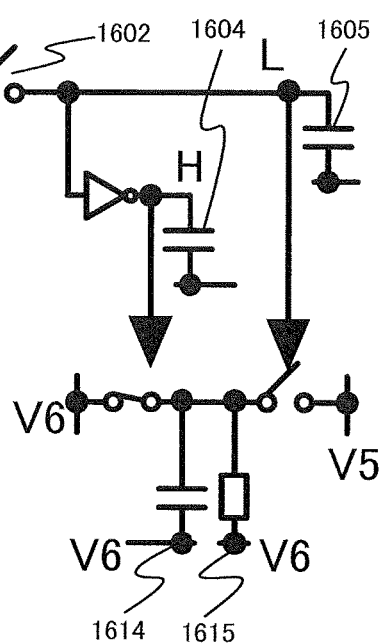
Figure 20C:
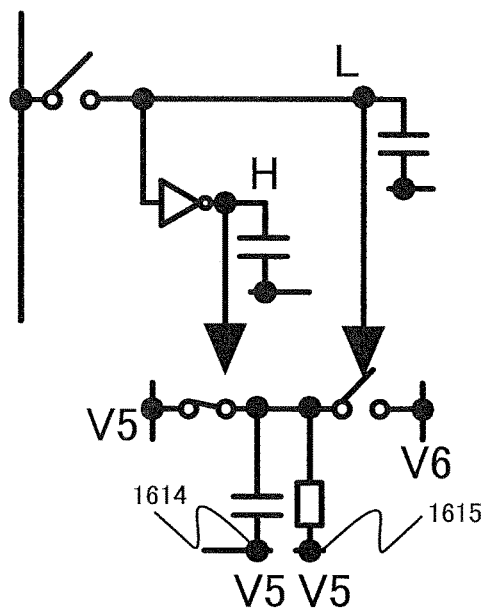

FIGS. 19A to 19C illustrate the operation in the case where an H signal is input from the wiring 1601; the circuit similarly operates in the case where an L signal is input. FIGS. 20A to 20C illustrate an example in this case.

First, as illustrated in FIG. 20A, an L signal is supplied from the wiring 1601. When the switch 1602 is on, an L signal is input to the capacitor 1605. An H signal is input to the capacitor 1604 through the inverter 1603.

Next, as illustrated in FIG. 20B, the switch 1602 is turned off. Then, the signals stored in the capacitors 1604 and 1605 are maintained. The H signal is stored in the capacitor 1604, and the L signal is stored in the capacitor 1605. Therefore, the switch 1606 is turned on and the switch 1607 is turned off. Thus, the potential V6 of the wiring 1608 is supplied to the pixel electrode of the display element 1613. Assuming that the potential V6 is applied to the wiring 1615, almost no voltage is applied to the display element 1613. If the display element 1613 is normally black (i.e., if the display element 1613 is brought into a black state when voltage is not applied), the display element 1613 expresses black. In contrast, if the display element 1613 is normally white (i.e., if the display element 1613 is brought into a white state when voltage is not applied), the display element 1613 expresses white.

When the display element 1613 needs to be driven by alternating current, for example, when the display element 1613 is a liquid crystal element, the potential of the wiring 1609 is changed from V5 to V6 as illustrated in FIG. 20C. Moreover, the potentials of the wirings 1608, 1614 and 1615 are changed from V6 to V5. Thus, even when the potential of the wiring 1614 is changed, almost no voltage is applied to the display element 1613. After that, the state in FIG. 20B and the state in FIG. 20C are alternately repeated every predetermined cycle. Then, when the signals in the capacitors 1604 and 1605 need to be refreshed or the signals need to be rewritten, the operation returns to FIG. 20A and a signal is input again from the wiring 1601.

As described above, in both the case where an H signal is input from the wiring 1601 and the case where an L signal is input from the wiring 1601, display can be performed with alternating driving or inversion driving. Moreover, the amplitude of an image signal can be decreased. Furthermore, inversion driving can be performed without inputting an image signal again, resulting in reduction in power consumption.

Embodiment 4

In this embodiment, a circuit included in a display device (a semiconductor device) will be described with reference to drawings.

Figure 21A:
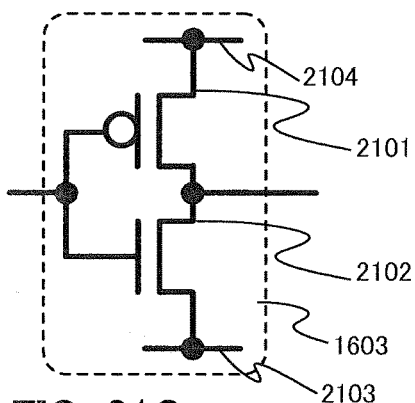
FIGS. 21A to 21E are circuit diagrams illustrating an example of a structure of a display device.

FIGS. 21A to 21E illustrate specific examples of the inverter 1603 illustrated in FIG. 16 and the like. FIG. 21A illustrates an example of the case where the inverter 1603 has a CMOS structure. A p-channel transistor 2101 and an n-channel transistor 2102 are connected in series between a wiring 2104 and a wiring 2103. This CMOS structure has functions such that a low voltage is supplied to the wiring 2103 and a high voltage is supplied to the wiring 2104. With such a CMOS structure, the direct tunneling current can be reduced, resulting in reduction in power consumption.

Note that a voltage that does not change over time can be supplied to the wiring 2103 or the wiring 2104; however, this embodiment is not limited thereto and a pulsed signal can be supplied.

Note that it is possible to form a p-channel transistor by using not only polycrystalline silicon but also an oxide semiconductor for a semiconductor layer. A p-type zinc oxide film can be realized with various kinds of p-type dopant and doping methods, for example, by using substitutional doping with dopant serving as an acceptor (e.g., N, B, Cu, Li, Na, K, Rb, P, or As or a mixture of such elements). However, this embodiment is not limited thereto.

Figure 21B:
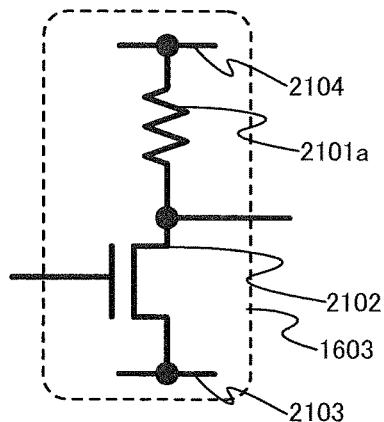

FIG. 21B illustrates an example of the structure of the inverter 1603 including a resistor 2101a instead of the p-channel transistor 2101. A semiconductor layer that is in the same layer as a semiconductor layer included in the n-channel transistor 2102 can be used for the resistor 2101a. Thus, the resistor 2101a can be formed using an oxide semiconductor, for example. In this case, an oxide semiconductor layer that is used as a channel layer of the n-channel transistor 2102 and the oxide semiconductor layer used for the resistor 2101a can be formed using the layers in the same layer.

Figure 21C:
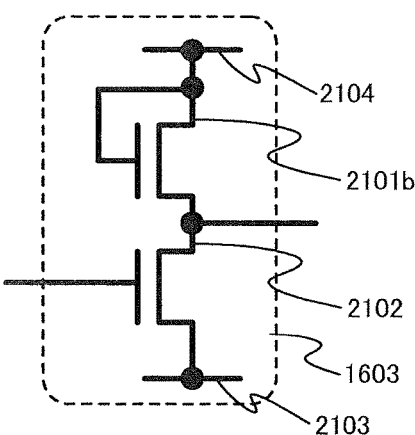

FIG. 21C illustrates an example of the structure of the inverter 1603 including a transistor 2101b instead of the p-channel transistor 2101. The transistor 2101b is diode-connected. Note that the transistor 2101b can be a depletion (normally-on) transistor so that the transistor is on and current can flow therethrough even when the gate-source voltage is 0 V or lower. Since the n-channel transistor 2102 and the transistor 2101b have the same polarity, the number of process steps can be reduced.

Figure 21D:
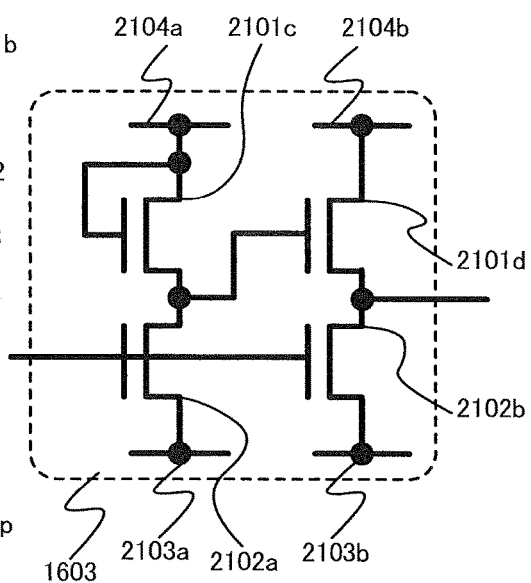

FIG. 21D illustrates an example of the inverter 1603 having a bootstrap function. The inverter 1603 includes a transistor 2101c, a transistor 2101d, a transistor 2102a, and a transistor 2102b. A potential of a gate of the transistor 2101d is made sufficiently high by bootstrap operation. Thus, a potential of a wiring 2104b can be output without change. The inverter 1603 in FIG. 21D has functions such that a low voltage is supplied to wirings 2103a and 2103b and a high voltage is supplied to a wiring 2104a and the wiring 2104b. Note that the wiring 2103a and the wiring 2103b may be connected to be unified as one wiring. Similarly, the wiring 2104a and the wiring 2104b may be connected to be unified as one wiring. Note that since the transistors 2101c, 2101d, 2102a, and 2102b have the same polarity, the number of process steps can be reduced.

Figure 21E:
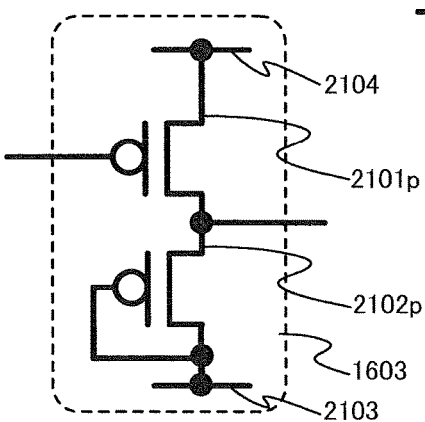

Note that FIGS. 21B to 21D each illustrate the case where the transistor is an n-channel transistor; however, this embodiment is not limited thereto. The circuit can be similarly formed when a p-channel transistor is used. As an example, FIG. 21E illustrates an example of the case where the transistors 2101b and 2102 in FIG. 21C are p-channel transistors. The inverter is constituted by a p-channel transistor 2101p and a p-channel transistor 2102p.

Next, specific examples of the switches 1602, 1606, 1607, and the like illustrated in FIG. 16 and the like are shown. The switches 1602, 1606, and 1607 can be referred to as analog switches or transfer gates. FIGS. 22A to 22D illustrate examples of the structure of the switch 1602. Note that the other switches such as the switches 1606 and 1607 can formed in a manner similar to that of the switch 1602.

Figure 22A:
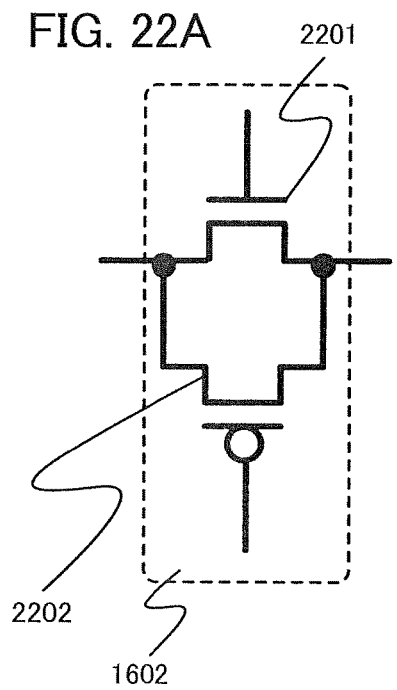
FIGS. 22A to 22D are circuit diagrams each illustrating an example of a structure of a display device.

FIG. 22A illustrates a structure example of the switch 1602 with a CMOS structure. The switch 1602 is formed by connecting a p-channel transistor 2202 and an n-channel transistor 2201 in parallel with each other. Note that signals that are inverse to each other are preferably supplied to a gate of the p-channel transistor 2202 and a gate of the n-channel transistor 2201. Thus, the p-channel transistor 2202 and the n-channel transistor 2201 can be turned on and off at the same time. With such a CMOS structure, the amplitude of voltage applied to the gates of the p-channel transistor 2202 and the n-channel transistor 2201 can be reduced. Consequently, power consumption can be reduced.

Figure 22B:
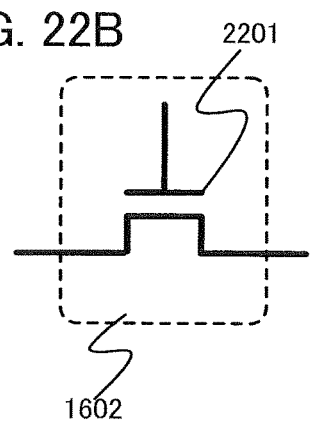
Figure 22C:
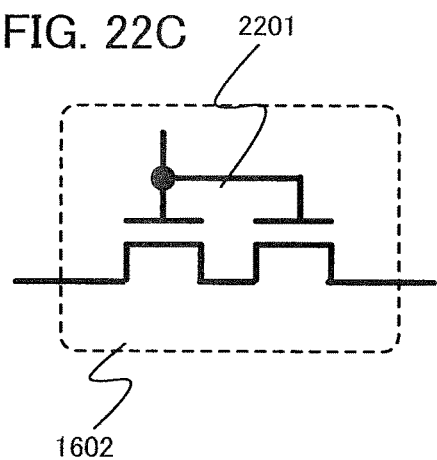

FIG. 22B illustrates an example of the structure of the switch 1602 that includes the re-channel transistor 2201 without using a p-channel transistor. FIG. 22C illustrates an example of the structure of the switch 1602 constituted by the n-channel transistor 2201 with a multi-gate structure.

Figure 22D:
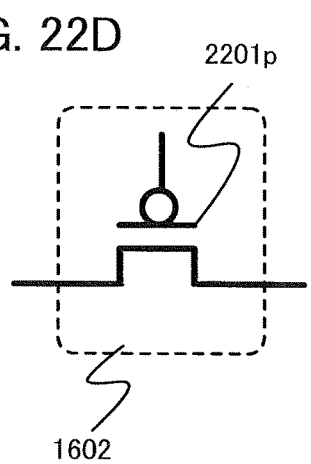

Note that the transistor 2201 is an n-channel transistor in the structure examples in FIGS. 22B and 22C; however, the structure of the switch 1602 is not limited to these examples. For example, the switch can be similarly formed by using a p-channel transistor. As an example, FIG. 22D illustrates an example of the structure of the switch 1602 in the case where the n-channel transistor 2201 in FIG. 22B is replaced with a p-channel transistor. The switch 1602 is constituted by a p-channel transistor 2201p.

Figure 23:
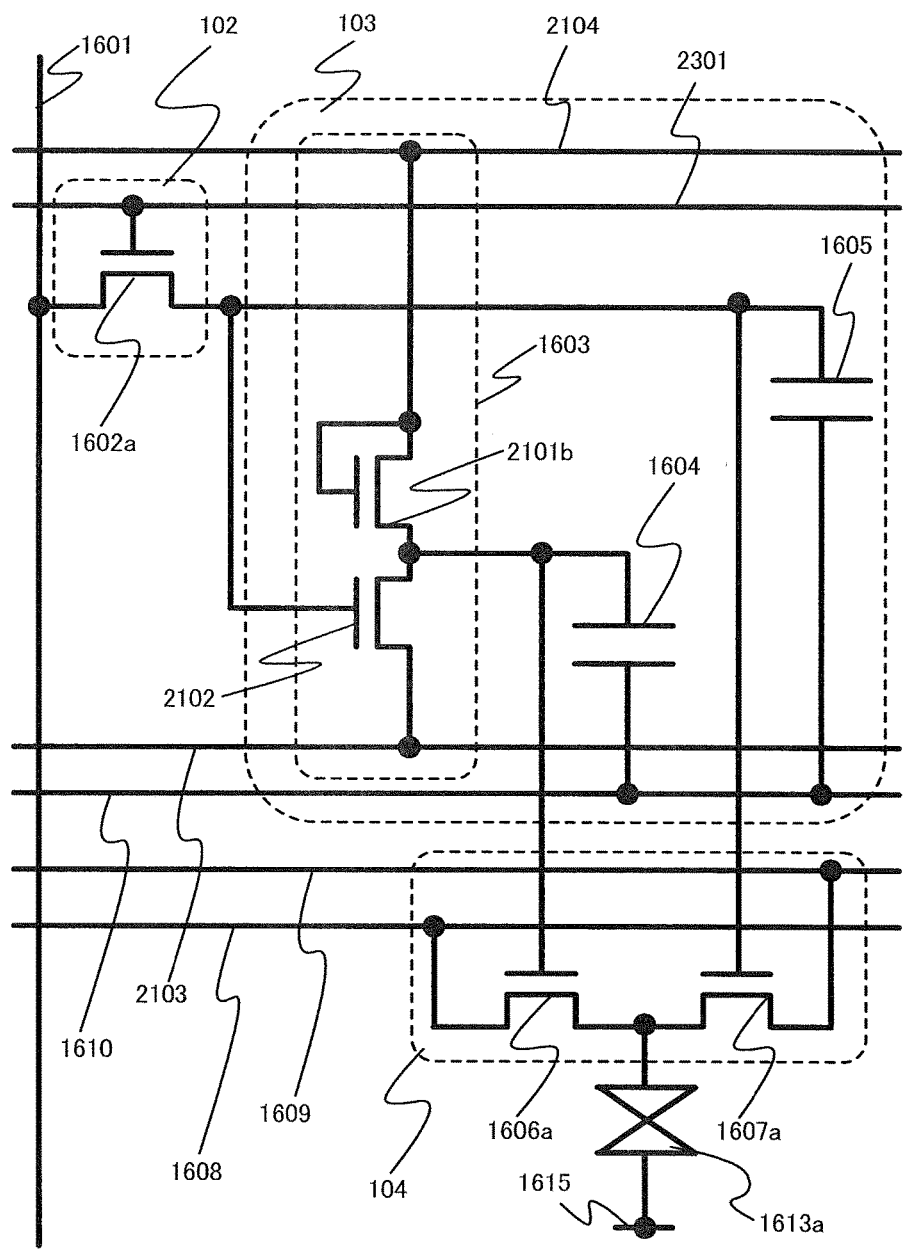
FIG. 23 is a circuit diagram illustrating an example of operation of a display device.

Next, FIG. 23 illustrates an example of the case where the circuit illustrated in FIG. 16, FIGS. 17A to 17C, FIGS. 18A to 18C, FIGS. 19A to 19C, and FIGS. 20A to 20C is constituted by the circuits illustrated in FIGS. 21A to 21E and FIGS. 22A to 22D. In FIG. 23, the switches 1602, 1606, and 1607 are constituted by the circuit in FIG. 22B and the inverter 1603 is constituted by the circuit in FIG. 21C. Therefore, the circuit in FIG. 23 is constituted by the transistors of the same polarity. Thus, the number of process steps can be reduced. Needless to say, this embodiment is not limited to this structure and other structures can be employed.

In the circuit in FIG. 23, a gate of a transistor 1602a is connected to a wiring 2301. The wiring 2301 can be connected to the circuit 1502 in FIG. 15. Thus, a selection signal can be supplied from the circuit 1502 to the wiring 2301. For that reason, the wiring 2301 can be referred to as a gate line, a gate signal line, a scan line, a scan signal line, or the like.

When the wiring 2301 is formed using a light-transmitting material, the aperture ratio can be increased. However, this embodiment is not limited to using a light-transmitting material. For example, when the wiring 2301 is formed using a material that does not have light-transmitting properties and has high conductivity, signal delay can be reduced. When the wiring 2301 is formed using a material with high conductivity, the wiring can be formed with a multi-layer structure including a layer of a light-transmitting material.

In FIG. 23, a liquid crystal element 1613a is used as the display element 1613. Transistors 1602a, 1606a, and 1607a are provided as the switches 1602, 1606, and 1607, respectively.

Note that both the capacitor 1604 and the capacitor 1605 are connected to the wiring 1610 in FIG. 23. That is, it can be said that the wiring 1611 is omitted so that the wirings 1610 and 1611 are unified as the wiring 1610.

Note that although the capacitor 1612 is omitted in FIG. 23, the capacitor 1612 may be provided.

Note that the wiring 2103 may be connected to the wiring 1610 so that they are unified as one wiring.

In FIG. 23, the inverter 1603 has the configuration in FIG. 21C. In this case, current might continue to flow through the transistors 2101b and 2102 depending on a signal input to the inverter 1603. That is, it is possible that the direct tunneling current flows through the inverter 1603. In this case, extra power might be consumed by the inverter 1603.

The direct tunneling current can be reduced by devising a driving method. FIGS. 24 to 27 illustrate a driving method for reducing the direct tunneling current of the inverter 1603. The idea is that the potential of the wiring 2104 is lowered when it is not necessary to remain high, instead of being kept high. As a result, the transistor 2101b is turned off, and the flow of direct tunneling current can be reduced. In this case, the output of the inverter 1603 is sometimes in a high impedance state.

Figure 24:
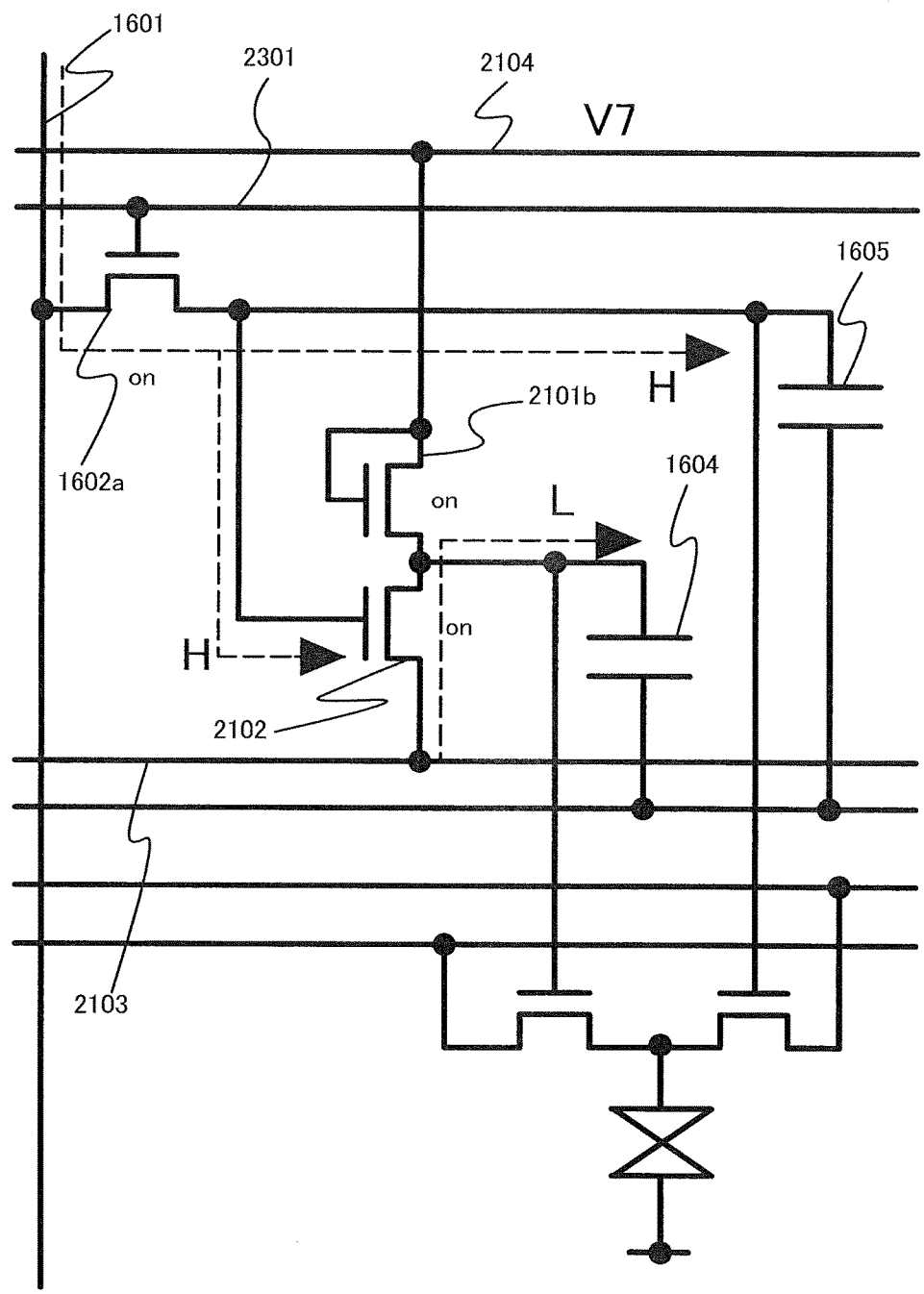
FIG. 24 is a circuit diagram illustrating an example of operation of a display device.

First, as illustrated in FIG. 24, an H signal is input from the wiring 1601 through the transistor 1602a. At that time, a potential V7 of the wiring 2104 is higher than a potential of the wiring 2103. Then, the n-channel transistor 2102 is turned on and outputs an L signal to the capacitor 1604. At this time, the transistor 2101b is also turned on; however, an L signal is output because of the difference of on-resistances between the transistor 2102 and the transistor 2101b. At this time, the direct tunneling current continues to flow. In order for the inverter 1603 to output an L signal, W/L (the ratio of channel width W to channel length L) of the n-channel transistor 2102 is preferably larger than that of the transistor 2101b.

Figure 25:
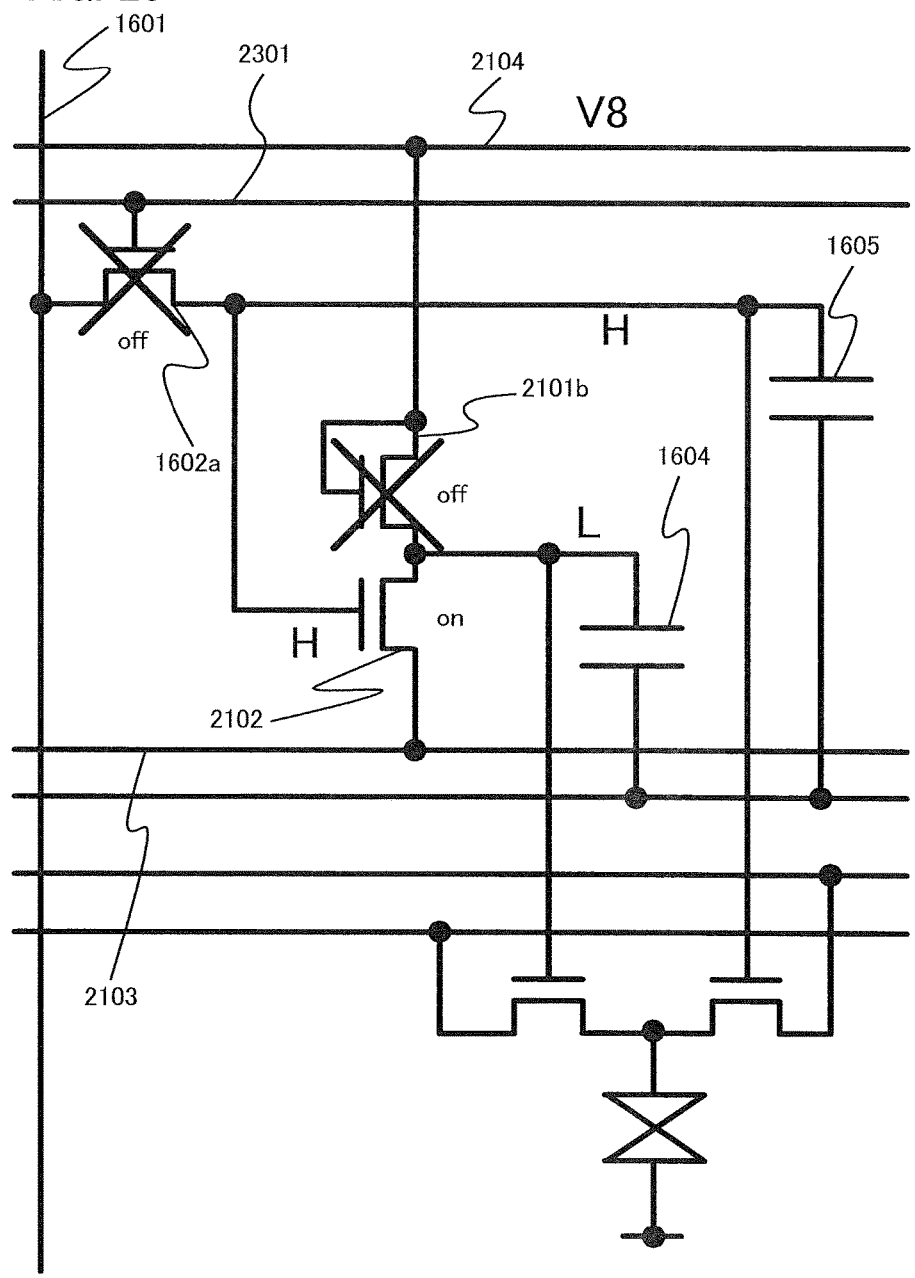
FIG. 25 is a circuit diagram illustrating an example of operation of a display device.

Next, as illustrated in FIG. 25, the potential of the wiring 2104 is lowered to a potential V8. Here, V7 is higher than V8, and the potential V8 is substantially the same as the potential of the wiring 2103. As a result, the transistor 2101b is turned off, so that the flow of direct tunneling current can be reduced. Moreover, the signal held by the capacitor 1604 remains an L signal.

Note that the transistor 1602a is off at this time; the transistor 1602a can be turned off before, after, or at the same time as changing the potential of the wiring 2104.

Note that the potential V8 of the wiring 2104 at this time is approximately the same as the potential of the wiring 2103. The potential V8 is preferably lower than the potential that is higher than the potential of the wiring 2103 by the threshold voltage of the transistor 2101b. More preferably, the potential V8 is equal to the potential of the wiring 2103. Thus, the number of potentials needed can be reduced, so that the size of the device can be reduced.

Figure 26:
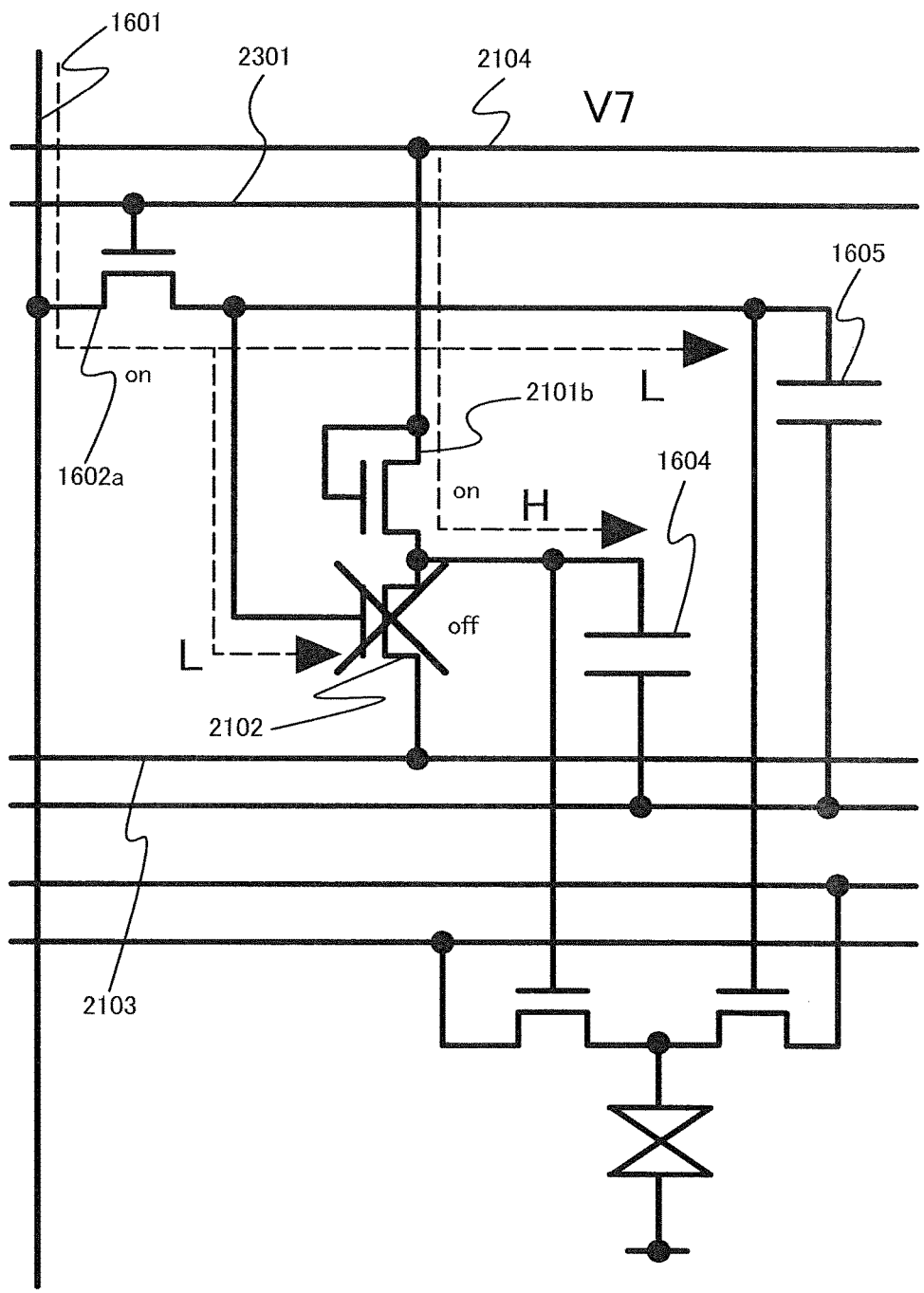
FIG. 26 is a circuit diagram illustrating an example of operation of a display device.
Figure 27:
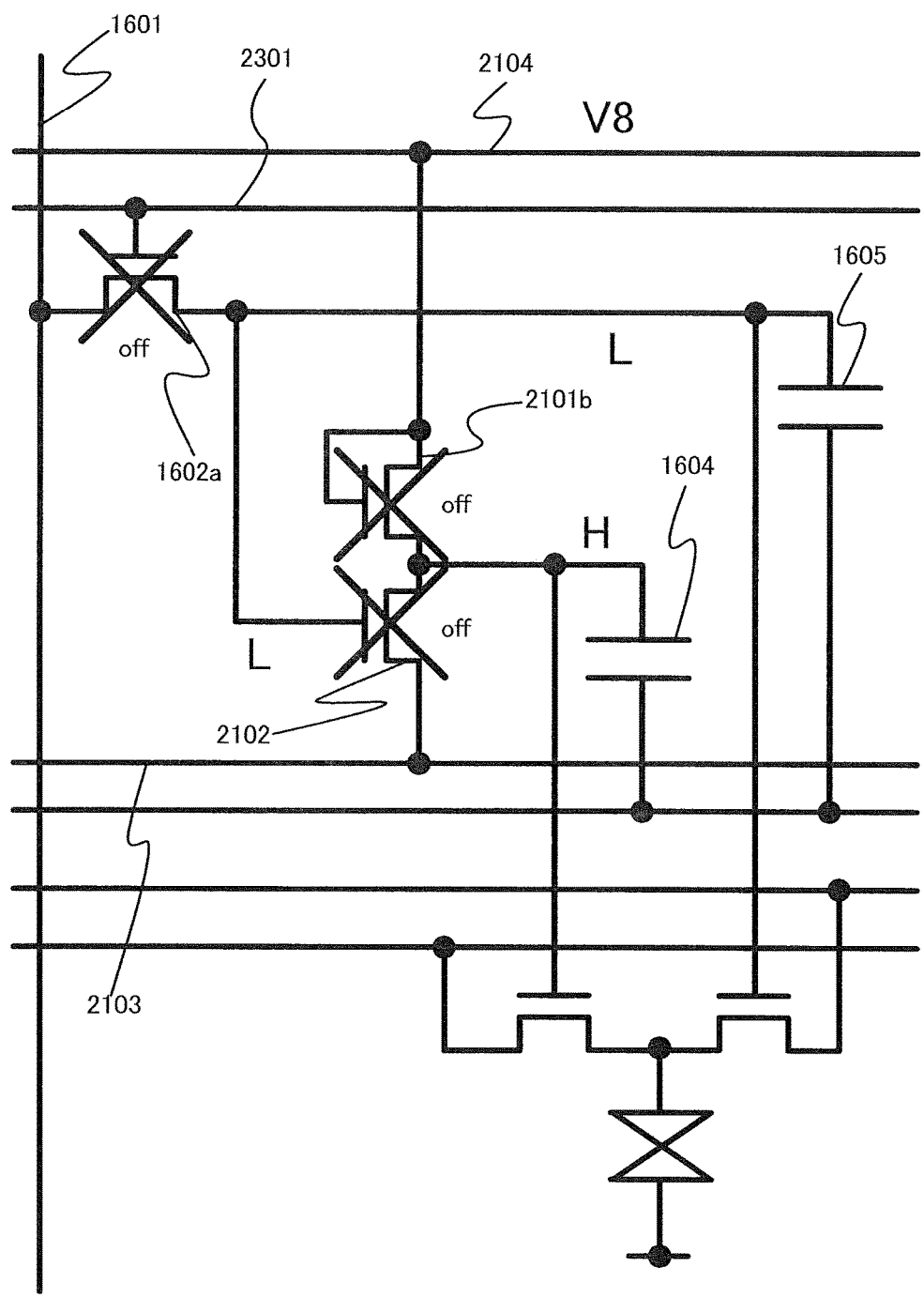
FIG. 27 is a circuit diagram illustrating an example of operation of a display device.

FIGS. 24 and 25 illustrate the case where an H signal is input from the wiring 1601; the case where an L signal is input is similar to that case and illustrated in FIGS. 26 and 27. First, as illustrated in FIG. 26, an L signal is input from the wiring 1601 through the transistor 1602a. At this time, the potential V7 of the wiring 2104 is higher than the potential of the wiring 2103. Then, since the n-channel transistor 2102 is off, the transistor 2101b is turned on and outputs an H signal to the capacitor 1604. Since the n-channel transistor 2102 is off at this time, direct tunneling current does not flow. Note that the potential of the H signal at this time is lower than the potential V7 of the wiring 2104 by the threshold voltage of the transistor 2101b; operation is not affected as long as the H signal is a voltage that can make the transistor 1606a turn on.

Next, as illustrated in FIG. 27, the potential of the wiring 2104 is lowered to the potential V8. Here, V7 is higher than V8. As a result, the transistor 2101b is turned off. Moreover, the signal held by the capacitor 1604 remains an H signal. In this case, the output of the inverter 1603 can be said to be in a high impedance state.

In such a manner, the potential of the wiring 2104 is kept high only when the inverter 1603 needs to output a signal, that is, when a signal in the capacitor 1604 needs to be rewritten, and the potential of the wiring 2104 is lowered when the inverter 1603 does not need to output a signal; thus, the direct tunneling current in the inverter 1603 can be reduced. Consequently, power consumption can be reduced.

Note that the direct tunneling current in the inverter 1603 is reduced by devising the driving method in FIGS. 24 to 27; however, this embodiment is not limited to such a way. It is possible to reduce the direct tunneling current by changing part of the circuit configuration of the inverter 1603. FIGS. 28A to 28D illustrate examples in that case.

Figure 28A:
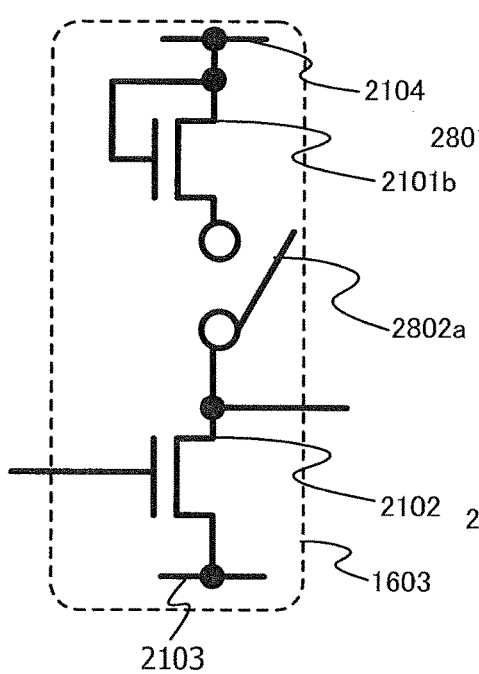
FIGS. 28A to 28D are circuit diagrams each illustrating an example of a structure of a display device.
Figure 28B:
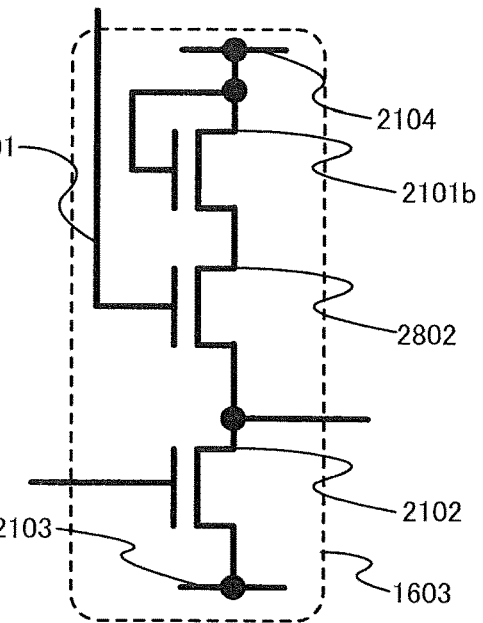
Figure 28C:
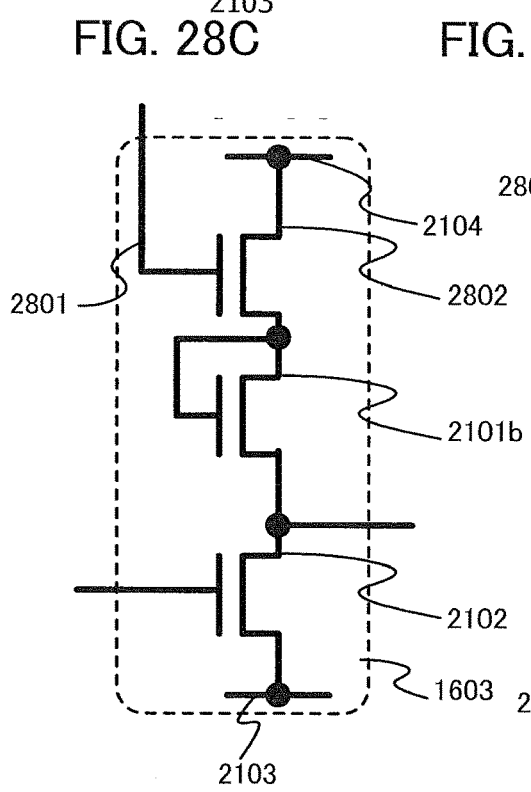

FIG. 28A illustrates a configuration example of the inverter 1603 in which a switch 2802a connected in series with the transistor 2101b is provided between the wiring 2104 and the output terminal of the inverter 1603. Note that the switch 2802a may be connected between the transistor 2101b and the output terminal of the inverter 1603 or between the wiring 2104 and the transistor 2101b. A circuit diagram of the inverter 1603 in the case where a transistor 2802 is used as the switch 2802a in FIG. 28A is illustrated in FIG. 28B. An example of the structure in the case where the connection relation of the transistor 2802 in FIG. 28B is changed is illustrated in FIG. 28C. The potential of a gate of the transistor 2802 is controlled with such a circuit configuration to control on and off of the transistor 2802, whereby the direct tunneling current can be reduced. In this case, the potential of the gate of the transistor 2802 can be controlled in a manner similar to that for changing the potential of the wiring 2104.

In such a case, the potential of the wiring 2104 may be changed as in FIGS. 24 to 27; a problem does not occur even when the potential of the wiring 2104 is kept fixed because the transistor 2802 can reduce the direct tunneling current.

Figure 28D:
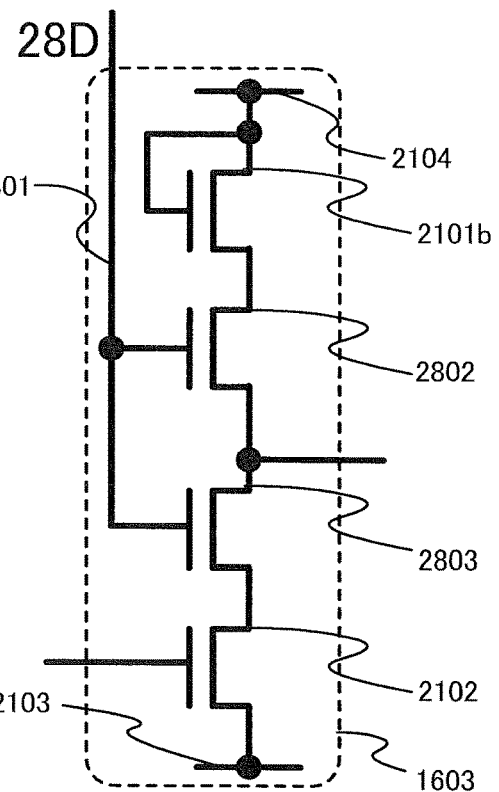

The transistor is placed between the wiring 2104 and the output terminal of the inverter 1603 in FIGS. 28A to 28C; however, this embodiment is not limited to this structure and the transistor can be placed between the output terminal of the inverter 1603 and the wiring 2103. FIG. 28D illustrates an example of the structure of the inverter 1603 in the case where a transistor 2803 is connected in series with the n-channel transistor 2102 in the circuit in FIG. 28B. Note that the transistor 2803 can be provided at a different position so as to be placed between the p-channel transistor 2101 and the wiring 2103 as in FIG. 28C.

Note that a wiring 2801 connected to gates of the transistors 2802 and 2803 can be connected to the wiring 2301 in FIG. 23. Thus, the transistors 2802 and 2803 can be turned on only when the transistor 1602a is on. Therefore, the direct tunneling current can be reduced when the inverter 1603 does not need to operate. Furthermore, by connecting the wiring 2801 to the wiring 2301, the number of wirings can be reduced as compared to the case where an additional wiring is provided. However, this embodiment is not limited to such a structure.

The control of the transistors 2802 and 2803 can control whether the inverter 1603 in FIG. 28D outputs a signal or is brought into a high impedance state. Therefore, the inverter 1603 can be referred to as a clocked inverter.

Embodiment 5

In this embodiment, a circuit included in a display device (a semiconductor device) will be described with reference to drawings.

Figure 29:
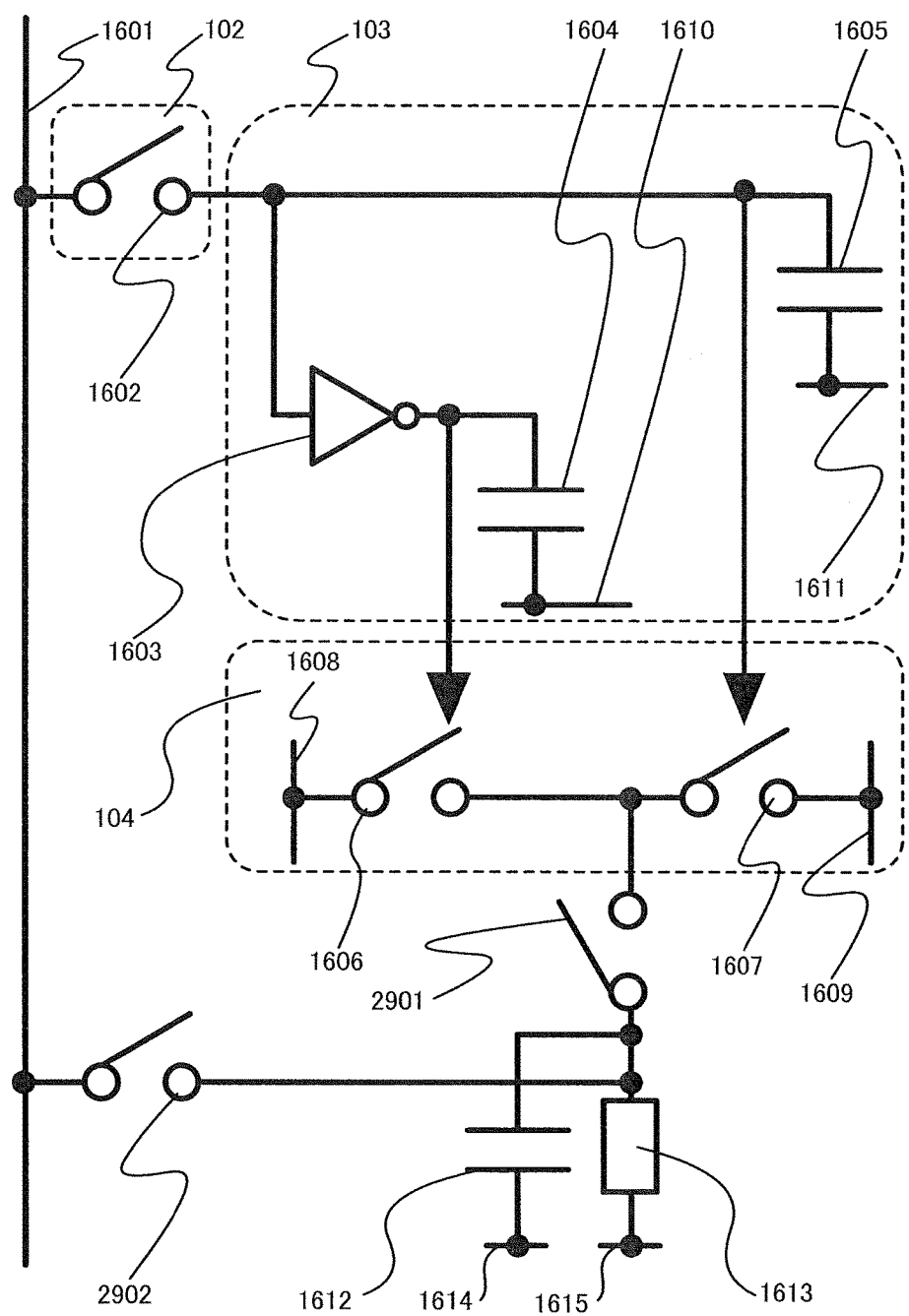
FIG. 29 is a circuit diagram illustrating an example of a structure of a display device.

FIG. 29 illustrates an example of a configuration of a circuit obtained by changing part of the circuit in FIG. 16. The circuit in FIG. 29 corresponds to a circuit obtained by adding a switch 2901 and a switch 2902 to the circuit in FIG. 16.

The switch 2902 has a function of controlling conduction and non-conduction between the display element 1613 and the wiring 1601. Consequently, by turning on the switch 2902, a signal supplied to the wiring 1601 can be supplied directly to the display element 1613. Therefore, in general, a signal supplied to the wiring 1601 is often a digital signal; when the signal is an analog signal, the analog signal can be input directly to the display element 1613 and thus display can be performed with analog gray scale.

The switch 2901 has a control function so that the potentials of the wirings 1608 and 1609 are not supplied to the display element 1613. If the potential of the wiring 1608 or the wiring 1609 is supplied to the display element 1613 when the switch 2902 is turned on and a signal is supplied from the wiring 1601 to the display element 1613 or when the switch 2902 is turned off and an analog signal is held in the display element 1613 after the switch 2902 is turned on and the signal is supplied from the wiring 1601 to the display element 1613, the signal value held in the display element 1613 is changed. The switch 2901 is made on and off in order to prevent such a situation. When a signal is input through the switch 1602, the switch 2901 is turned on so that the potential of the wiring 1608 or the wiring 1609 is supplied to the display element 1613. Such a structure can realize both improvement in display quality and reduction in power consumption. However, this embodiment is not limited to such a structure.

Figure 30:
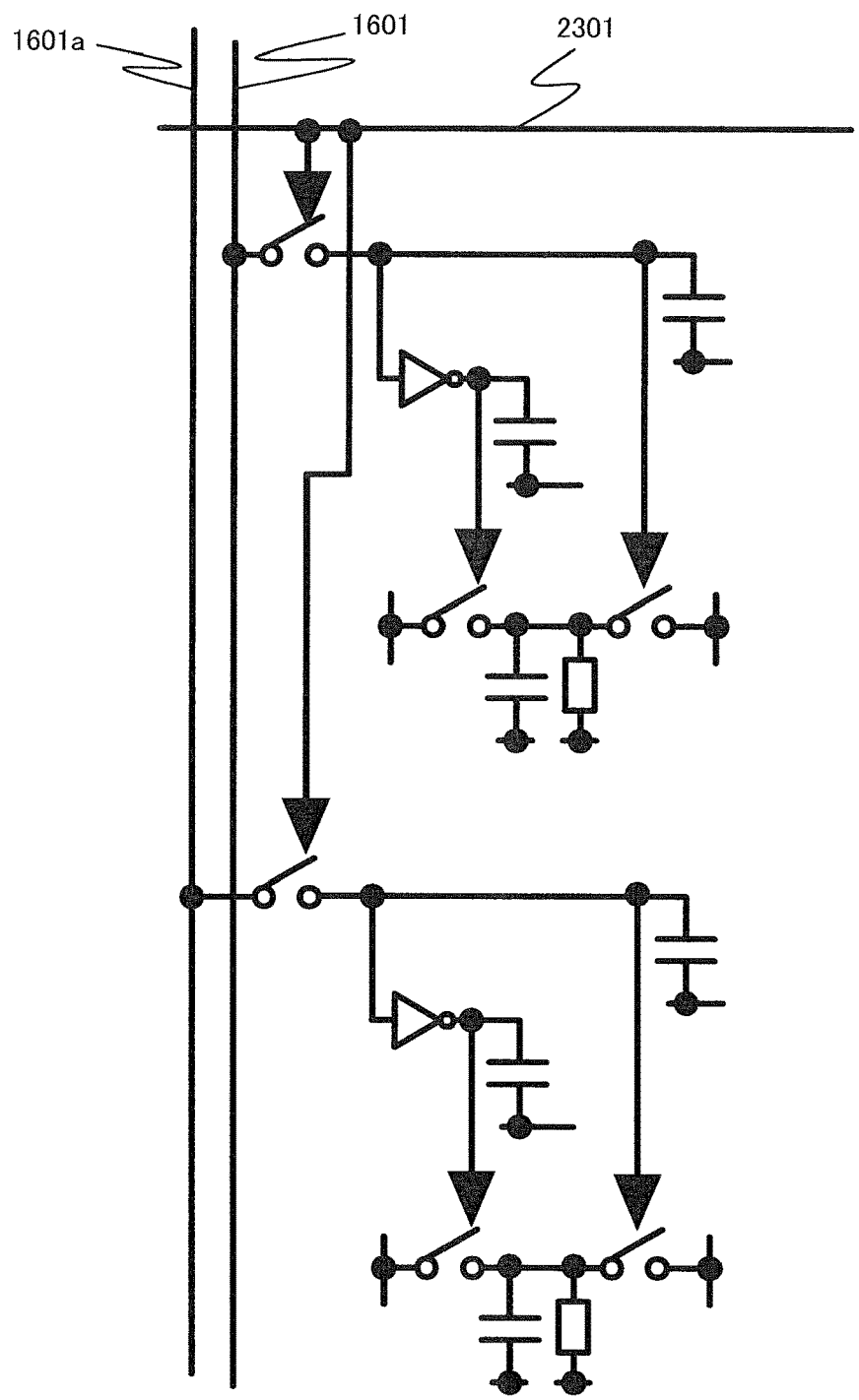
FIG. 30 is a circuit diagram illustrating an example of a structure of a display device.
Figure 31:
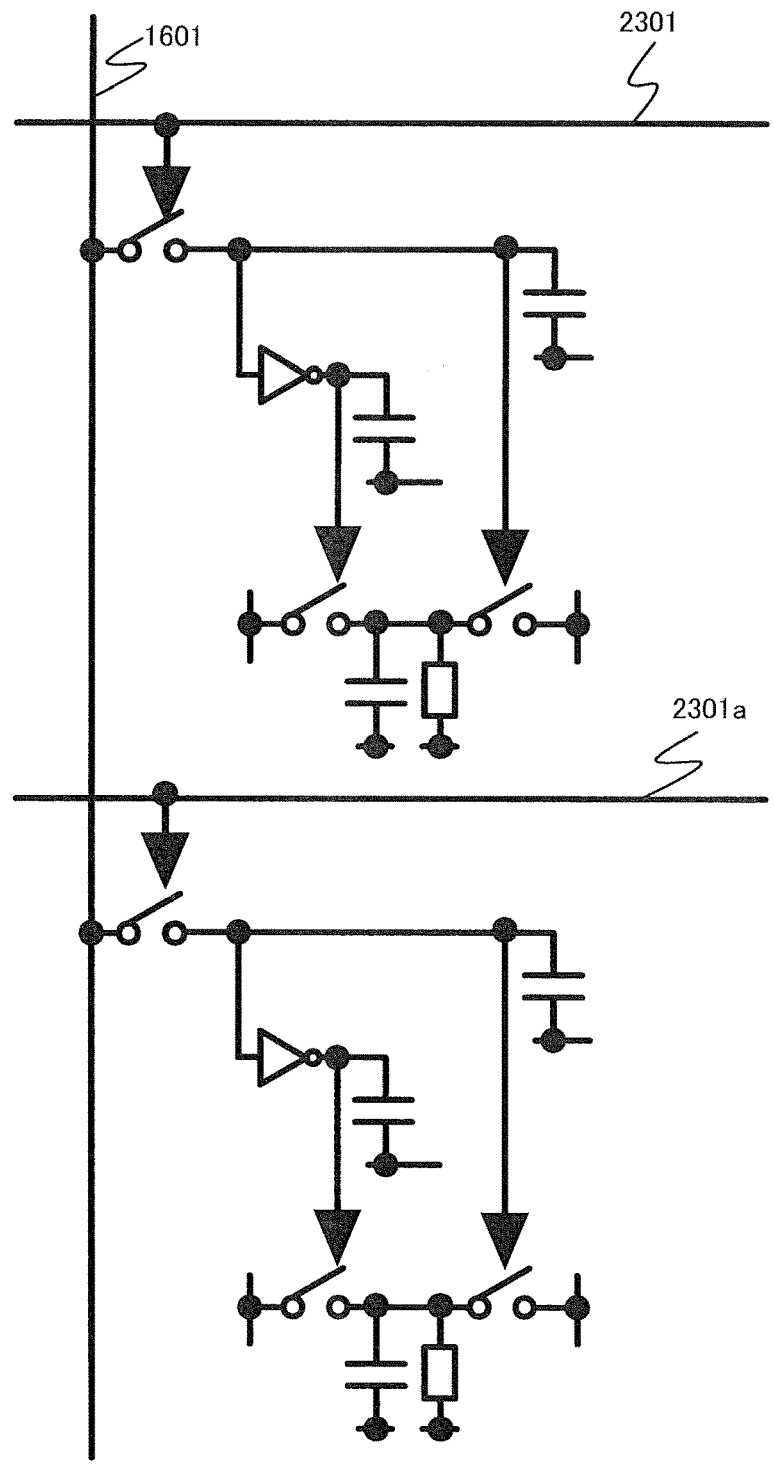
FIG. 31 is a circuit diagram illustrating an example of a structure of a display device.

As other configuration examples, FIGS. 30 and 31 each illustrate an example of the case where the number of gray scales expressed by one pixel, that is, the number of bits is increased. The number of bits of an image signal held in a pixel is 1 bit in FIG. 16; therefore, two gray scales are expressed. In order to realize multiple gray scales, a plurality of subpixels are provided in one pixel. When a plurality of subpixels are provided so that the display area of a display element is controlled, multiple gray scales can be achieved by an area gray scale method.

FIG. 30 is a circuit diagram in the case where image signals are simultaneously input to two subpixels by using the wiring 2301. A wiring 1601a is provided in addition to the wiring 1601 in order to input signals simultaneously, and a signal supplied to either the wiring 1601 or the wiring 1601a is input to each of the subpixels.

FIG. 31 is a circuit diagram in the case where image signals are sequentially input to two subpixels by using the wiring 2301 and a wiring 2301a. An image signal is input to one subpixel from the wiring 2301 and input to the other subpixel from the wiring 2301a. Since image signals are sequentially input, signals can be sequentially input to the subpixels from the wiring 1601.

Note that FIGS. 30 and 31 illustrate the examples of the case where one pixel has two subpixels; however, the number of bits is not limited to two and can be increased. In particular, when a transistor or a capacitor is formed using a light-transmitting material, the increase in the number of bits does not decrease the aperture ratio, so that the number of bits can be easily increased.

Note that the wirings 2103, 1610, 1611, 1614, 1609, 1608, 2104, and the like can be shared with a plurality of subpixels so that a plurality of wirings are unified as one wiring. Thus, the number of wirings can be reduced.

Figure 42:
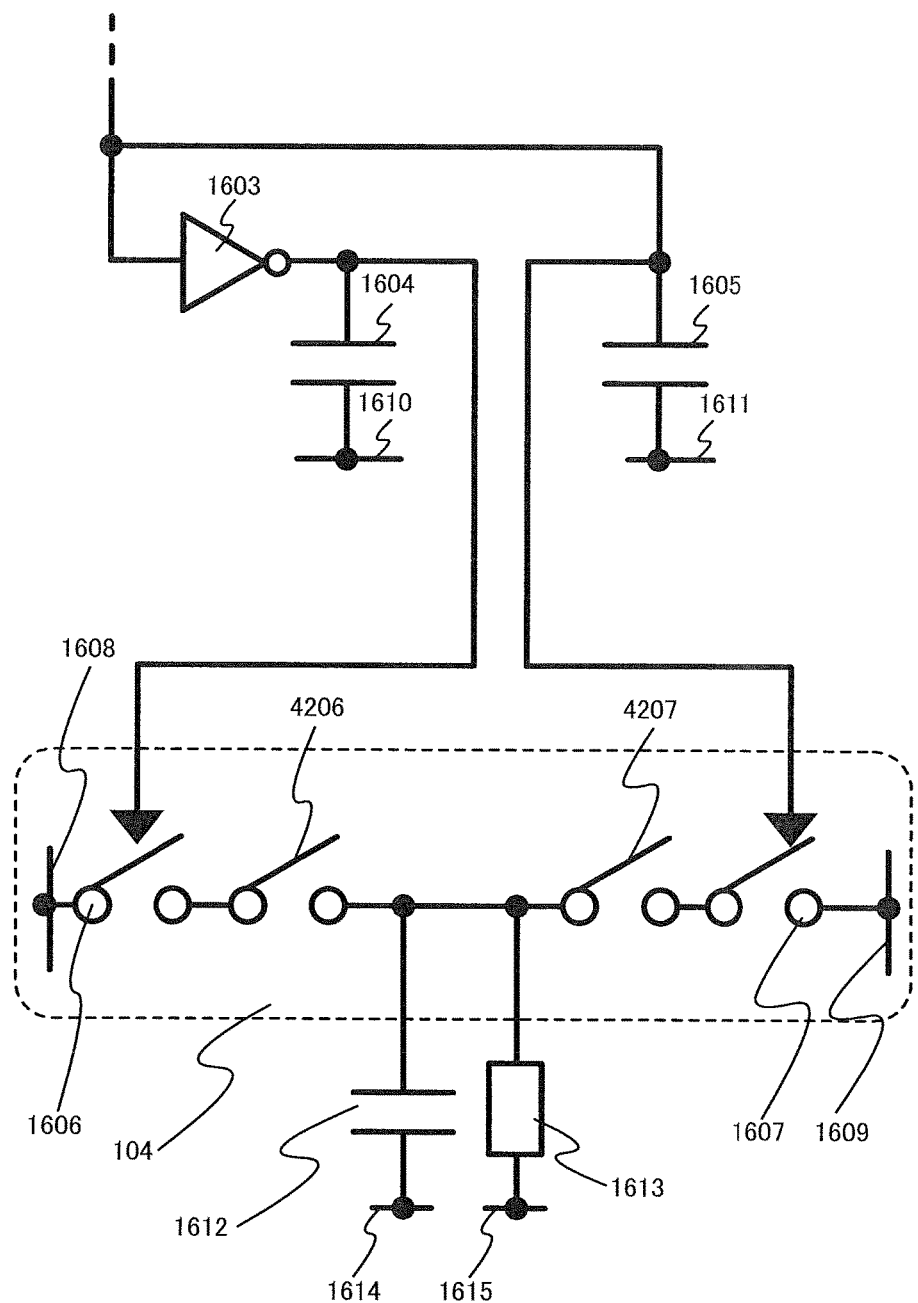
FIG. 42 is a circuit diagram illustrating an example of a structure of a display device.

As another configuration example, FIG. 42 illustrates the case where part of the circuit 104 is changed. A switch 4206 is provided in series with the switch 1606. Alternatively, a switch 4207 is provided in series with the switch 1607. FIG. 42 illustrates the case where both the switch 4206 and the switch 4207 are provided. By controlling on and off of the switch 4206 and/or the switch 4207, the potential of the wiring 1608 or the wiring 1609 can be prevented from being supplied to the display element 1613 regardless of on and off of the switch 1606 or the switch 1607.

Figure 43:
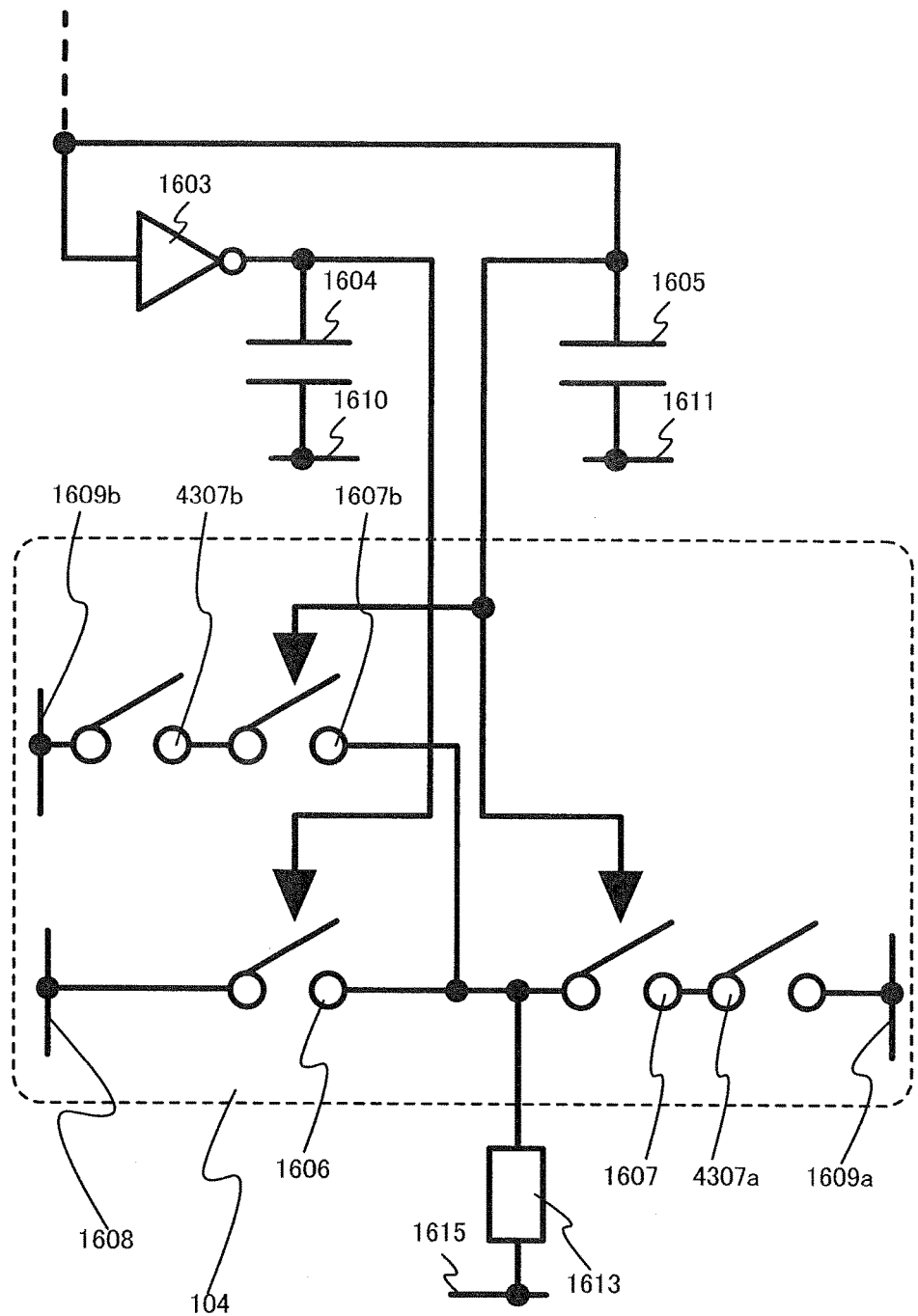
FIG. 43 is a circuit diagram illustrating an example of a structure of a display device.

As another modification example, FIG. 43 illustrates the case where part of the circuit 104 is changed. FIG. 43 corresponds to a diagram in which two switches corresponding to the switch 1607 and two wirings corresponding to the wiring 1609 are provided in FIG. 16. A voltage for an anode is supplied to a wiring 1609a, and a voltage for a cathode is supplied to a wiring 1609b. A voltage with which voltage is not supplied to the display element 1613, for example, a voltage that is substantially the same as the wiring 1615 is supplied to the wiring 1608. The switch 1607 and a switch 4307a are connected in series between the display element 1613 and the wiring 1609a. Similarly, a switch 1607b and a switch 4307b are connected in series between the display element 1613 and the wiring 1609b. Note that these switches can be connected with a different structure as long as they are connected in series with each other. As an example of the operation, the switch 4307a and the switch 4307b are alternately turned on and off. That is, the switch 4307b is off when the switch 4307a is on, whereas the switch 4307b is on when the switch 4307a is off. Thus, inversion driving can be performed.

Note that FIG. 43 illustrates the configuration in which the capacitor 1612 is not provided; alternatively, the capacitor 1612 can be provided.

Embodiment 6

In this embodiment, a circuit included in a display device (a semiconductor device) will be described with reference to drawings.

Figure 32:
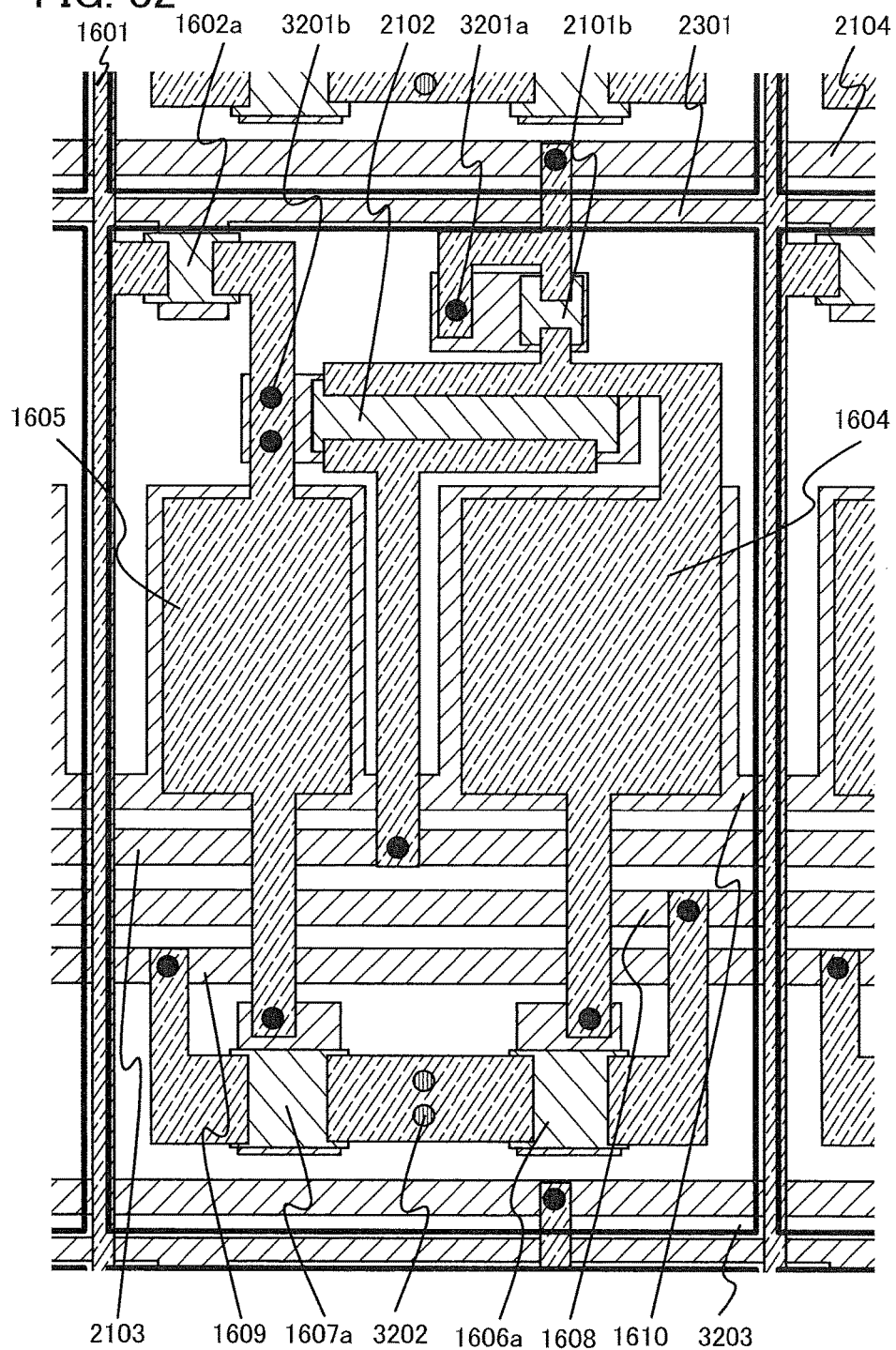
FIG. 32 is a plan view illustrating an example of a structure of a display device.

FIG. 32 is a plan view illustrating a layout example of the circuit illustrated in FIG. 23. The transistor 207 and the capacitor 208 that are illustrated in FIG. 2 are used as a transistor and a capacitor in FIG. 32. A contact structure is such that a contact hole is formed in the insulating layer 202 so that the conductive layers 204a and 201a are directly connected to each other as in the contact structure 1302 in FIG. 13. With such a contact structure, the aperture ratio of a pixel can be increased. Alternatively, the contact resistance can be reduced, and a voltage drop can be reduced. Further alternatively, since the layout area can be reduced, a larger number of circuits can be arranged. However, this embodiment is not limited to such a structure. It is possible to employ a variety of transistor structures, contact structures, capacitor structures, and the like.

As illustrated in FIG. 32, a contact hole 3201b connects a drain electrode (a source electrode) of the transistor 1602a and a gate electrode of the n-channel transistor 2102. Similarly, a contact hole 3201a connects a drain electrode (a source electrode) and a gate electrode of the transistor 2101b.

Further, a contact hole 3202 connects a drain electrode (a source electrode) of the transistor 1607a (or a drain electrode (a source electrode) of the transistor 1606a) and a pixel electrode 3203.

As illustrated in FIG. 32, the transistor, the capacitor, the wiring, and the like can be formed using light-transmitting materials. Thus, the aperture ratio can be increased. Note that one example of this embodiment of the present invention is not limited to this. For example, the wiring can be formed using a material without light-transmitting properties. An example of this case is illustrated in FIG. 33.

Figure 33:
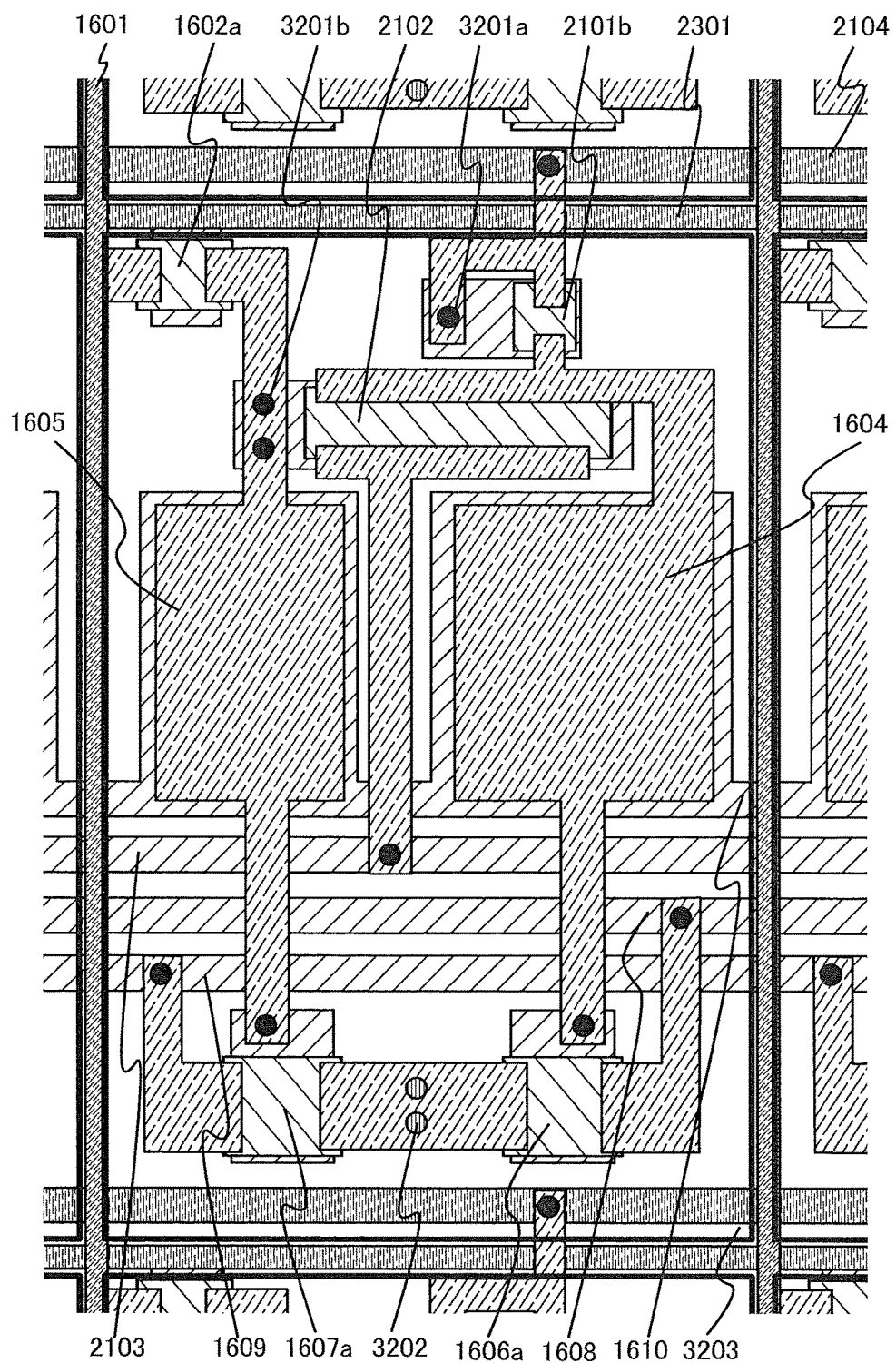
FIG. 33 is a plan view illustrating an example of a structure of a display device.

In FIG. 33, the wirings 1601, 2301, and 2104 are formed using a material with high conductivity, and thus do not have light-transmitting properties. A signal with high frequency is supplied to these wirings. As a result, the formation of the wiring using a material with high conductivity can reduce the distortion of the waveform of a signal.

Figure 34A:
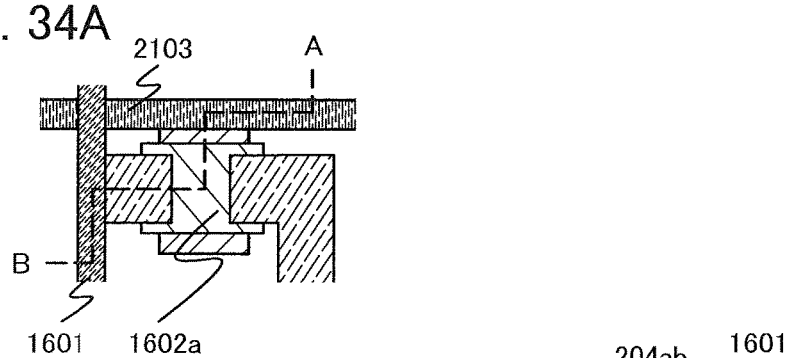
FIG. 34A is a plan view and FIGS. 34B and 34C are cross-sectional views illustrating an example of a structure of a display device.
Figure 34B:
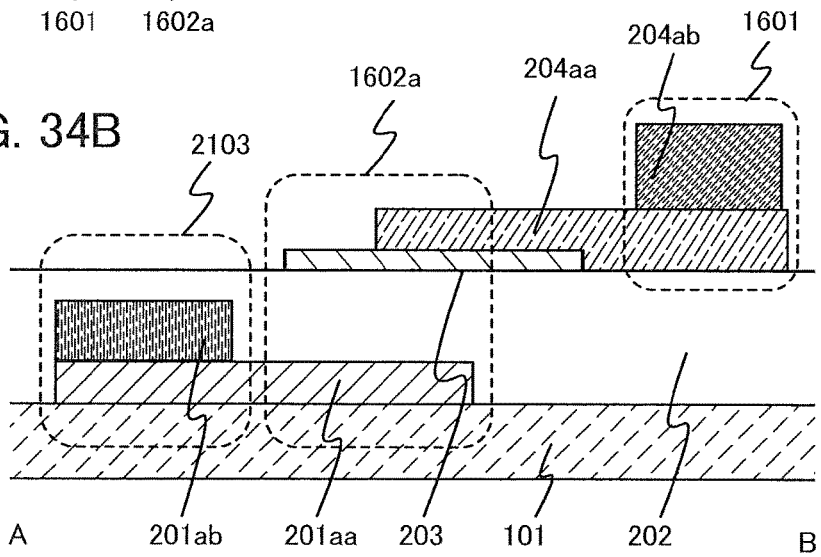
Figure 34C:
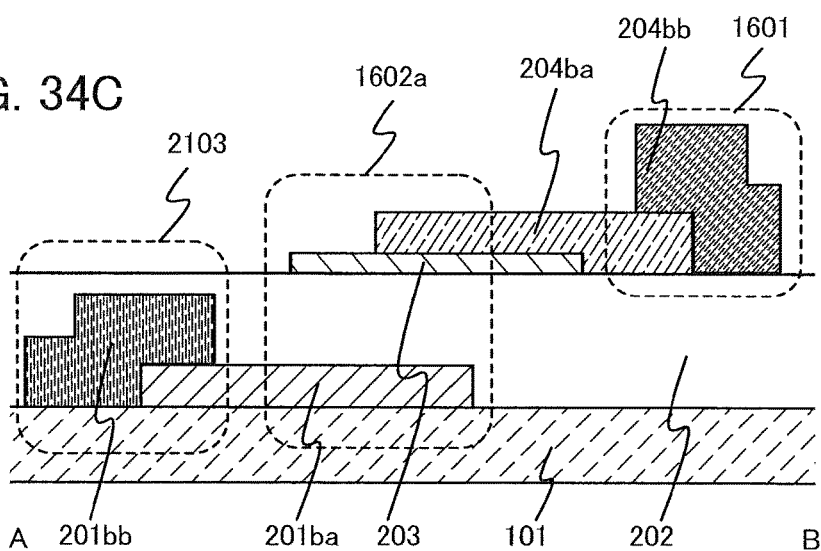

A structure example of part of the transistor 1602a, the wiring 1601, and the wiring 2103 in FIG. 33 is described with reference to FIGS. 34A to 34C. FIG. 34A is a plan view of the structure example. FIG. 34B illustrates one example of a cross-sectional structure along line A-B in FIG. 34A. FIG. 34C illustrates another example of a cross-sectional structure along line A-B.

In FIG. 34B, the wiring 1601 is a stack of a conductive layer 204ab and a conductive layer 204aa. Here, the conductive layer 204ab is formed using a material that does not have light-transmitting properties and has high conductivity. The conductive layer 204aa is formed using a light-transmitting material. Similarly, the wiring 2103 is a stack of a conductive layer 201ab and a conductive layer 201aa. The conductive layer 201ab is formed using a material that does not have light-transmitting properties and has high conductivity. The conductive layer 201aa is formed using a light-transmitting material. In such a manner, a light-transmitting layer can be placed under a layer without light-transmitting properties. In that case, the number of masks (reticles) can be reduced by using a multi-tone mask (also referred to as a half-tone mask or a gray-tone mask). For example, a pattern including a light-transmitting region and a region without light-transmitting properties can be formed using one mask in such a manner that the conductive layers 201aa and 201ab are successively formed and are etched at the same time, and then, a resist is subjected to ashing or the like and only the conductive layer 201ab is etched.

However, this embodiment is not limited to such a structure. As illustrated in FIG. 34C, the conductive layers can be arranged so that a region where a conductive layer 201ba is not provided is placed under a conductive layer 201bb and a region where a conductive layer 204ba is not provided is placed under a conductive layer 204bb.

Note that the layers without light-transmitting properties (e.g., the conductive layers 201ab, 204ab, 201bb, and 204bb) are provided over the layers with light-transmitting properties (e.g., the conductive layers 201aa, 204aa, 201ba, and 204ba) in FIGS. 34B and 34C; however, this embodiment is not limited to this structure. For example, the layers can be formed in the reverse order. Moreover, it is possible to employ a layer structure in which the light-transmitting layer is sandwiched between the layers without light-transmitting properties.

Figure 35:
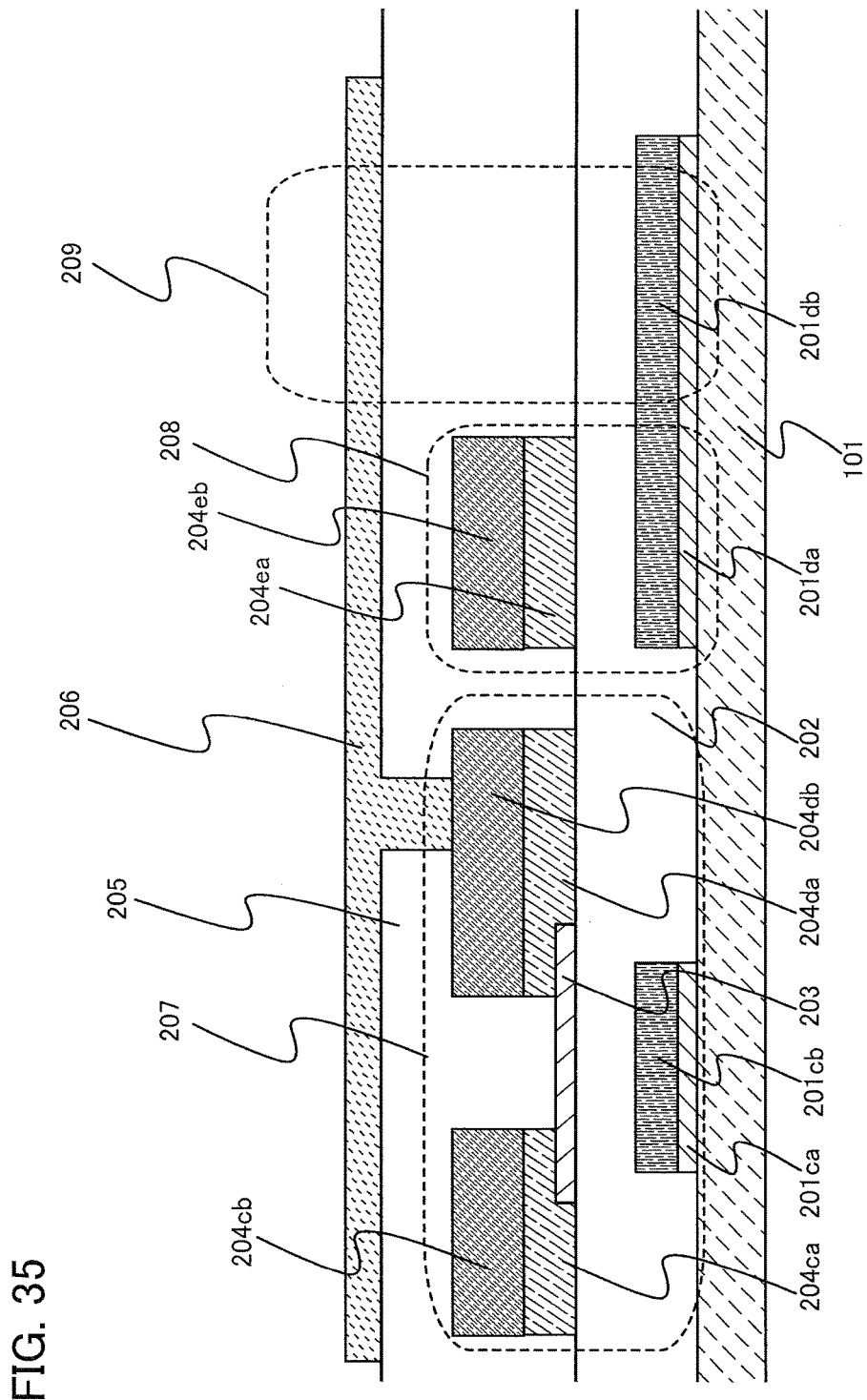
FIG. 35 is a cross-sectional view illustrating an example of a structure of a display device.

A transistor and a capacitor can be formed using conductive layers that are formed by providing a light-transmitting layer under a layer without light-transmitting properties as illustrated in FIG. 34B. FIG. 35 illustrates an example of a cross-sectional view of the case where such a layer structure is employed for forming a transistor and a capacitor that have the structure in FIG. 2.

The gate electrode is formed using conductive layers 201ca and 201cb. The conductive layer 201ca has light-transmitting properties. The conductive layer 201cb does not have light-transmitting properties and has high conductivity. The source electrode (drain electrode) is formed using conductive layers 204ca and 204cb. The conductive layer 204ca has light-transmitting properties. The conductive layer 204cb does not have light-transmitting properties and has high conductivity. The drain electrode (source electrode) is formed using conductive layers 204da and 204db. The conductive layer 204da has light-transmitting properties. The conductive layer 204db does not have light-transmitting properties and has high conductivity. One electrode of the capacitor is formed using conductive layers 201da and 201db. The conductive layer 201da has light-transmitting properties. The conductive layer 201db does not have light-transmitting properties and has high conductivity. The other electrode of the capacitor is formed using conductive layers 204ea and 204eb. The conductive layer 204ea has light-transmitting properties. The conductive layer 204eb does not have light-transmitting properties and has high conductivity.

Figure 36:
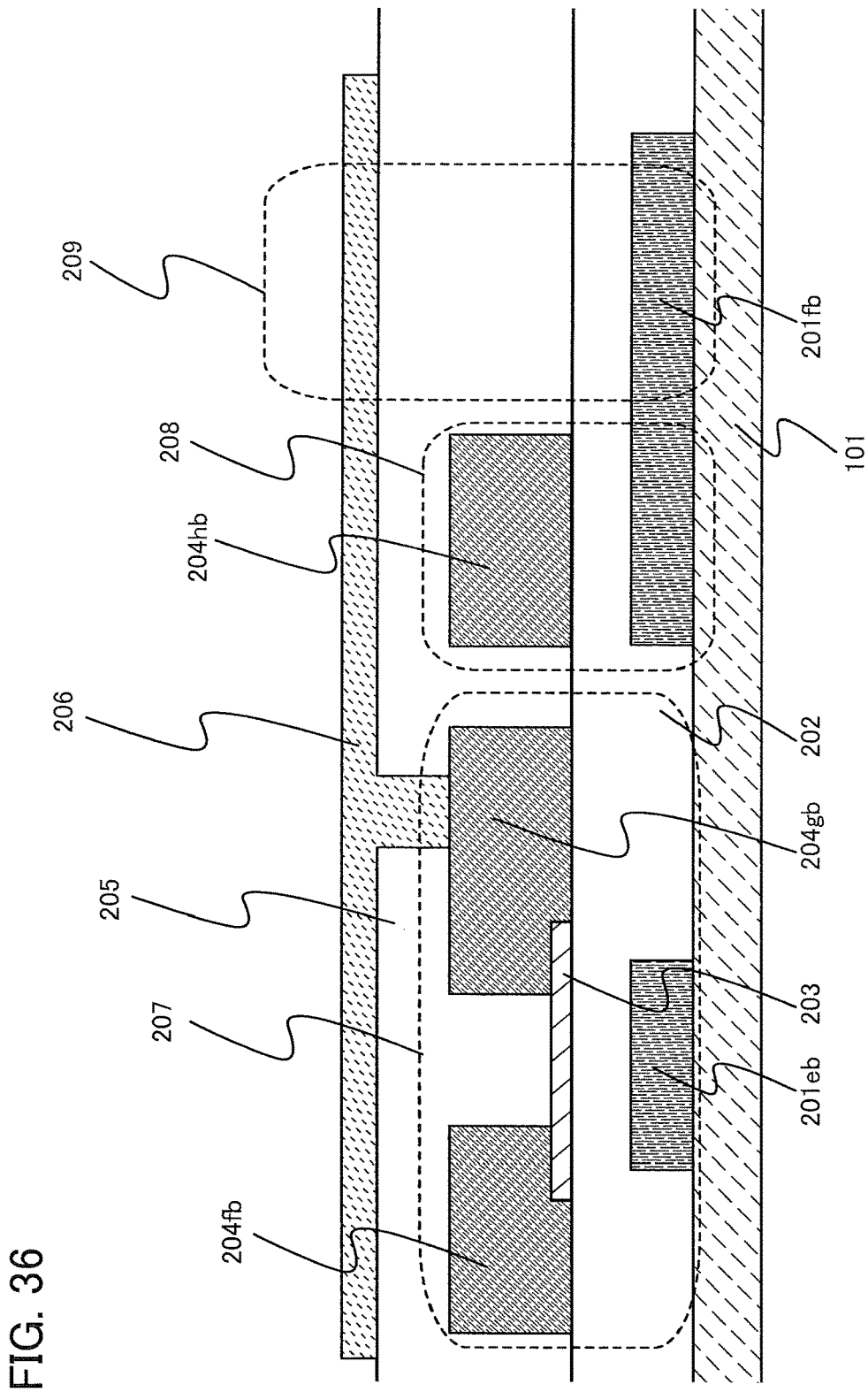
FIG. 36 is a cross-sectional view illustrating an example of a structure of a display device.

Similarly, a transistor and a capacitor can be formed using conductive layers that are formed so that a region where a light-transmitting layer is not provided is placed under a layer without light-transmitting properties as illustrated in FIG. 34C. FIG. 36 illustrates an example of a cross-sectional view of the case where such a layer structure is employed for forming a transistor and a capacitor that have the structure in FIG. 2.

The gate electrode is formed using a conductive layer 201eb. The conductive layer 201eb does not have light-transmitting properties and has high conductivity. The source electrode (drain electrode) is formed using a conductive layer 204fb. The conductive layer 204fb does not have light-transmitting properties and has high conductivity. The drain electrode (source electrode) is formed using a conductive layer 204gb. The conductive layer 204gb does not have light-transmitting properties and has high conductivity. One electrode of the capacitor is formed using a conductive layer 201fb. The conductive layer 201fb does not have light-transmitting properties and has high conductivity. The other electrode of the capacitor is formed using a conductive layer 204hb. The conductive layer 204hb does not have light-transmitting properties and has high conductivity.

Note that an element including such layers can be formed in a similar manner even in the case of employing another transistor structure or capacitor structure, for example, any of the structures illustrated in FIGS. 3 to 14.

Note that the transistor and the capacitor illustrated in FIGS. 34 and 35 are preferably used in a circuit for driving a pixel. This is because light-transmitting properties are not necessary in such a circuit and a wiring is preferably formed using a layer with low conductivity. However, this embodiment is not limited thereto.

Embodiment 7

One example of a method for manufacturing a display device (a semiconductor device) will be described with reference to FIGS. 37A1, 37A2, 37B, and 37C, FIGS. 38A to 38F, and FIGS. 39A to 39E. This embodiment shows an example of a method for manufacturing two thin film transistors with different structures over one substrate.

FIG. 37A1 is a plan view of one thin film transistor 410. FIG. 37A2 is a plan view of the other thin film transistor 420. FIG. 37B illustrates a cross-sectional view along line C1-C2 in FIG. 37A1 and a cross-sectional view along line D1-D2 in FIG. 37A2. FIG. 37C illustrates a cross-sectional view along line C3-C4 in FIG. 37A1 and a cross-sectional view along line D3-D4 in FIG. 37A2.

The thin film transistor 410 has a kind of bottom-gate structure called a channel-etched type, and the thin film transistor 420 has a kind of bottom-gate structure called a channel protection type (also referred to as a channel stop type). The thin film transistors 410 and 420 are also referred to as inverted staggered thin film transistors. The thin film transistor 410 is placed in a driver circuit in the semiconductor device. On the other hand, the thin film transistor 420 is placed in a pixel. First, a structure of the thin film transistor 410 placed in the driver circuit in the semiconductor device will be described.

The thin film transistor 410 includes a gate electrode layer 411; a first gate insulating layer 402a; a second gate insulating layer 402b; an oxide semiconductor layer 412 including at least a channel formation region 413, a high-resistance source region 414a, and a high-resistance drain region 414b; a source electrode layer 415a; and a drain electrode layer 415b over a substrate 400 having an insulating surface. Moreover, an oxide insulating layer 416 that covers the thin film transistor 410 and is in contact with the channel formation region 413 is provided.

The high-resistance source region 414a is formed in contact with a bottom surface of the source electrode layer 415a in a self-aligned manner. The high-resistance drain region 414b is formed in contact with a bottom surface of the drain electrode layer 415b in a self-aligned manner. The channel formation region 413 is in contact with the oxide insulating layer 416, has a small thickness, and is a region with higher resistance than that of the high-resistance source region 414a and the high-resistance drain region 414b (an i-type region).

In order to make the resistance of a wiring lower in the thin film transistor 410, a metal material is preferably used for the source electrode layer 415a and the drain electrode layer 415b.

In addition, when a pixel portion and a driver circuit are formed over the same substrate in a liquid crystal display device, only one of positive voltage or negative voltage is applied between a source electrode and a drain electrode of a thin film transistor included in a logic gate and a thin film transistor included in an analog circuit in the driver circuit. Examples of the logic circuit are an inverter circuit, a NAND circuit, a NOR circuit, and a latch circuit. Examples of the analog circuit are a sense amplifier, a constant voltage generation circuit, and a VCO. Consequently, the width of the high-resistance drain region 414b which needs high withstand voltage may be designed to be larger than the width of the high-resistance source region 414a. Moreover, the width of a region of each of the high-resistance source region 414a and the high-resistance drain region 414b which overlaps with the gate electrode layer 411 may be increased.

The thin film transistor 410 placed in the driver circuit is described using a single-gate thin film transistor; a multi-gate thin film transistor including a plurality of channel formation regions can be formed when needed.

Furthermore, a conductive layer 417 is provided above the channel formation region 413 so as to overlap with the channel formation region 413. The conductive layer 417 is electrically connected to the gate electrode layer 411 so that the conductive layer 417 and the gate electrode layer 411 have the same electric potential, whereby a gate voltage can be applied from the upper side and lower side of the oxide semiconductor layer 412 placed between the gate electrode layer 411 and the conductive layer 417. When the gate electrode layer 411 and the conductive layer 417 are made to have different potentials, for example, one of them has a fixed potential, a GND potential, or 0 V, electrical characteristics of the TFT, such as the threshold voltage, can be controlled.

Further, a protective insulating layer 403 and a planarization insulating layer 404 are stacked between the conductive layer 417 and the oxide insulating layer 416.

The protective insulating layer 403 is preferably in contact with the first gate insulating layer 402a provided below the protective insulating layer 403 or an insulating film serving as a base, and blocks entry of impurities such as moisture, a hydrogen ion, and OH⁻ from a side surface of the substrate. It is particularly effective to use a silicon nitride film as the first gate insulating layer 402a or the insulating film serving as a base, which is in contact with the protective insulating layer 403.

Next, a structure of the channel protective thin film transistor 420 placed in the pixel will be described.

The thin film transistor 420 includes a gate electrode layer 421, the first gate insulating layer 402a, the second gate insulating layer 402b, an oxide semiconductor layer 422 including a channel formation region, an oxide insulating layer 426 functioning as a channel protection layer, a source electrode layer 425a, and a drain electrode layer 425b over the substrate 400 having an insulating surface. Moreover, the protective insulating layer 403 is provided so as to cover the thin film transistor 420 and to be in contact with the oxide insulating layer 426, the source electrode layer 425a, and the drain electrode layer 425b, and the planarization insulating layer 404 is stacked over the protective insulating layer 403. A pixel electrode layer 427 is provided over the planarization insulating layer 404 to be in contact with the drain electrode layer 425b, and thus is electrically connected to the thin film transistor 420.

In order to form the oxide semiconductor layer 422, heat treatment (heat treatment for dehydration or dehydrogenation) for reducing impurities such as moisture is performed at least after a semiconductor film is deposited to form the oxide semiconductor layer 422. Reduction of the carrier concentration of the oxide semiconductor layer 422, for example, by formation of the oxide insulating layer 426 in contact with the oxide semiconductor layer 422 after the heat treatment for dehydration or dehydrogenation and slow cooling leads to improvement in the electrical characteristics and reliability of the thin film transistor 420.

The channel formation region of the thin film transistor 420 placed in the pixel is a region of the oxide semiconductor layer 422, which is in contact with the oxide insulating layer 426 which is a channel protection layer and overlaps with the gate electrode layer 421. Since the thin film transistor 420 is protected by the oxide insulating layer 426, the oxide semiconductor layer 422 can be prevented from being etched in an etching step for forming the source electrode layer 425a and the drain electrode layer 425b.

In order to realize a display device with a high aperture ratio, a light-transmitting conductive film is used for the source electrode layer 425a and the drain electrode layer 425b so that the thin film transistor 420 can serve as a light-transmitting thin film transistor.

Moreover, a light-transmitting conductive film is also used for the gate electrode layer 421 in the thin film transistor 420.

In the pixel in which the thin film transistor 420 is placed, a conductive film that transmits visible light is used for the pixel electrode layer 427 or another electrode layer (e.g., a capacitor electrode layer) or another wiring layer (e.g., a capacitor wiring layer), which realizes a display device with a high aperture ratio. Needless to say, it is preferable to use a conductive film that transmits visible light for the first gate insulating layer 402a, the second gate insulating layer 402b, and the oxide insulating layer 426.

In this specification, a film that transmits visible light refers to a film whose transmittance of visible light is 75% to 100%. In the case where such a film has conductivity, it is also referred to as a transparent conductive film. A conductive film that is semi-transparent to visible light may be used as metal oxide for the gate electrode layer, the source electrode layer, the drain electrode layer, the pixel electrode layer, another electrode layer, or another wiring layer. Semi-transparency to visible light means that the visible light transmittance is 50% to 75%.

Steps for manufacturing the thin film transistor 410 and the thin film transistor 420 over one substrate will be described below with reference to FIGS. 38A to 38F and FIGS. 39A to 39E. Cross-sectional structures illustrated in these drawings correspond to the cross-sectional structure in FIG. 37B.

Figure 38A:
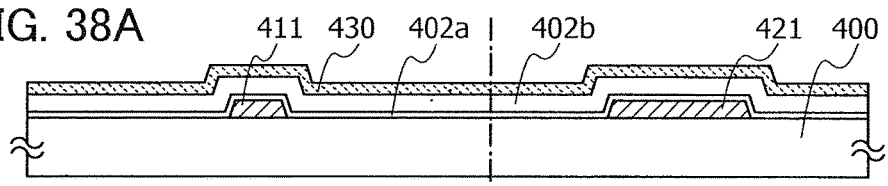
FIGS. 38A to 38F are cross-sectional views illustrating an example of a method for manufacturing a display device.
Figure 38B:
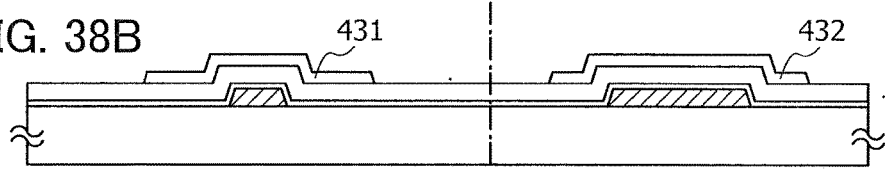

First, as illustrated in FIG. 38A, a light-transmitting conductive film is formed over the substrate 400 having an insulating surface, and then the gate electrode layers 411 and 421 are formed in a first photolithography step. Moreover, a capacitor wiring layer is formed in a pixel portion in the first photolithography step for the light-transmitting conductive film. Furthermore, when a capacitor is necessary in a driver circuit in addition to in the pixel portion, the capacitor wiring layer is also formed in the driver circuit. Note that a resist mask may be formed by an ink-jet method. A photomask is not used when the resist mask is formed by an ink-jet method, which results in reducing manufacturing costs.

Although there is no particular limitation on a substrate that can be used as the substrate 400 having an insulating surface, the substrate needs to have heat resistance high enough to withstand at least heat treatment to be performed later. For the substrate 400 having an insulating surface, a substrate formed using an insulator, such as a glass substrate, a ceramic substrate, a quartz substrate, or a sapphire substrate, can be used.

An insulating film serving as a base film may be provided between the substrate 400 and the gate electrode layers 411 and 421. The base film has a function of preventing diffusion of an impurity element from the substrate 400, and can be formed with a single-layer structure or a layered structure using one or more of a silicon nitride film, a silicon oxide film, a silicon nitride oxide film, and a silicon oxynitride film.

A conductive material that transmits visible light can be used as a material for the gate electrode layers 411 and 421 and the capacitor wiring in the pixel portion and the like. For example, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, or a Zn—O-based metal oxide can be used. The thickness of the gate electrode layers 411 and 421 and the capacitor wiring in the pixel portion and the like is determined as appropriate within the range of 50 nm to 300 nm. As a deposition method of the metal oxide used for the gate electrode layers 411 and 421, a sputtering method, a vacuum evaporation method (e.g., an electron beam evaporation method), an arc discharge ion plating method, or a spray method is used. In the case where a sputtering method is used, it is preferable that deposition be performed using a target containing $SiO_2$ at 2 to 10 percent by weight, and $SiO_x$ (x>0), which inhibits crystallization, be contained in the light-transmitting conductive film so that crystallization is suppressed when the heat treatment for dehydration or dehydrogenation is performed in a later step.

Next, a gate insulating layer is formed over the gate electrode layers 411 and 421.

The gate insulating layer can be formed with a single-layer structure or a layered structure of a silicon oxide layer, a silicon nitride layer, a silicon oxynitride layer, and/or a silicon nitride oxide layer by a plasma CVD method, a sputtering method, or the like. For example, a silicon oxynitride layer may be formed using $SiH_4$, oxygen, and nitrogen as a deposition gas by a plasma CVD method.

In this embodiment, a two-layer gate insulating layer including the first gate insulating layer 402a with a thickness of 50 nm to 200 nm and the second gate insulating layer 402b with a thickness of 50 nm to 300 nm is formed as illustrated in FIG. 38A. For the first gate insulating layer 402a, a 100-nm-thick silicon nitride film or a 100-nm-thick silicon nitride oxide film is used. For the second gate insulating layer 402b, a 100-nm-thick silicon oxide film is used.

An oxide semiconductor film 430 with a thickness of 2 nm to 200 nm is formed over the second gate insulating layer 402b. The crystalline structure of the oxide semiconductor film 430 is an amorphous structure.

In this embodiment, heat treatment for dehydration or dehydrogenation is performed after the oxide semiconductor film 430 is formed. In order to keep the amorphous structure of the oxide semiconductor film 430 after the heat treatment, the oxide semiconductor film 430 preferably has a small thickness of less than or equal to 50 nm. The small thickness of the oxide semiconductor film 430 can prevent crystallization due to heat treatment after the formation of the oxide semiconductor film 430.

Note that before the oxide semiconductor film 430 is formed by a sputtering method, dust attached to a surface of the second gate insulating layer 402b is preferably removed by reverse sputtering in which plasma is generated by introduction of an argon gas. The reverse sputtering refers to a method in which, without application of a voltage to a target side, an RF power source is used for application of a voltage to a substrate side in an argon atmosphere so that plasma is generated around the substrate to modify a surface. Note that sputtering may be performed in an atmosphere of nitrogen, helium, oxygen, or the like instead of argon.

As the oxide semiconductor film 430, an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film is used. In this embodiment, the oxide semiconductor film 430 is formed by a sputtering method with the use of an In—Ga—Zn—O-based oxide semiconductor target. Alternatively, the oxide semiconductor film 430 can be formed by a sputtering method in a rare gas (typically argon) atmosphere, an oxygen atmosphere, or an atmosphere containing a rare gas (typically argon) and oxygen. When a sputtering method is employed, it is preferable that deposition be performed using a target containing $SiO_2$ of 2 to 10 percent by weight and SiOx (x>0) which inhibits crystallization be contained in the oxide semiconductor film 430 so as to prevent crystallization at the time of the heat treatment for dehydration or dehydrogenation in a later step.

Then, the oxide semiconductor film 430 is processed into island-shaped oxide semiconductor layers in a second photolithography step. In addition, the resist mask for forming the island-like oxide semiconductor layers may be formed by an ink-jet method. A photomask is not used when the resist mask is formed by an ink-jet method, which results in reducing manufacturing costs.

Next, the oxide semiconductor layer is subjected to dehydration or dehydrogenation. A temperature at which first heat treatment for dehydration or dehydrogenation is performed is higher than or equal to 350° C. and less than the strain point of the substrate, preferably higher than or equal to 400° C. Here, the substrate is put in an electric furnace which is a kind of heat treatment apparatus and heat treatment is performed on the oxide semiconductor layers in a nitrogen atmosphere, the oxide semiconductor layer is not exposed to the air until the oxide semiconductor layer is cooled to a predetermined temperature or lower so that water and hydrogen are prevented from being mixed into the oxide semiconductor layers again; thus, oxide semiconductor layers 431 and 432 are obtained (see FIG. 38B). In this embodiment, after the heat treatment is performed at a temperature T in an electric furnace in a nitrogen atmosphere for performing dehydration or dehydrogenation on the oxide semiconductor layer, the substrate is cooled slowly to a temperature low enough to prevent water from coming in (specifically to a temperature more than 100° C. lower than the temperature T). Without limitation to a nitrogen atmosphere, the heat treatment can be performed in an atmosphere such as helium, neon, or argon.

Note that in the first heat treatment, it is preferable that water, hydrogen, and the like be not contained in the atmosphere of nitrogen or a rare gas such as helium, neon, or argon. In addition, nitrogen or a rare gas such as helium, neon, or argon which is introduced into a heat treatment apparatus preferably has a purity of 6N (99.9999%) or higher, more preferably 7N (99.99999%) or higher (i.e., the concentration of impurities is 1 ppm or lower, preferably 0.1 ppm or lower).

In accordance with conditions of the first heat treatment or a material of the oxide semiconductor layer, the oxide semiconductor layer is crystallized and changed to a microcrystalline film or a polycrystalline film in some cases.

The first heat treatment of the oxide semiconductor layer may be performed on the oxide semiconductor film 430 before being processed into the island-shaped oxide semiconductor layers. In this case, after the first heat treatment, the substrate is taken out from the heat treatment apparatus and a photolithography step is performed.

Before the oxide semiconductor film 430 is deposited, the gate insulating layer may be subjected to heat treatment (400° C. or higher and lower than the strain point of the substrate) in an inert gas atmosphere (e.g., nitrogen, helium, neon, or argon) or an oxygen atmosphere to remove impurities such as hydrogen and water included in the layer.

Figure 38C:
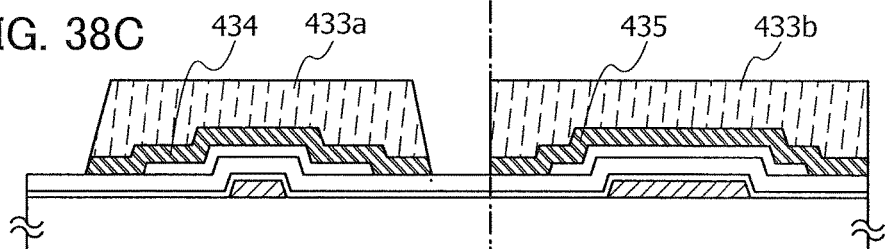

Next, a metal conductive film is formed over the second gate insulating layer 402b and the oxide semiconductor layers 431 and 432; after that, in a third photolithography step, resist masks 433a and 433b are formed and the metal conductive film is selectively etched, so that metal electrode layers 434 and 435 are formed (see FIG. 38C).

Examples of the material for the metal conductive film are an element selected from Al, Cr, Cu, Ta, Ti, Mo, and W; an alloy containing any of these elements as a component; and an alloy containing any of these elements in combination. The metal conductive film preferably has a three-layer structure in which an aluminum layer is stacked over a titanium layer and a titanium layer is stacked over the aluminum layer, or a three layer structure in which an aluminum layer is stacked over a molybdenum layer and a molybdenum layer is stacked over the aluminum layer. It is needless to say that the metal conductive film can be a single-layer structure, a two-layer structure, or a layered structure including four or more layers.

The resist masks 433a and 433b for forming the metal electrode layers 434 and 435 may be formed by an ink-jet method. A photomask is not used when the resist masks 433a and 433b are formed by an ink-jet method, which results in reducing manufacturing costs.

Figure 38D:
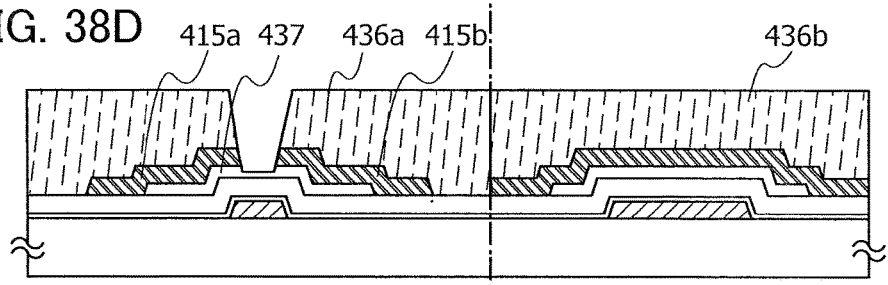

Then, the resist masks 433a and 433b are removed, and in a fourth photolithography step, resist masks 436a and 436b are formed and selective etching is performed to form a source electrode layer 415a and a drain electrode layer 415b (see FIG. 38D). Note that in the fourth photolithography step, only part of the oxide semiconductor layer 431 is etched, whereby an oxide semiconductor layer 437 having a groove (a recessed portion) is formed. The resist masks 436a and 436b for forming the groove (the recessed portion) in the oxide semiconductor layer 431 may be formed by an ink-jet method. A photomask is not used when the resist mask is formed by an ink jet method, which results in reducing manufacturing costs.

Figure 38E:
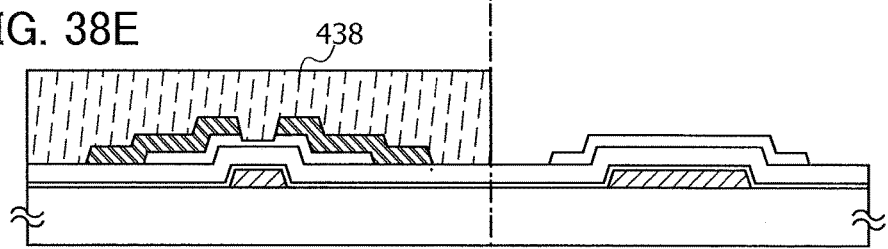

Next, the resist masks 436a and 436b are removed, and in a fifth photolithography step, a resist mask 438 for covering the oxide semiconductor layer 437 is formed and the metal electrode layer 435 over the oxide semiconductor layer 432 is removed (see FIG. 38E).

Note that in order to remove the metal electrode layer 435 overlapping with the oxide semiconductor layer 432 in the fifth photolithography step, the materials of the oxide semiconductor layer 432 and the metal electrode layer 435 and the etching conditions are adjusted as appropriate so that the oxide semiconductor layer 432 is not removed in etching of the metal electrode layer 435.

Figure 38F:
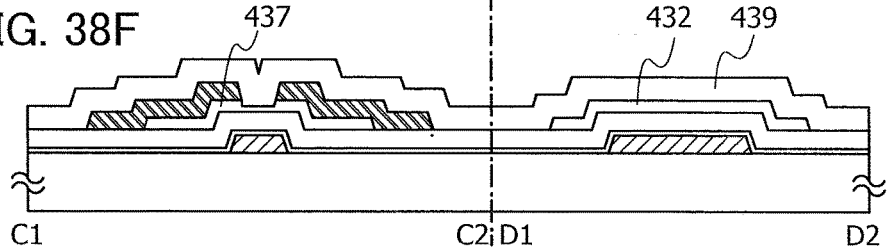

After the resist mask 438 is removed, an oxide insulating film 439 is formed in contact with an upper surface and side surfaces of the oxide semiconductor layer 432 and the groove (the recessed portion) of the oxide semiconductor layer 437 as illustrated in FIG. 38F. The oxide insulating film 439 serves as a protective insulating film.

The oxide insulating film 439 has a thickness of at least 1 nm and can be formed by a method by which impurities such as water or hydrogen are not mixed into the oxide insulating film 439, such as a sputtering method, as appropriate. In this embodiment, a 300-nm-thick silicon oxide film is formed as the oxide insulating film 439 by a sputtering method. The substrate temperature in the film formation may be higher than or equal to room temperature and lower than or equal to 300° C., and is set at 100° C. in this embodiment. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target can be used. For example, with the use of a silicon target, a silicon oxide film can be formed by a sputtering method in an atmosphere of oxygen and nitrogen. The oxide insulating film 439 which is formed in contact with the oxide semiconductor layers 432 and 437 whose resistance is reduced is formed using an inorganic insulating film that does not contain impurities such as moisture, a hydrogen ion, and OH⁻ and blocks entry of such impurities from the outside, typically a silicon oxide film, a silicon nitride oxide film, an aluminum oxide film, or an aluminum oxynitride film.

Next, second heat treatment (preferably at 200° C. to 400° C., for example, 250° C. to 350° C.) is performed in an inert gas atmosphere or an oxygen gas atmosphere. For example, the second heat treatment is performed at 250° C. for one hour in a nitrogen atmosphere. With the second heat treatment, heating is performed with the groove in the oxide semiconductor layer 437 and the upper surface and side surfaces of the oxide semiconductor layer 432 in contact with the oxide insulating film 439.

Figure 39A:
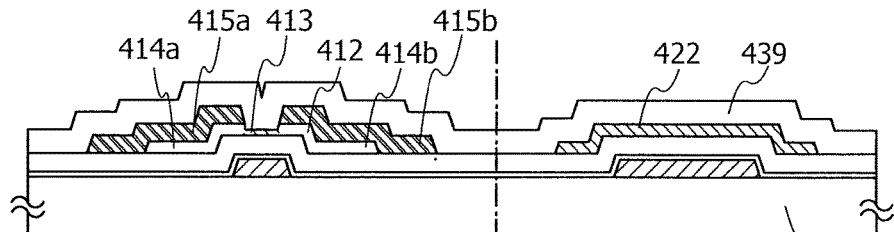
FIGS. 39A to 39E are cross-sectional views illustrating an example of a method for manufacturing a display device.

FIG. 39A illustrates a state after the second heat treatment. In FIG. 39A, an oxide semiconductor layer 412 is the oxide semiconductor layer 437 subjected to the second heat treatment, and the oxide semiconductor layer 422 is the oxide semiconductor layer 432 subjected to the second heat treatment.

Through the above steps, the oxide semiconductor film 430 after deposition is subjected to the first heat treatment for dehydration or dehydrogenation, and the second heat treatment in an inert gas atmosphere or an oxygen gas atmosphere.

Thus, the high-resistance source region 414a is formed in a self-aligned manner in a region of the oxide semiconductor layer 412 overlapping with the source electrode layer 415a. The high-resistance drain region 414b is formed in a self-aligned manner in a region of the oxide semiconductor layer 412 overlapping with the drain electrode layer 415b. The entire region of the oxide semiconductor layer 412 overlapping with the gate electrode layer 411 is an i-type region and serves as the channel formation region 413. Moreover, the entire oxide semiconductor layer 432 is made to be in an oxygen-excess state with the second heat treatment, so that the oxide semiconductor layer 422 that is highly resistive as a whole (i.e., the i-type oxide semiconductor layer 422) is formed.

After the second heat treatment, if heat treatment is performed in a nitrogen or inert gas atmosphere or under reduced pressure with the oxide semiconductor layer 422 exposed, the resistance of the high-resistance (i-type) oxide semiconductor layer 422 is reduced. For that reason, in the steps after the second heat treatment, heat treatment performed with the oxide semiconductor layer 422 exposed is performed in an oxygen gas or N₂O gas atmosphere or an ultra-dry air (with a dew point of −40° C. or lower, preferably −60° C. or lower).

Note that the high-resistance drain region 414b (or the high-resistance source region 414a) is formed in the oxide semiconductor layer 412 overlapping with the drain electrode layer 415b (and the source electrode layer 415a), so that the reliability of the driver circuit including the thin film transistor 410 can be increased. Specifically, with the formation of the high-resistance drain region 414b, the conductivity can vary from the drain electrode layer 415b to the high-resistance drain region 414b and the channel formation region 413. Thus, when the thin film transistor 410 is operated while the drain electrode layer 415b is connected to a wiring that supplies a high power supply potential VDD, even when a high electric field is applied between the gate electrode layer 411 and the drain electrode layer 415b, the high-resistance drain region 414b serves as a buffer and the high electric field is not applied locally, so that the thin film transistor 410 can have increased withstand voltage.

The high-resistance drain region 414b (or the high-resistance source region 414a) is formed in the oxide semiconductor layer 412 overlapping with the drain electrode layer 415b (or the source electrode layer 415a), whereby leakage current in the channel formation region 413 can be reduced even when the thin film transistor 410 is provided in the driver circuit.

Figure 39B:
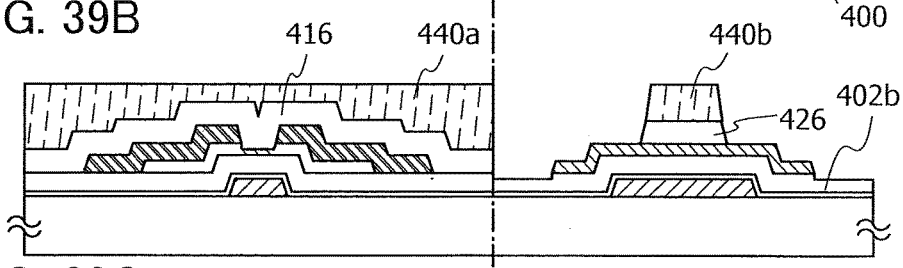

Then, in a sixth photolithography step, resist masks 440a and 440b are formed and the oxide insulating film 439 is selectively etched to form the oxide insulating layers 416 and 426 as illustrated in FIG. 39B. The oxide insulating layer 426 covers a region where the channel formation region is formed in the oxide semiconductor layer 422, and functions as a channel protective layer. Note that when an oxide insulating layer is used as the second gate insulating layer 402b as in this embodiment, part of the second gate insulating layer 402b is also etched in the etching step of the oxide insulating film 439, whereby the thickness of the second gate insulating layer 402b is reduced in some cases. When a nitride insulating film that has high selectivity to the oxide insulating film 439 is used as the second gate insulating layer 402b, the second gate insulating layer 402b can be prevented from being thinned by etching.

Figure 39C:
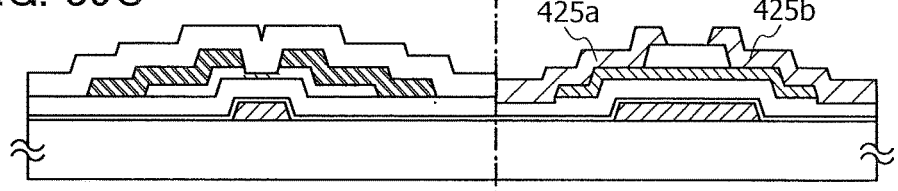

Next, the resist masks 440a and 440b are removed, and after that, a light-transmitting conductive film is formed over the oxide semiconductor layer 422 and the oxide insulating layer 426. Then, in a seventh photolithography step, a resist mask is formed and the light-transmitting conductive film is etched using the resist mask, so that the source electrode layer 425a and the drain electrode layer 425b are formed as illustrated in FIG. 39C. The resist mask is removed after the etching step.

As a deposition method of the light-transmitting conductive film, a sputtering method, a vacuum evaporation method (e.g., an electron beam evaporation method), an arc ion plating method, or a spray method can be used. As a material of the conductive film, a conductive material that transmits visible light, for example, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, or a Zn—O-based metal oxide can be employed. The thickness of the light-transmitting conductive film is set in the range of 50 nm to 300 nm as appropriate. In addition, in the case where a sputtering method is used, it is preferable that deposition be performed using a target containing $SiO_2$ at 2 to 10 percent by weight, and $SiO_x$ (x>0), which inhibits crystallization, be contained in the light-transmitting conductive film so that crystallization is suppressed when the heat treatment for dehydration or dehydrogenation is performed in a later step.

Note that the resist mask for forming the source electrode layer 425a and the drain electrode layer 425b may be formed by an ink-jet method instead of the photolithography step. A photomask is not used when the resist mask is formed by an ink-jet method, which results in reducing manufacturing costs.

Figure 39D:
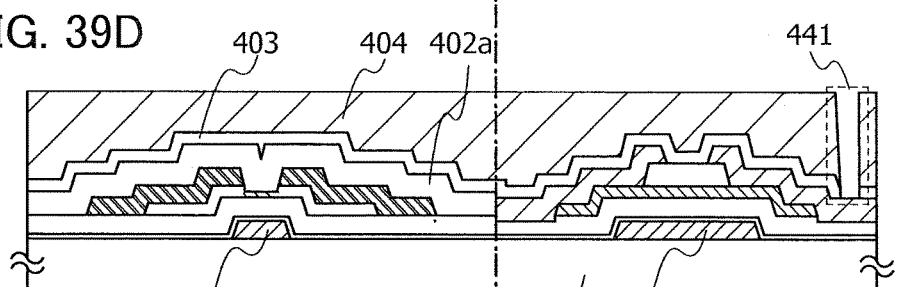

Then, as illustrated in FIG. 39D, the protective insulating layer 403 is formed over the oxide insulating layers 416 and 426, the source electrode layer 425a, and the drain electrode layer 425b. In this embodiment, a silicon nitride film is formed as the protective insulating layer 403 by an RF sputtering method. Since an RF sputtering method allows high productivity, it is preferably used for depositing the protective insulating layer 403. The protective insulating layer 403 is formed using an inorganic insulating film that does not contain impurities such as moisture, a hydrogen ion, and OH⁻ and blocks entry of such impurities, for example, a silicon nitride film, an aluminum nitride film, a silicon nitride oxide film, or an aluminum oxynitride film. Needless to say, the protective insulating layer 403 is a light-transmitting insulating film.

The protective insulating layer 403 is preferably in contact with the first gate insulating layer 402a provided below the protective insulating layer 403 or the insulating film serving as a base, and blocks entry of impurities such as moisture, a hydrogen ion, and OH⁻ from the vicinity of a side surface of the substrate 400. It is particularly effective to use a silicon nitride film as the first gate insulating layer 402a or the insulating film serving as a base, which is in contact with the protective insulating layer 403. In other words, when a silicon nitride film is provided so as to surround a lower surface, an upper surface, and a side surface of the oxide semiconductor layer, the reliability of the display device is improved.

Next, the planarization insulating layer 404 is formed over the protective insulating layer 403. The planarization insulating layer 404 can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer 404 may be formed by stacking a plurality of insulating films formed from these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the planarization insulating layer 404, and the following method or means can be employed depending on the material: a sputtering method, an SOG method, a spin coating method, a dipping method, a spray coating method, or a droplet discharge method (e.g., an ink jet method, screen printing, or offset printing); a doctor knife, a roll coater, a curtain coater, a knife coater, or the like.

Then, an eighth photolithography step is performed so that a resist mask is formed and a contact hole 441 that reaches the drain electrode layer 425b is formed by etching of the planarization insulating layer 404 and the protective insulating layer 403. Moreover, contact holes that reach the gate electrode layers 411 and 421 are also formed with that etching. Alternatively, a resist mask for forming the contact hole that reaches the drain electrode layer 425b may be formed by an ink-jet method. A photomask is not used when the resist mask is formed by an ink-jet method, which results in reducing manufacturing costs.

Next, the resist mask is removed, and then a light-transmitting conductive film is formed. The light-transmitting conductive film is formed using indium oxide ($In_2O_3$), an alloy of indium oxide and tin oxide ($In_2O_3$—$SnO_2$, referred to as ITO), or the like by a sputtering method, a vacuum evaporation method, or the like. Alternatively, the light-transmitting conductive film can be formed using an Al—Zn—O-based non-single-crystal film containing nitrogen (i.e., an Al—Zn—O—N-based non-single-crystal film), a Zn—O-based non-single-crystal film containing nitrogen, or an Sn—Zn—O-based non-single-crystal film containing nitrogen. Note that the percentage (at. %) of zinc in the Al—Zn—O—N-based non-single-crystal film is less than or equal to 47 at. % and is higher than that of aluminum in the non-single-crystal film; the percentage (at. %) of aluminum in the non-single-crystal film is higher than that of nitrogen in the non-single-crystal film. Such a material is etched with a hydrochloric acid-based solution. However, since a residue is easily generated particularly in etching ITO, indium oxide-zinc oxide alloy ($In_2O_3$—$ZnO$) may be used to improve the etching processability.

Note that the unit of the relative proportion in the light-transmitting conductive film is atomic percent (at. %), and the relative proportion is evaluated by analysis using an electron probe X-ray microanalyzer (EPMA).

Figure 39E:
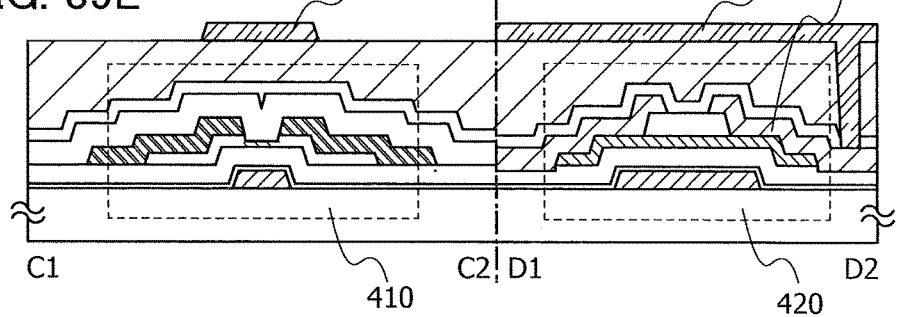

Next, a ninth photolithography step is performed so that a resist mask is formed and unnecessary portions are removed by etching, whereby the pixel electrode layer 427 and the conductive layer 417 are formed as illustrated in FIG. 39E. The pixel electrode layer 427 is electrically connected to the drain electrode layer 425b through the contact hole 441 formed in the planarization insulating layer 404 and the protective insulating layer 403.

Through the above-described steps, the driver circuit including the thin film transistor 410 and the pixel portion including the thin film transistor 420 can be manufactured over the same substrate 400 with the use of nine masks for light exposure. The thin film transistor 410 for the driver circuit is a channel-etched thin film transistor including the oxide semiconductor layer 412 including the high-resistance source region 414a, the high-resistance drain region 414b, and the channel formation region 413. The thin film transistor 420 for the pixel is a channel protection thin film transistor including the oxide semiconductor layer 422 which is entirely intrinsic.

In addition, a capacitor that is constituted by a capacitor wiring layer and a capacitor electrode with the first gate insulating layer 402a and the second gate insulating layer 402b used as dielectrics can be formed over the same substrate 400. The thin film transistors 420 and the capacitors are arranged in a matrix so as to correspond to individual pixels so that the pixel portion is formed, and the driver circuit including the thin film transistor 410 is placed around the pixel portion, whereby one of the substrates for manufacturing an active matrix display device can be obtained. In this specification, such a substrate is referred to as an active matrix substrate for convenience.

The pixel electrode layer 427 is electrically connected to a capacitor electrode layer. A contact hole for electrically connecting these two electrode layers is formed at the same time as the contact hole 441. Note that the capacitor electrode layer can be formed using the same light-transmitting material in the same step as the source electrode layer 425a and the drain electrode layer 425b.

The conductive layer 417 is provided so as to overlap with the channel formation region 413 in the oxide semiconductor layer 412, whereby the amount of change in threshold voltage of the thin film transistor 410 before and after a bias-temperature stress test (referred to as a BT test) for examining the reliability of a thin film transistor can be reduced. The potential of the conductive layer 417 may be the same or different from that of the gate electrode layer 411. The conductive layer 417 can also function as a second gate electrode layer. The potential of the conductive layer 417 may be GND or 0 V, or the conductive layer 417 may be in a floating state.

The resist mask for forming the conductive layer 417 and the pixel electrode layer 427 may be formed by an ink-jet method. A photomask is not used when the resist mask is formed by an ink-jet method, which results in reducing manufacturing costs.

Embodiment 8

In this embodiment, examples of an electronic device provided with a display device will be described.

FIGS. 40A to 40H and FIGS. 41A to 41D each illustrate an electronic device. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 40A:
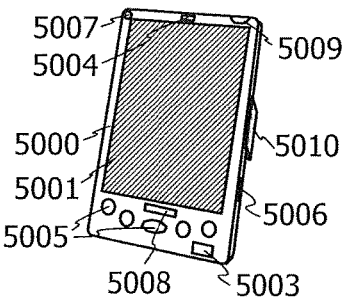
FIGS. 40A to 40H each illustrate an example of a structure of an electronic device.
Figure 40B:
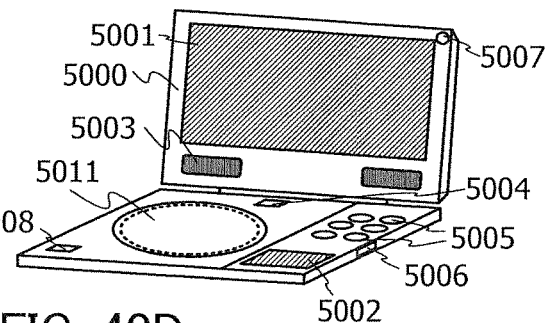
Figure 40C:
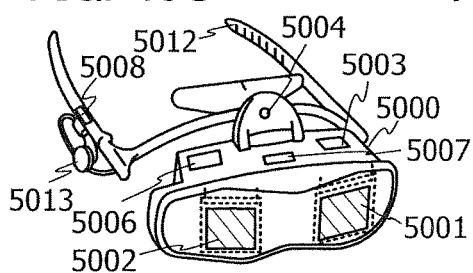
Figure 40D:
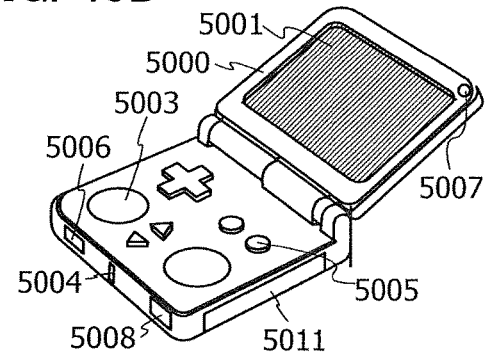
Figure 40E:
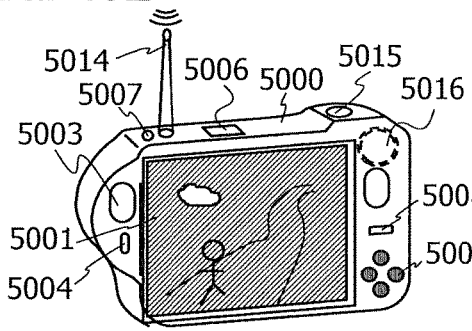
Figure 40F:
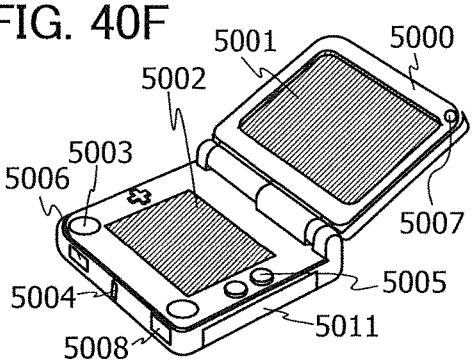
Figure 40G:
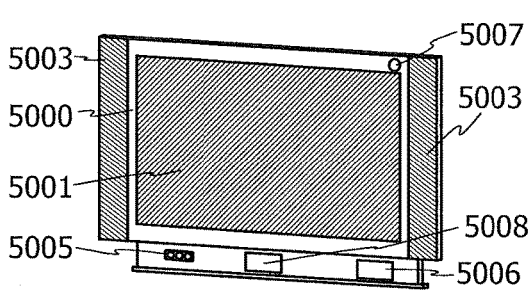
Figure 40H:
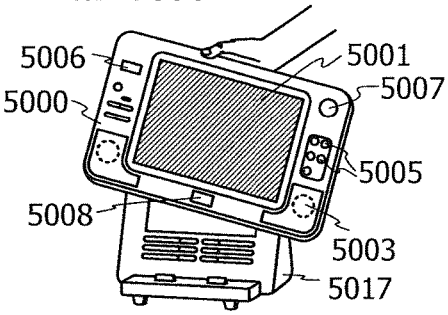

FIG. 40A illustrates a mobile computer which can include a switch 5009, an infrared port 5010, and the like in addition to the above objects. FIG. 40B illustrates a portable image reproducing device (e.g., a DVD reproducing device) provided with a memory medium. The portable image reproducing device can include a second display portion 5002, a recording medium reading portion 5011, and the like in addition to the above objects. FIG. 40C illustrates a goggle-type display which can include the second display portion 5002, a supporting portion 5012, an earphone 5013, and the like in addition to the above objects. FIG. 40D illustrates a portable game machine which can include the recording medium reading portion 5011 and the like in addition to the above objects. FIG. 40E illustrates a digital camera having a television reception function, which can include an antenna 5014, a shutter button 5015, an image receiver portion 5016, and the like in addition to the above objects. FIG. 40F illustrates a portable game machine which can include the second display portion 5002, the recording medium reading portion 5011, and the like in addition to the above objects. FIG. 40G illustrates a television receiver which can include a tuner, an image processing unit, and the like in addition to the above objects. FIG. 40H illustrates a portable television receiver which can include a charger 5017 that can transmit and receive signals and the like in addition to the above objects.

Figure 41A:
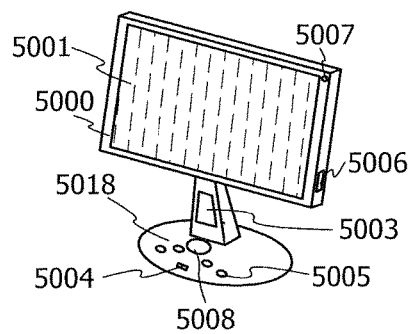
FIGS. 41A to 41D each illustrate an example of a structure of an electronic device, and FIGS. 41E to 41H each illustrate an application example of a display device.
Figure 41B:
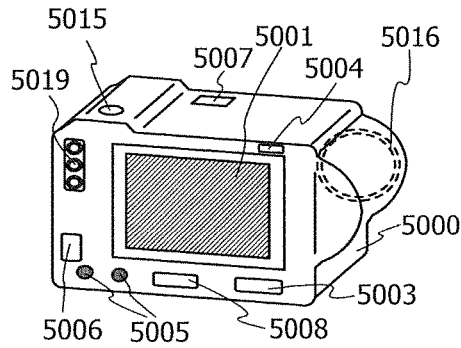
Figure 41C:
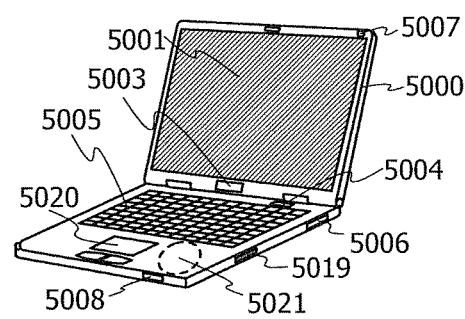
Figure 41D:
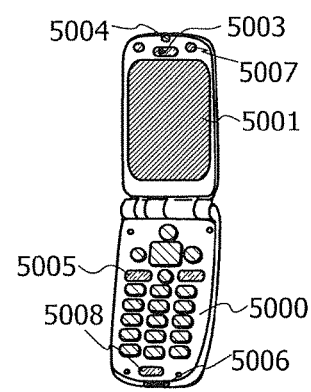

FIG. 41A illustrates a display which can include a support base 5018 and the like in addition to the above objects. FIG. 41B illustrates a camera which can include an external connection port 5019, the shutter button 5015, the image receiver portion 5016, and the like in addition to the above objects. FIG. 41C illustrates a computer which can include a pointing device 5020, the external connecting port 5019, a reader/writer 5021, and the like in addition to the above objects. FIG. 41D illustrates a mobile phone which can include a transmitting portion, a receiving portion, a tuner of one-segment partial reception service for mobile phones and mobile terminals ("1seg"), and the like in addition to the above objects.

The electronic devices illustrated in FIGS. 40A to 40H and FIGS. 41A to 41D can have a variety of functions. The electronic devices illustrated in FIGS. 40A to 40H and FIGS. 41A to 41D can have a variety of functions, for example, a function of displaying a variety of information (e.g., a still image, a moving image, and a text image) on a display portion; a touch panel function; a function of displaying a calendar, date, time, and the like; a function of controlling processing with a variety of software (programs); a wireless communication function; a function of being connected to a variety of computer networks with a wireless communication function; a function of transmitting and receiving a variety of data with a wireless communication function; and a function of reading a program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiver portion can have a function of shooting a still image, a function of shooting a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 40A to 40H and FIGS. 41A to 41D are not limited to those described above, and the electronic devices can have a variety of functions.

One of features of the electronic device described in this embodiment is that the electronic device includes a display portion for displaying some sort of information.

Next, application examples of a display device (a semiconductor device) will be described. First, an example where the display device (the semiconductor device) is applied to an object that does not move, for example, a building is described.

Figure 41E:
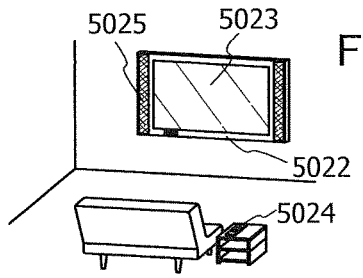

FIG. 41E illustrates an embodiment of a building into which the display device (the semiconductor device) is incorporated. The semiconductor device includes a housing 5022, a display portion 5023, a remote controller device 5024 which is an operation portion, a speaker 5025, and the like. The semiconductor device is incorporated into a wall in a living room as a wall-hung display device. Since such an embodiment does not need a large installation space, it is preferably used as a method for incorporating a semiconductor device including the large-screen display portion 5023 (of 40 inches or more) into a building.

Figure 41F:
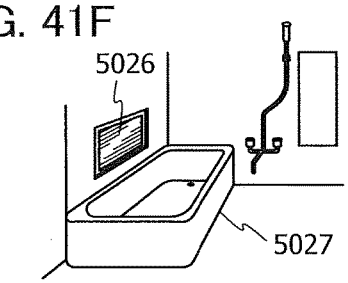

FIG. 41F illustrates an embodiment of a building into which the display device (the semiconductor device) is incorporated. The semiconductor device includes a display panel 5026. The display panel 5026 is integrated with into a prefabricated bath 5027, and a person who takes a bath can enjoy images on the display panel 5026.

Note that FIGS. 41E and 41F illustrate the examples in which the display device (the semiconductor device) is incorporated into a wall or a prefabricated bath; however, buildings in this embodiment are not limited to the above and the semiconductor device can be incorporated into a variety of places in buildings.

Next, examples of a structure of a moving object into which the display device (the semiconductor device) is incorporated will be described.

Figure 41G:
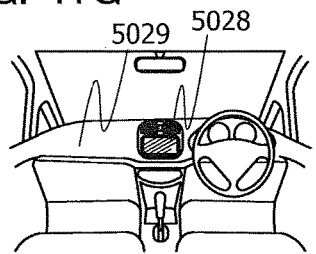

FIG. 41G illustrates an embodiment of a vehicle provided with the display device (the semiconductor device). The semiconductor device includes a display panel 5028. The display panel 5028 is provided in a body 5029 of the vehicle and can display information input from the operation of the body or the outside of the body on demand. Moreover, the semiconductor device may have a navigation function.

Figure 41H:
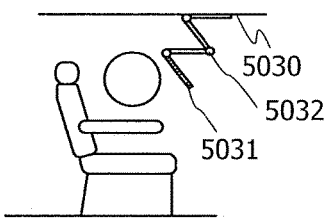

FIG. 41H illustrates an embodiment of a passenger plane provided with the display device (the semiconductor device). The semiconductor device includes a display panel 5031. The display panel 5031 is attached to a ceiling 5030 above a seat of the passenger plane through a hinge portion 5032. The display panel 5031 has a function of displaying information when operated by the passenger. FIG. 41H illustrates the display panel 5031 in use. The passenger can watch images on the display panel 5031 by extending and contracting the hinge portion 5032.

Note that FIGS. 41G and 41H illustrate examples of a vehicle and a passenger plane as moving objects; however, this embodiment is not limited thereto and can be provided to a variety of moving objects such as a two-wheeled motor vehicle, a four-wheeled vehicle (including a car, a bus, a truck, and the like), a train, a ship, and a plane.

Embodiment 9

In this embodiment, the semiconductor device, the display device, and the like according to the invention disclosed in this specification will be described.

In this specification, a display device corresponds to a device including a display element. The display device to which the invention disclosed in this specification is applied includes a display medium whose contrast, luminance, reflectivity, transmittance, or the like changes by electromagnetic action. Examples of a display element included in the display device disclosed in this specification are an EL (electroluminescence) element (e.g., an EL element including organic and inorganic materials, an organic EL element, and an inorganic EL element), an LED (e.g., a white LED, a red LED, a green LED, and a blue LED), a transistor (a transistor that emits light depending on the amount of current), an electron emitter, a liquid crystal element, electronic ink, an electrophoretic element, a grating light valve (GLV), a plasma tube, a digital micromirror device (DMD), a piezoelectric ceramic display, and a carbon nanotube. An example of a display devices including EL elements is an EL display. Examples of display devices including electron emitters are a field emission display (FED) and an SED-type flat panel display (SED: surface-conduction electron-emitter display). Examples of display devices having liquid crystal elements are a liquid crystal display device (e.g., a transmissive liquid crystal display device, a transflective liquid crystal display device, a reflective liquid crystal display device, a direct-view liquid crystal display device, and a projection liquid crystal display). Examples of display devices having electronic ink or electrophoretic elements are electronic paper. Note that a device including a light-emitting element that emits light, such as an EL element or an LED, is sometimes referred to as a display device or a light-emitting device. A light-emitting device including a light-emitting element as a display element is a specific example of a display device.

Examples of an EL element are an element including an anode, a cathode, and an EL layer sandwiched between the anode and the cathode. Examples of an EL layer are a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed using an organic material, a layer formed using an inorganic material, a layer formed using an organic material and an inorganic material, a layer including a high-molecular material, a layer including a low-molecular material, and a layer including a high-molecular material and a low-molecular material. Note that various types of EL elements can be used without limitation to the above.

Examples of an electron emitter are an element in which electrons are extracted by high electric field concentration on a cathode, and the like. Specifically, examples of an electron emitter are a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a thin film type in which a metal, an insulator, a semiconductor, and a metal are stacked, a HEED type, an EL type, a porous silicon type, and a surface-conduction (SCE) type. Note that various elements can be used as an electron emitter without limitation to the above.

In this specification, a liquid crystal display device means a display device having a liquid crystal element. Liquid crystal display devices are classified into a direct-view liquid crystal display, a projection type liquid crystal display, and the like according to a method for displaying images. Moreover, liquid crystal display devices can be classified into a transmissive liquid crystal display device, a reflective liquid crystal display device, and a transflective liquid crystal display device according to whether a pixel transmits or reflects illumination light. An example of a liquid crystal element is an element that controls transmission and non-transmission of light by optical modulation action of liquid crystals. The element can include a pair of electrodes and a liquid crystal layer. The optical modulation action of liquid crystals is controlled by an electric field applied to the liquid crystal (including a lateral electric field, a vertical electric field, and a diagonal electric field). Examples of a liquid used for a liquid crystal element are a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, and a banana-shaped liquid crystal.

Examples of a method for displaying a liquid crystal display device are a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer Network liquid crystal) mode, a guest-host mode, and a blue phase mode.

It is needless to say that, without limitation to the above-described examples of the structure, liquid crystal display devices with a variety of structures can be applied to the invention disclosed in this specification.

For example, a device for displaying images by molecules (a device that utilizes optical anisotropy, dye molecular orientation, or the like), a device for displaying images by particles (a device that utilizes electrophoresis, particle movement, particle rotation, phase change, or the like), a device for displaying images by movement of one end of a film, a device for displaying images by using coloring properties or phase change of molecules, a device for displaying images with the use of optical absorption by molecules, a device for displaying images by using self-light emission by combination of electrons and holes, or the like can be used as electronic paper. Specifically, examples of electronic paper are microcapsule electrophoresis, horizontal electrophoresis, vertical electrophoresis, a spherical twisting ball, a magnetic twisting ball, a columnar twisting ball, a charged toner, electro liquid powder, magnetic electrophoresis, a magnetic thermosensitive type, electro wetting, light-scattering (transparent-opaque change), a cholesteric liquid crystal and a photoconductive layer, a cholesteric liquid crystal, a bistable nematic liquid crystal, a ferroelectric liquid crystal, a liquid crystal dispersed type with a dichroic dye, a movable film, coloring and decoloring properties of a leuco dye, photochromism, electrochromism, electrodeposition, and flexible organic EL. Note that various types of electronic papers can be used without limitation to those described above. By using microcapsule electrophoresis, problems of electrophoresis, that is, aggregation or precipitation of phoresis particles can be solved. Electro liquid powder has advantages such as high-speed response, high reflectivity, wide viewing angle, low power consumption, and memory properties.

Examples of a plasma display panel are a plasma display panel that has a structure where a substrate having a surface provided with an electrode faces a substrate having a surface provided with an electrode and a minute groove in which a phosphor layer is formed at a narrow interval and a rare gas is sealed therein, and a plasma display panel that has a structure where a plasma tube is sandwiched between film-form electrodes from the top and the bottom. The plasma tube is formed by sealing a discharge gas, RGB fluorescent materials, and the like inside a glass tube. Note that display can be performed by applying voltage between the electrodes to generate an ultraviolet ray so that a phosphor emits light. Without limitation to the above-described examples of the structure, plasma displays with a variety of structures can be applied to the invention disclosed in this specification.

Some display devices need a lighting device. Examples of such display devices are a liquid crystal display device, a display device using a grating light valve (GLV), and a display device using a digital micromirror device (DMD). A lighting device including an EL Element, a cold cathode fluorescent lamp, a hot cathode fluorescent lamp, an LED, a laser light source, a mercury lamp, or the like can be used as a lighting device.

Further, an example of a display device is a display device including a plurality of pixels each having a display element. In this case, the display device may include a peripheral driver circuit for driving the plurality of pixels. A peripheral driver circuit in the display device may be a circuit formed over a substrate where the plurality of pixels are formed or a circuit formed over a different substrate. Both of these circuits can be provided as peripheral driver circuits. An example of the circuit formed over a different substrate from pixels is a circuit placed over a substrate where the pixels are formed by wire bonding, bump bonding, or the like, that is, an IC chip connected by chip on glass (COG), TAB, or the like.

When some of the circuits are formed over a substrate where a pixel portion is formed, costs can be reduced by reduction in the number of component parts or the reliability can be improved by reduction in the number of connections between circuit components. Specifically, a circuit in a portion where a driving voltage is high, a circuit in a portion where a driving frequency is high, or the like might consume much power. In order to deal with it, such a circuit is formed over a substrate (e.g., a single crystal substrate) which is different from a substrate where the pixel portion is formed, so that an IC chip is formed. By the use of this IC chip, an increase in power consumption can be prevented.

In addition, the display device may include a flexible printed circuit (FPC) to which an IC chip, a resistor, a capacitor, an inductor, a transistor, or the like is attached. The display device may include a printed wiring board (PWB) that is connected through a flexible printed circuit (FPC) and provided with an IC chip, a resistor, a capacitor, an inductor, a transistor, or the like. The display device may include an optical sheet such as a polarizing plate or a retardation plate. The display device may also include a lighting device, a housing, an audio input and output device, a light sensor, or the like.

In this specification, one pixel means one element capable of controlling brightness. For example, one pixel corresponds to one color element and brightness is expressed with the one color element. Therefore, in the case of a color display device including color elements of R (red), G (green), and B (blue), a minimum unit of an image is composed of three pixels of an R pixel, a G pixel, and a B pixel. Note that the color elements are not limited to having three colors, and color elements of more than three colors may be used or a color other than RGB may be added. For example, white may be added so that R, G, B, and W (W means white) can be used. One or more colors of yellow, cyan, magenta, emerald green, and vermilion, for example, and the like can be added to RGB. Moreover, a color similar to at least one of R, G and B can be added to RGB. For example, R, B1, and B2 may be used. Although both B1 and B2 are blue, they have slightly different wavelengths. Similarly, R1, R2, G, and B can be used. By using such color elements, display that is closer to the real object can be performed or power consumption can be reduced.

In the case where one color element is controlled in brightness by using a plurality of regions, one region can correspond to one pixel. For example, when area ratio gray scale display is performed or subpixels are included, a plurality of regions that control brightness are provided in one color element and gray scales are expressed with all the regions in some cases. In that case, one region for controlling brightness can correspond to one pixel. That is, one color element is composed of a plurality of pixels. Note that even when a plurality of regions that control brightness are placed in one color element, they may be collectively referred to as one pixel. In this case, one color element is composed of one pixel. When brightness of one color element is controlled with a plurality of regions, regions that contribute to display may differ in size depending on pixels. Moreover, in the plurality of regions for controlling the brightness of one color element, the viewing angle may be expanded by supplying each pixel with a slightly different signal. In other words, potentials of pixel electrodes in a plurality of regions may be different from each other in one color element. Thus, voltages applied to display elements including liquid crystal molecules or the like vary between the pixel electrodes. As a result, the viewing angle of the liquid crystal display device can be widened. Furthermore, the size of regions that contribute to display may vary between color elements. Thus, power consumption can be reduced or the life of a display element can be prolonged.

In the case where the explicit description "one pixel (for three colors)" is used, three pixels of R, G, and B can be considered as one pixel. In the case where the explicit description "one pixel (for one color)" is used, a plurality of regions provided in one color element can be collectively considered as one pixel.

A plurality of pixels can be arranged (aligned) in a matrix, for example. Here, "pixels are arranged (aligned) in a matrix" is not limited to the case where pixels are arranged over a straight line in a vertical direction or a horizontal direction. In a display device that performs full color display with three color elements (e.g., RGB), pixels are arranged in the following manner, for example: a stripe pattern, or a delta pattern or Bayer arrangement in which dots of the three color elements are arranged.

Embodiment 10

In the invention disclosed in this specification, a transistor with a variety of structures can be used. That is, there is no limitation on the structure of transistors. For example, a display device including pixels with high aperture ratio can be manufactured by application of Embodiment 7. In this embodiment, structure examples of transistors will be described.

For example, a thin film transistor (TFT) including a non-single-crystal semiconductor film typified by amorphous silicon, polycrystalline silicon, microcrystalline (also referred to as microcrystal, nanocrystal, or semi-amorphous) silicon, or the like can be used. In the case of using the TFT, there are various advantages. For example, since the TFT can be formed at a temperature lower than that of the case of using single crystalline silicon, manufacturing costs can be reduced or a manufacturing apparatus can be made larger. Since the manufacturing apparatus can be made larger, the TFT can be formed using a large substrate. Therefore, a large number of display devices can be formed at the same time at low cost. In addition, a substrate having low heat resistance can be used because of low manufacturing temperature. Therefore, the transistor can be formed over a light-transmitting substrate. Further, transmission of light in a display element can be controlled by using the transistors formed over the light-transmitting substrate. Alternatively, part of a film included in the transistor can transmit light because the thickness of the transistor is small. Thus, the aperture ratio can be increased.

Note that when a catalyst (e.g., nickel) is used for forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and a signal processing circuit (e.g., a signal generation circuit, a gamma correction circuit, or a DA converter circuit) can be formed over the same substrate.

Note that when a catalyst (e.g., nickel) is used for forming microcrystalline silicon, crystallinity can be further improved and a transistor having excellent electric characteristics can be formed. At this time, crystallinity can be improved by just performing heat treatment without performing laser light irradiation. Thus, a gate driver circuit (e.g., a scan line driver circuit) and part of a source driver circuit (e.g., an analog switch) can be formed using the same substrate. Note that when laser irradiation for crystallization is not performed, unevenness in crystallinity of silicon can be suppressed. Accordingly, an image with improved image quality can be displayed. Note that polycrystalline silicon or microcrystalline silicon can be formed without use of a catalyst (e.g., nickel).

The crystallinity of silicon is preferably enhanced to polycrystallinity or microcrystallinity in the entire panel, but not limited thereto. The crystallinity of silicon may be improved only in part of the panel. Selective increase in crystallinity can be achieved by selective laser irradiation or the like. For example, laser light may be emitted only to a peripheral driver circuit region which is a region excluding pixel, a region such as a gate driver circuit and a source driver circuit, or part of a source driver circuit (e.g., an analog switch). As a result, the crystallinity of silicon only in a region in which a circuit needs to operate at high speed can be improved. Since a pixel region is not particularly needed to operate at high speed, even if crystallinity is not improved, the pixel circuit can operate without problems. Thus, a region whose crystallinity is improved is small, so that manufacturing steps can be decreased. As a result, the throughput can be increased and manufacturing costs can be reduced. Since the number of manufacturing apparatuses needed is small, manufacturing costs can be reduced.

For example, a transistor including a compound semiconductor or an oxide semiconductor, such as ZnO, a-InGaZnO, SiGe, GaAs, IZO, ITO, SnO, TiO, or AlZnSnO (AZTO), or a thin film transistor obtained by thinning such a compound semiconductor or oxide semiconductor can be used as a transistor. Since manufacturing temperature can be lowered, such a transistor can be formed at room temperature, for example. Thus, the transistor can be formed directly on a substrate having low heat resistance, such as a plastic substrate or a film substrate. Note that such a compound semiconductor or oxide semiconductor can be used for not only a channel portion of a transistor but also for other applications. For example, such a compound semiconductor or oxide semiconductor can be used for a wiring, a resistor, a pixel electrode, a light-transmitting electrode, or the like. Such an element can be formed in the process for manufacturing the transistor, so that costs can be reduced.

An example of a transistor is a transistor formed by an inkjet method or a printing method. Such a transistor can be formed at room temperature, can be formed at a low vacuum, or can be formed using a large substrate. Since the transistor can be formed without using a mask (reticle), a layout of the transistor can be easily changed. Alternatively, since the transistor can be formed without use of a resist, material cost is reduced and the number of steps can be reduced. Further, since a film can be formed where needed, a material is not wasted as compared to a manufacturing method by which etching is performed after the film is formed over the entire surface; thus, costs can be reduced.

An example of a transistor is a transistor including an organic semiconductor or a carbon nanotube. Such a transistor can be formed over a flexible substrate. A semiconductor device using such a substrate can resist a shock.

Transistors with a variety of different structures can be used as a transistor. For example, a MOS transistor, a junction transistor, a bipolar transistor, or the like can be used as a transistor. When a MOS transistor is used as the transistor, the size of the transistor can be reduced. Thus, the integration degree of transistors can be increased. By using a bipolar transistor as the transistor, large current can flow. Thus, a circuit can operate at high speed. Note that a MOS transistor and a bipolar transistor may be formed over one substrate. Consequently, reduction in power consumption, reduction in size, high speed operation, and the like can be realized.

For example, a transistor with a multi-gate structure having two or more gate electrodes can be used as a transistor. With the multi-gate structure, a structure where a plurality of transistors are connected in series is provided because channel regions are connected in series. Thus, with the multi-gate structure, the amount of off-state current can be reduced and the withstand voltage of the transistor can be increased (the reliability can be improved). Alternatively, with the multi-gate structure, drain-source current does not fluctuate much even when drain-source voltage fluctuates when the transistor operates in a saturation region, so that a flat slope of voltage-current characteristics can be obtained. When the flat slope of the voltage-current characteristics is utilized, an ideal current source circuit or an active load having an extremely high resistance value can be realized. Accordingly, a differential circuit, a current mirror circuit, or the like having excellent properties can be realized.

For example, a transistor with a structure where gate electrodes are formed above and below a channel can be used as a transistor. With the structure where the gate electrodes are formed above and below the channel, a circuit structure where a plurality of transistors are connected in parallel is provided. Thus, a channel region is increased, so that the amount of current can be increased. Alternatively, with the structure where gate electrodes are formed above and below the channel, a depletion layer can be easily formed, so that subthreshold swing value (S value) can be improved.

A transistor with a structure where a gate electrode is formed above a channel region, a structure where a gate electrode is formed below a channel region, a staggered structure, an inverted staggered structure, a structure where a channel region is divided into a plurality of regions, or a structure where channel regions are connected in parallel or in series can be used as a transistor, for example.

Note that for example, a transistor with a structure where a source electrode or a drain electrode overlaps with a channel region (or part of it) can be used as a transistor. The structure where the source electrode or the drain electrode may overlap with the channel region (or part of it) can prevent unstable operation due to electric charge accumulated in part of the channel region.

For example, a transistor including a high-resistance region can be used. When the high-resistance region is provided, the off-state current can be reduced or the withstand voltage of the transistor can be increased (the reliability can be improved). Alternatively, by providing the high-resistance region, drain-source current is not changed much even when drain-source voltage is changed when the transistor operates in the saturation region, so that a flat slope of voltage-current characteristics can be obtained.

A transistor can be formed using a variety of substrates. The type of a substrate is not limited to a certain type. Examples of the substrate are a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. As the glass substrate, a barium borosilicate glass substrate, an aluminoborosilicate glass substrate, or a soda-lime glass substrate can be used, for example. For the flexible substrate, a flexible synthetic resin such as plastics typified by polyethylene terephthalate (PET), polyethylene naphthalate (PEN), or polyethersulfone (PES), or acrylic can be used, for example. Examples of an attachment film are attachment films formed using polypropylene, polyester, vinyl, polyvinyl fluoride, polyvinyl chloride, or the like. For a base material film, polyester, polyamide, polyimide, an inorganic vapor deposition film, paper, or the like can be used, for example. In particular, by forming transistors with the use of a semiconductor substrate, a single crystal substrate, an SOI substrate, or the like, transistors that have fewer variations in characteristics, sizes, shapes, or the like, high current supply capability, and small sizes can be formed. By forming a circuit using such transistors, power consumption of the circuit can be reduced or the circuit can be highly integrated.

A transistor may be formed using one substrate, and then, the transistor may be transferred to another substrate so as to be provided over another substrate. Example of a substrate to which a transistor is transferred are a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), or a regenerated fiber (e.g., acetate, cupra, rayon, or regenerated polyester)), a leather substrate, and a rubber substrate in addition to the above-described substrates over which the transistor can be formed. By using such a substrate, transistors with excellent properties or transistors with low power consumption can be formed, a device with high durability or high heat resistance can be formed, or reduction in weight or thickness can be achieved.

A transistor is an element having at least three terminals of a gate, a drain, and a source. The transistor has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Therefore, a region functioning as the source and a region functioning as the drain are not called the source or the drain in some cases. In that case, for example, one of the source and the drain is referred to as a first terminal, a first electrode, or a first region and the other of the source and the drain is referred to as a second terminal, a second electrode, or a second region in some cases.

In addition, a transistor may be an element having at least three terminals of a base, an emitter, and a collector. In that case also, one of the emitter and the collector is referred to as a first terminal, a first electrode, or a first region, and the other of the emitter and the collector is referred to as a second terminal, a second electrode, or a second region in some cases. Note that in the case where a bipolar transistor is used as a transistor, a gate can be rephrased as a base.

A gate corresponds to the all or some of a gate electrode and a gate wiring (also called a gate line, a gate signal line, a scan line, a scan signal line, or the like). A gate electrode corresponds to part of a conductive film that overlaps with a semiconductor which forms a channel region with a gate insulating film therebetween. Note that part of a gate electrode can overlap with a high-resistance region or a source region (or a drain region) with a gate insulating film therebetween. A gate wiring corresponds to a wiring for connecting gate electrodes of transistors, a wiring for connecting gate electrodes in pixels, or a wiring for connecting a gate electrode to another wiring.

There is a portion (a region, a conductive film, a wiring, or the like) that functions as both a gate electrode and a gate wiring. Such a portion (a region, a conductive film, a wiring, or the like) may be referred to as either a gate electrode or a gate wiring. That is, there is a region where a gate electrode and a gate wiring cannot be clearly distinguished from each other. For example, in the case where a channel region overlaps with part of an extended gate wiring, the overlapping portion (region, conductive film, wiring, or the like) functions as both a gate wiring and a gate electrode. Accordingly, such a portion (a region, a conductive film, a wiring, or the like) may be referred to as either a gate electrode or a gate wiring.

A portion (a region, a conductive film, a wiring, or the like) that is formed using the same material as a gate electrode, forms the same island as the gate electrode, and is connected to the gate electrode may also be referred to as a gate electrode. Similarly, a portion (a region, a conductive film, a wiring, or the like) that is formed using the same material as a gate wiring, forms the same island as the gate wiring, and is connected to the gate wiring may also be referred to as a gate wiring. In a strict sense, such a portion (a region, a conductive film, a wiring, or the like) does not overlap with a channel region or does not have a function of connecting the gate electrode to another gate electrode in some cases. However, there is a portion (a region, a conductive film, a wiring, or the like) that is formed using the same material as a gate electrode or a gate wiring, forms the same island as the gate electrode or the gate wiring, and is connected to the gate electrode or the gate wiring because of specifications or the like in manufacturing. Thus, such a portion (a region, a conductive film, a wiring, or the like) may also be referred to as either a gate electrode or a gate wiring.

For example, in a multi-gate transistor, a gate electrode is often connected to another gate electrode by using a conductive film that is formed using the same material as the gate electrode. In such a case, a portion (a region, a conductive film, a wiring, or the like) for connecting the gate electrode to another gate electrode may be referred to as a gate wiring. The portion may be referred to as a gate electrode because a multi-gate transistor can be considered as one transistor. That is, a portion (a region, a conductive film, a wiring, or the like) that is formed using the same material as a gate electrode or a gate wiring, forms the same island as the gate electrode or the gate wiring, and is connected to the gate electrode or the gate wiring may be referred to as either a gate electrode or a gate wiring. As another example, part of a conductive film that connects the gate electrode and the gate wiring and is formed using a material which is different from that of the gate electrode or the gate wiring may be referred to as either a gate electrode or a gate wiring.

A gate terminal corresponds to part of a portion (a region, a conductive film, a wiring, or the like) of a gate electrode or a portion (a region, a conductive film, a wiring, or the like) that is electrically connected to the gate electrode.

When a wiring is called a gate wiring, a gate line, a gate signal line, a scan line, a scan signal line, or the like, a gate of a transistor is not connected to the wiring in some cases. In this case, the gate wiring, the gate line, the gate signal line, the scan line, or the scan signal line corresponds to a wiring formed in the same layer as the gate of the transistor, a wiring formed of the same material of the gate of the transistor, or a wiring formed at the same time as the gate of the transistor in some cases. Examples are a wiring for a storage capacitor, a power supply line, and a reference potential supply line.

A source corresponds to all or some of a source region, a source electrode, and a source wiring (also called a source line, a source signal line, a data line, a data signal line, or the like). A source region corresponds to a semiconductor region including a large amount of p-type impurities (e.g., boron or gallium) or n-type impurities (e.g., phosphorus or arsenic). Therefore, in the case where a low-concentration impurity region with a low concentration of p-type impurities or n-type impurities is a high-resistance region whose resistance is high, it is often considered not to be included in the source region. A source electrode corresponds to a conductive layer that is formed of a material different from that of a source region and electrically connected to the source region. Note that a source electrode and a source region are collectively called a source electrode in some cases. A source wiring is a wiring for connecting source electrodes of transistors, a wiring for connecting source electrodes in pixels, or a wiring for connecting a source electrode to another wiring.

There is a portion (a region, a conductive film, a wiring, or the like) functioning as both a source electrode and a source wiring. Such a portion (a region, a conductive film, a wiring, or the like) may be referred to as either a source electrode or a source wiring. That is, there is a region where a source electrode and a source wiring cannot be clearly distinguished from each other. For example, in the case where a source region overlaps with part of an extended source wiring, the overlapping portion (region, conductive film, wiring, or the like) functions as both a source wiring and a source electrode. Therefore, such a portion (a region, a conductive film, a wiring, or the like) may be referred to as either a source electrode or a source wiring.

Note that a portion (a region, a conductive film, a wiring, or the like) that is formed using the same material as a source electrode, forms the same island as the source electrode, and is connected to the source electrode; a portion (a region, a conductive film, a wiring, or the like) that connects a source electrode and another source electrode; and a portion (a region, a conductive film, a wiring, or the like) that overlaps with a source region may also be referred to as a source electrode. Similarly, a region that is formed of the same material as a source wiring, forms the same island as the source wiring, and is connected to the source wiring may also be called a source wiring. In a strict sense, such a portion (a region, a conductive film, a wiring, or the like) does not have a function of connecting the source electrode to another source electrode in some cases. However, there is a portion (a region, a conductive film, a wiring, or the like) that is formed using the same material as a source electrode or a source wiring, forms the same island as the source electrode or the source wiring, and is connected to the source electrode or the source wiring because of specifications or the like in manufacturing. Thus, such a portion (a region, a conductive film, a wiring, or the like) may also be referred to as either a source electrode or a source wiring.

For example, part of a conductive film that connects a source electrode and a source wiring and is formed of a material different from that of the source electrode or the source wiring may be called either a source electrode or a source wiring.

Note that a source terminal corresponds to part of a source region, a source electrode, or a portion (a region, a conductive film, a wiring, or the like) that is electrically connected to the source electrode.

When a wiring is called a source wiring, a source line, a source signal line, a data line, a data signal line, or the like, a source (a drain) of a transistor is not connected to the wiring in some cases. In this case, the source wiring, the source line, the source signal line, the data line, or the data signal line corresponds to a wiring formed in the same layer as the source (the drain) of the transistor, a wiring formed using the same material of the source (the drain) of the transistor, or a wiring formed at the same time as the source (the drain) of the transistor in some cases. Examples are a wiring for a storage capacitor, a power supply line, and a reference potential supply line.

Since the description of the drain is similar to that of the source, the description of the source can be applied.

This application is based on Japanese Patent Application serial no. 2009-205136 filed with Japan Patent Office on Sep. 4, 2009, the entire contents of which are hereby incorporated by reference.

What is claimed is:

1. A display device comprising a first region and a second region,
    wherein the first region comprises:
        a gate electrode;
        a first insulating layer over the gate electrode;
        an oxide semiconductor layer over the first insulating layer, the oxide semiconductor layer including a channel formation region;
        a source electrode and a drain electrode over the oxide semiconductor layer;
        a second insulating layer over the source electrode and the drain electrode;
        a first conductive layer over the second insulating layer, the first conductive layer comprising indium;
        a third insulating layer over the first conductive layer; and
        a pixel electrode over the third insulating layer, the pixel electrode electrically connected to one of the source electrode and the drain electrode,
    wherein the second region comprises:
        a second conductive layer including a same material with the gate electrode;
        the first insulating layer over the second conductive layer; and
        a third conductive layer over the first insulating layer, the third conductive layer including a same material with the source electrode and the drain electrode,
    wherein the pixel electrode comprises indium,
    wherein the oxide semiconductor layer comprises indium, gallium, zinc, and oxygen,
    wherein the source electrode and the drain electrode each comprise a first layer and a second layer,
    wherein the first layer comprises indium and oxygen,
    wherein the second layer comprises copper,
    wherein the first conductive layer overlaps with the channel formation region,
    wherein the pixel electrode overlaps with the first conductive layer, and
    wherein the second conductive layer and the third conductive layer are electrically connected to each other.

2. The display device according to claim 1, wherein the oxide semiconductor layer includes one of microcrystal and polycrystal.

3. The display device according to claim 1,
    wherein the pixel electrode is in contact with the one of the source electrode and the drain electrode in a region, and
    wherein the region does not overlap with the oxide semiconductor layer.

4. The display device according to claim 1, wherein the pixel electrode overlaps with the oxide semiconductor layer.

5. The display device according to claim 1, wherein the pixel electrode overlaps with the second conductive layer.

6. The display device according to claim 1, further comprising:
- a fourth conductive layer over the second insulating layer, the fourth conductive layer comprising a same material with the first conductive layer,
- wherein the fourth conductive layer overlaps with the second conductive layer.

7. The display device according to claim 1, further comprising:
- a fourth conductive layer over the second insulating layer, the fourth conductive layer comprising a same material with the first conductive layer,
- wherein the fourth conductive layer overlaps with the third conductive layer.

8. A display device comprising a first region and a second region,
- wherein the first region comprises:
  - a gate electrode;
  - a first insulating layer over the gate electrode;
  - an oxide semiconductor layer over the first insulating layer, the oxide semiconductor layer including a channel formation region;
  - a source electrode and a drain electrode over the oxide semiconductor layer;
  - a second insulating layer over the source electrode and the drain electrode;
  - a first conductive layer over the second insulating layer, the first conductive layer comprising indium;
  - a third insulating layer over the first conductive layer; and
  - a pixel electrode over the third insulating layer, the pixel electrode electrically connected to one of the source electrode and the drain electrode,
- wherein the second region comprises:
  - a second conductive layer including a same material with the gate electrode;
  - the first insulating layer over the second conductive layer; and
  - a third conductive layer over the first insulating layer, the third conductive layer including a same material with the source electrode and the drain electrode,
- wherein the pixel electrode comprises indium,
- wherein the oxide semiconductor layer comprises indium, gallium, zinc, and oxygen,
- wherein the source electrode and the drain electrode each comprises a first layer and a second layer,
- wherein the first layer comprises indium and oxygen,
- wherein the second layer comprises copper,
- wherein the first conductive layer overlaps with the channel formation region,
- wherein the pixel electrode overlaps with the first conductive layer,
- wherein the pixel electrode is electrically connected to the one of the source electrode and the drain electrode through a contact hole in the second insulating layer,
- wherein the contact hole overlaps with the oxide semiconductor layer, and
- wherein the second conductive layer and the third conductive layer are electrically connected to each other.

9. The display device according to claim 8, wherein the oxide semiconductor layer includes one of microcrystal and polycrystal.

10. The display device according to claim 8, wherein the pixel electrode overlaps with the oxide semiconductor layer.

11. The display device according to claim 8, wherein the pixel electrode overlaps with the second conductive layer.

12. The display device according to claim 8, further comprising:
- a fourth conductive layer over the second insulating layer, the fourth conductive layer comprising a same material with the first conductive layer,
- wherein the fourth conductive layer overlaps with the second conductive layer.

13. The display device according to claim 8, further comprising:
- a fourth conductive layer over the second insulating layer, the fourth conductive layer comprising a same material with the first conductive layer,
- wherein the fourth conductive layer overlaps with the third conductive layer.

* * * * *